US009833978B2

(12) United States Patent
Sreetharan et al.

(10) Patent No.: US 9,833,978 B2
(45) Date of Patent: *Dec. 5, 2017

(54) MONOLITHIC FABRICATION OF THREE-DIMENSIONAL STRUCTURES

(71) Applicant: President and Fellows of Harvard College, Cambridge, MA (US)

(72) Inventors: Pratheev Sabaratnam Sreetharan, Cambridge, MA (US); John Peter Whitney, Pittsburgh, PA (US); Robert J. Wood, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 692 days.

This patent is subject to a terminal disclaimer.

(21) Appl. No.: 14/332,365

(22) Filed: Jul. 15, 2014

(65) Prior Publication Data
US 2015/0044418 A1 Feb. 12, 2015

Related U.S. Application Data

(63) Continuation of application No. 13/961,510, filed on Aug. 7, 2013, now Pat. No. 8,834,666, which is a
(Continued)

(51) Int. Cl.
*B32B 37/00* (2006.01)
*H01L 41/25* (2013.01)
(Continued)

(52) U.S. Cl.
CPC ....... *B32B 37/0076* (2013.01); *A63H 27/001* (2013.01); *B25J 7/00* (2013.01);
(Continued)

(58) Field of Classification Search
None
See application file for complete search history.

(56) References Cited

U.S. PATENT DOCUMENTS 2,069,668 A * 2/1937 Flint .................. B65D 9/34
217/2
2,544,783 A 3/1951 Freedman et al.
(Continued)

FOREIGN PATENT DOCUMENTS

EP 0 920 893 A2 9/1999
WO WO 02095154 A1 * 11/2002 ........... A47B 96/202
(Continued)

OTHER PUBLICATIONS

European Patent Office, Communication pursuant to Rule 164(1) EPC, European Patent Application No. 12744586.4 (related European application) (dated Mar. 17, 2017).
(Continued)

*Primary Examiner* — Jeffry H Aftergut
*Assistant Examiner* — Jaeyun Lee
(74) *Attorney, Agent, or Firm* — Modern Times Legal; Robert J. Sayre

(57) ABSTRACT

A multi-layer, super-planar structure can be formed from distinctly patterned layers. The layers in the structure can include at least one rigid layer and at least one flexible layer; the rigid layer includes a plurality of rigid segments, and the flexible layer can extend between the rigid segments to serve as a joint. The layers are then stacked and bonded at selected locations to form a laminate structure with inter-layer bonds, and the laminate structure is flexed at the flexible layer between rigid segments to produce an expanded three-dimensional structure, wherein the layers are joined at the selected bonding locations and separated at other locations.

13 Claims, 41 Drawing Sheets

Related U.S. Application Data continuation-in-part of application No. 13/519,901, filed as application No. PCT/US2011/024479 on Feb. 11, 2011, now Pat. No. 9,038,942, said application No. 13/961,510 is a continuation of application No. PCT/US2012/024682, filed on Feb. 10, 2012.

(60) Provisional application No. 61/561,144, filed on Nov. 17, 2011, provisional application No. 61/467,765, filed on Mar. 25, 2011.

(51) Int. Cl.

| | | |
|---|---|---|
| B25J 7/00 | (2006.01) | |
| B32B 3/26 | (2006.01) | |
| B32B 37/14 | (2006.01) | |
| B32B 37/18 | (2006.01) | |
| B32B 38/00 | (2006.01) | |
| B32B 38/14 | (2006.01) | |
| B81B 3/00 | (2006.01) | |
| B81B 7/02 | (2006.01) | |
| A63H 27/00 | (2006.01) | |
| B64C 33/02 | (2006.01) | |
| G02B 26/08 | (2006.01) | |

(52) U.S. Cl.
CPC ............ *B32B 3/266* (2013.01); *B32B 37/144* (2013.01); *B32B 37/18* (2013.01); *B32B 38/0004* (2013.01); *B32B 38/0012* (2013.01); *B32B 38/14* (2013.01); *B64C 33/02* (2013.01); *B81B 3/0097* (2013.01); *B81B 7/02* (2013.01); *H01L 41/25* (2013.01); *B32B 2038/0028* (2013.01); *B32B 2307/20* (2013.01); *B32B 2457/00* (2013.01); *G02B 26/0833* (2013.01); *Y10T 156/1064* (2015.01); *Y10T 428/24331* (2015.01)

(56) References Cited

U.S. PATENT DOCUMENTS

| | | |
|---|---|---|
| 4,194,439 A | 3/1980 | Zimmermann |
| 4,379,797 A | 4/1983 | Cole |
| 6,410,360 B1 | 6/2002 | Steenberge |
| 6,734,597 B1 | 5/2004 | Howell et al. |
| 7,451,596 B2 | 11/2008 | Culpepper et al. |
| 8,834,666 B2 * | 9/2014 | Sreetharan ............. H01L 41/25 156/290 |
| 2004/0144448 A1 * | 7/2004 | Muller .................... B27H 1/00 144/344 |
| 2005/0062653 A1 | 3/2005 | Cetiner et al. |
| 2010/0052082 A1 | 3/2010 | Lee et al. |

FOREIGN PATENT DOCUMENTS

| | | |
|---|---|---|
| WO | 2011142864 A2 | 11/2011 |
| WO | 2011142864 A3 | 5/2012 |

OTHER PUBLICATIONS

R. J. Wood, et al., "Optimal energy density piezoelectric bending actuators", 119 Sensors and Actuators A 476-488 (2004).
R. J. Wood, et al., "Microrobot Design Using Fiber Reinforced Composites", 130(5) J. Mech. Design (2008).
R. J. Wood, "The First Takeoff of a Biologically Inspired At-Scale Robotic Insect", 24(2) IEEE Transactions on Robotics 341-347 (Apr. 2008).
J. P. Whitney, et al., "Pop-up book MEMS", 21 J. Micromech. Microeng. 115021 (Oct. 14, 2011).
P. S. Sreetharan, et al., "Monolithic fabrication of millimeter-scale machines", 22 J. Micromech. Microeng. 055027 (Apr. 23, 2012).
M. Bachman, et al., "MEMS in Laminates", IEEE Electronic Components and Technology Conf. 262-267 (May/Jun. 2011).
United States Patent and Trademark Office, International Search Report and Written Opinion for PCT/US2012/024682 (dated May 29, 2012).
All Flex Flexible Circuits, LLC, "Rigid Flex Circuits" <http://www.allflexinc.com/DesignGuide/rigid-flex.shtml> (accessed on Jan. 13, 2014) (2011).
Bruce K. Gale, et al., "Fabrication and packaging: Low-cost MEMS technologies," in Comprehensive Microsystems, 1st Ed. (2008).
Mark Gallant, "Guide to Rigid-Flex Design", Printed Circuit Design and Fab (<http://www.pcdandf.com/cms/magazine/95/2948>,visited Dec. 13, 2013) (2006).

* cited by examiner

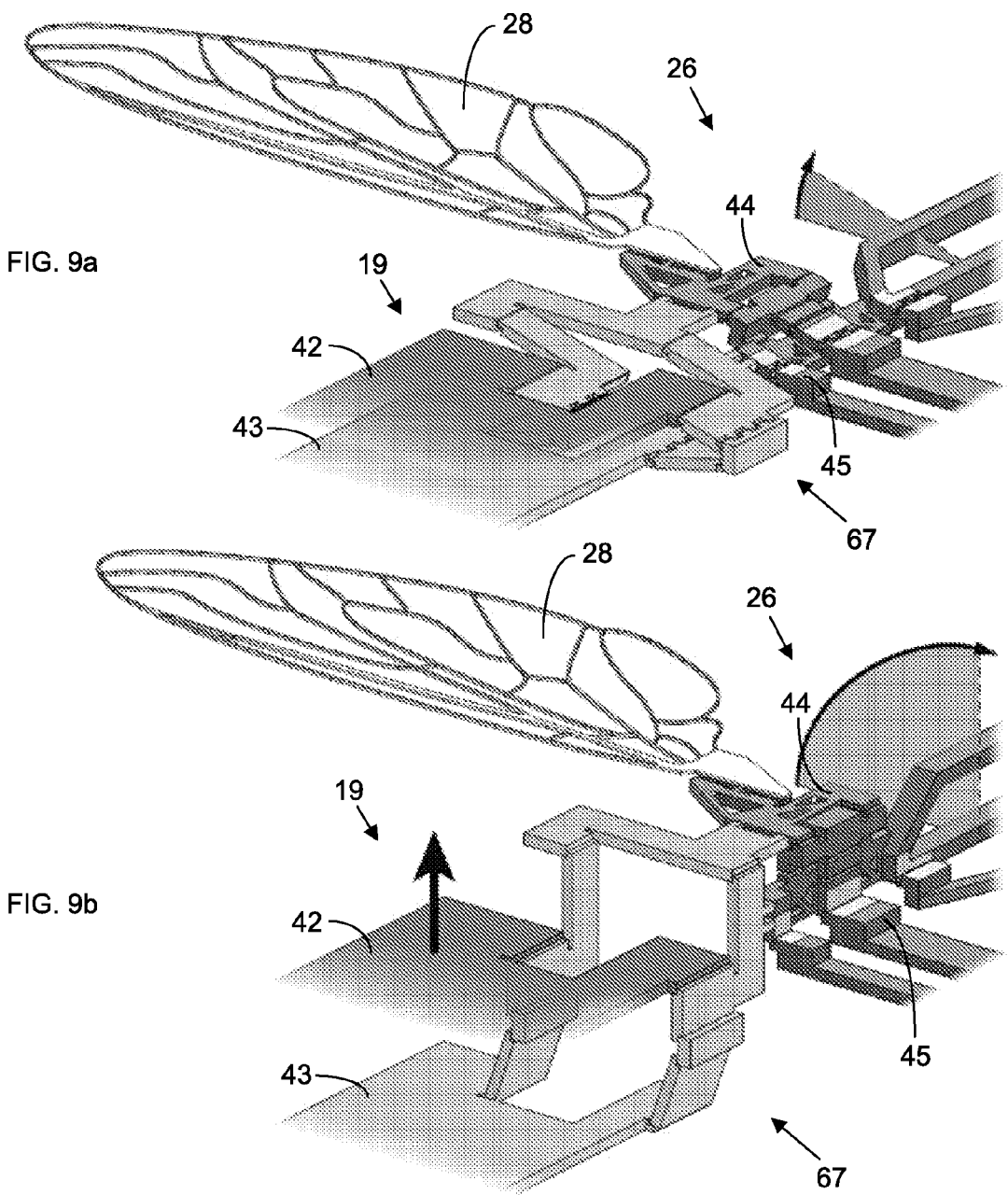

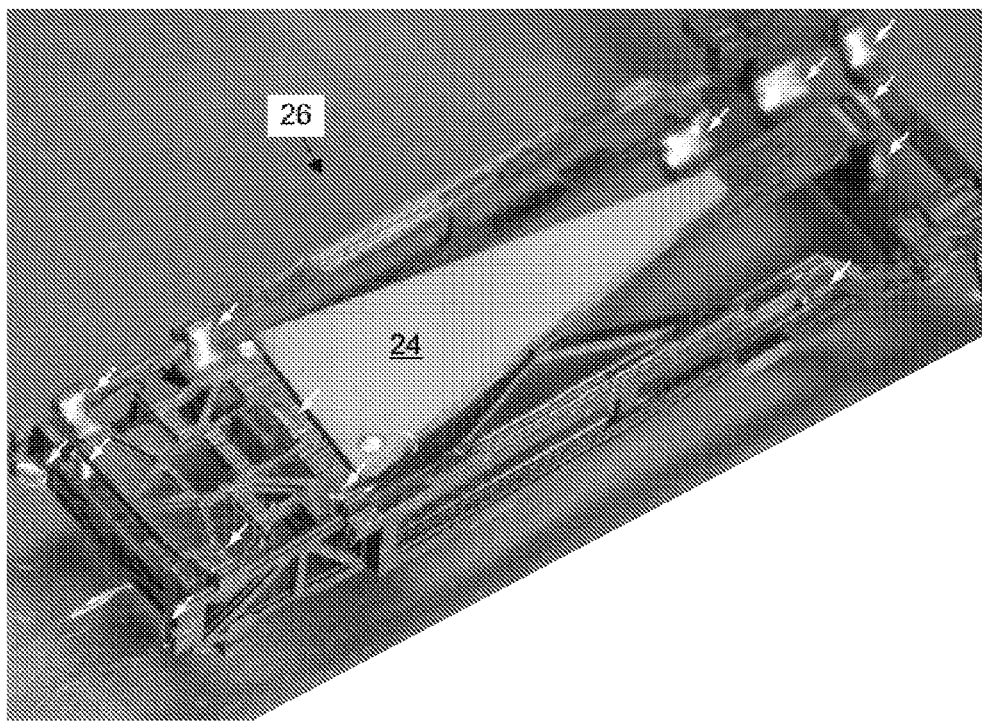
FIG. 10A
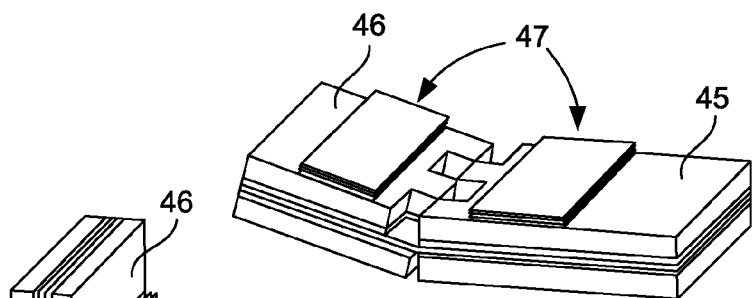
FIG. 10B
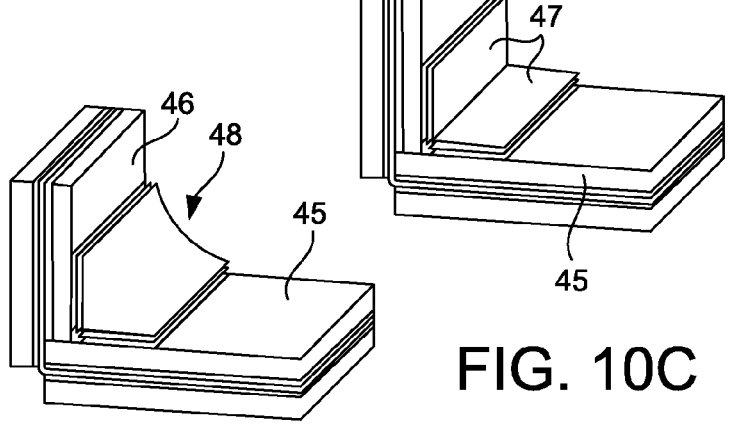
FIG. 10C
FIG. 10D

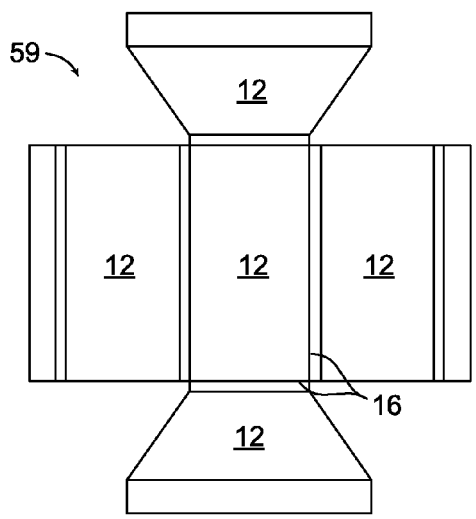
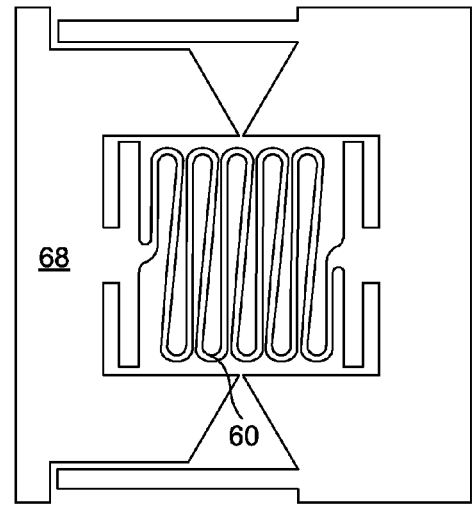
FIG. 33    FIG. 36
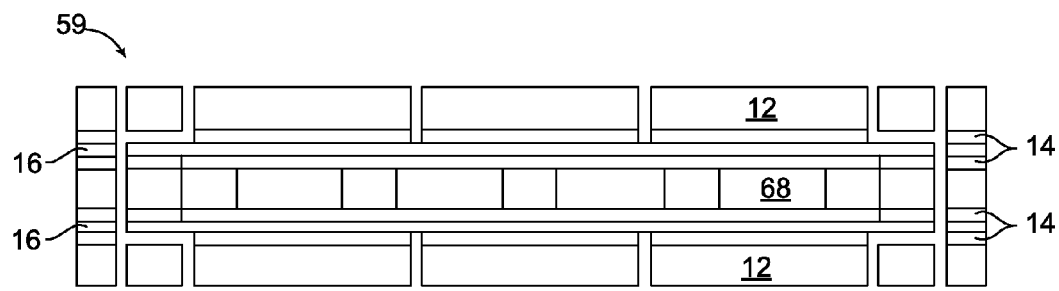
FIG. 34
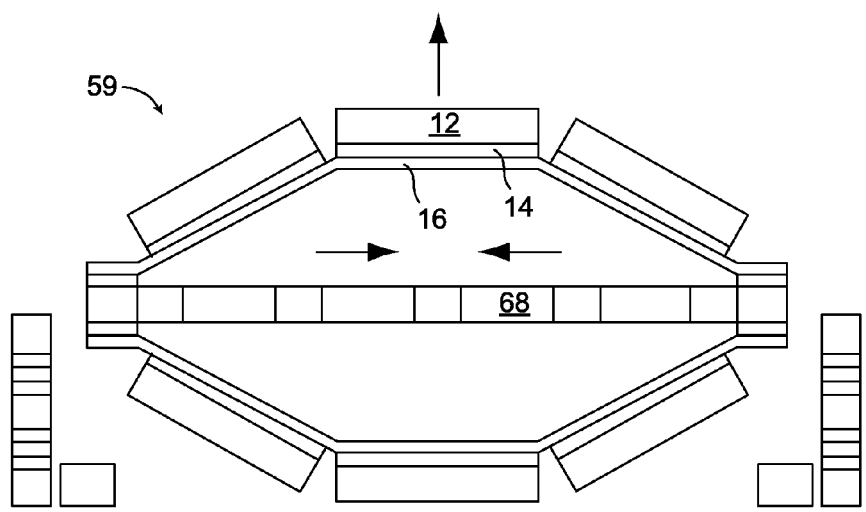
FIG. 35

MONOLITHIC FABRICATION OF THREE-DIMENSIONAL STRUCTURES

RELATED APPLICATIONS

This application is a continuation of U.S. application Ser. No. 13/961,510, filed on 7 Aug. 2013, which is a continuation of PCT/US2012/024682, filed on 10 Feb. 2012, and a continuation-in-part of U.S. application Ser. No. 13/519, 901, which is the National Stage of International Application No. PCT/US2011/024479, filed on 11 Feb. 2011, the entire contents of each of which are incorporated herein by reference. This application also claims the benefit of U.S. Provisional Application No. 61/303,629 61/467,765, filed on 25 Mar. 2011, and of U.S. Provisional Application No. 61/561, 144, filed on 17 Nov. 2011, the entire contents of each of which are incorporated herein by reference.

GOVERNMENT SUPPORT

The invention was supported, in whole or in part, by grants under Contract Number W911NF-08-2-0004 from the Army Research Laboratory, Contract Numbers CMMI-07466 38 and CCF-0926148 from the National Science Foundation, and Contract Number FA9550-09-1-0156-DOD35CAP from the Air Force Office of Scientific Research. The U.S. Government has certain rights in the invention.

BACKGROUND

Micron-scale device fabrication is dominated by micro-electro-mechanical structures (MEMS) technology, which typically involves a single planar substrate and serial processes. Meanwhile, centimeter-scale manufacturing is covered by a multitude of conventional machining processes. Manufacturing at the millimeter scale, however, is plagued with fabrication and assembly issues that greatly impact the cost and performance of micro-robots and other functional mechanical devices at this scale.

SUMMARY

Three-dimensional structures and methods for their fabrication are described herein. Various embodiments of the structures and methods may include some or all of the elements, features and steps described below.

A three-dimensional structure can be formed by stacking a plurality of patterned layers and bonding the plurality of patterned layers (i.e., layers having a patterned shape/features formed, e.g., by machining) at selected locations to form a laminate structure with inter-layer bonds. The laminate structure can then be expanded into an expanded three-dimensional configuration by selectively distorting at least one of the layers to produce gaps between layers while maintaining at least some of the inter-layer bonds.

The layers in the structure can include at least one rigid layer and at least one flexible layer, wherein the rigid layer includes a plurality of rigid segments, and the flexible layer can extend between the rigid segments to serve as a joint. The flexible layers are substantially less rigid than the rigid layers and can have a rigidity that is at least an order of magnitude (i.e., greater than 10× or greater than 100×) greater than the rigidity; likewise, the flexible layer can have at least 10 times or at least 100 times the flexibility of the rigid layers. The layers can then be stacked and bonded at selected locations to form a laminate structure with inter-layer bonds, and the laminate structure can be distorted or flexed to produce an expanded three-dimensional structure, wherein the layers are joined at the selected bonding locations and separated at other locations.

The methods and structures described herein can be used, for example, across and beyond the entire millimeter-scale manufacturing process (e.g., for apparatus with dimensions from 100 μm to 10 mm), and they enable mass production of precisely fabricated mechanisms, machines, and autonomous robots at this scale. Some of the manufacturing techniques described herein may be the same as or similar or analogous to those used for multi-layer printed circuit board (PCB) manufacturing, while some of the assembly techniques may be the same as or similar or analogous to assembly techniques used for MEMS, paper origami, and pop-up books; and additional techniques used in those contexts may be adapted for use with this invention.

When compared to traditional MEMS, the methods described herein are extremely versatile with respect to the materials that can be used. In addition, traditional MEMS are largely limited to bulk addition of materials, whereas the methods described herein can be used not only to add precisely patterned layers, but also full sub-components, such as integrated circuits, flex circuits, actuators, batteries, etc. The thermal requirements of the multi-layer, super-planar structures described herein can also be much lower, and the fabrication-equipment costs can be much lower, as well. Further still, processing steps in these methods on the various layers can be performed simultaneously in parallel, while much of MEMS processing takes place sequentially in series.

These methods can also be used to fabricate a wide variety of devices and structures within a device, including I-beams; large actuated mirrors for use as optical switches; steerable antennae; high-speed, high-power physical switching; and robotic flying devices.

BRIEF DESCRIPTION OF THE DRAWINGS

FIGS. 9a and 9b offer a schematic perspective view showing the functioning of the assembly scaffold to realize desired assembly trajectories.

FIG. 10a includes a perspective view of a monolithic robotic bee (mobee) with solder-locked joints highlighted via arrows; and FIGS. 10b-d provide schematic illustrations of the folding and locking steps with brass plates and solder.

FIGS. 31-36 illustrate a spring-loaded monolithic structure for assembly into an eight-sided enclosure.

In the accompanying drawings, like reference characters refer to the same or similar parts throughout the different views. The drawings are not necessarily to scale, emphasis instead being placed upon illustrating particular principles, discussed below.

DETAILED DESCRIPTION

Figure 1:
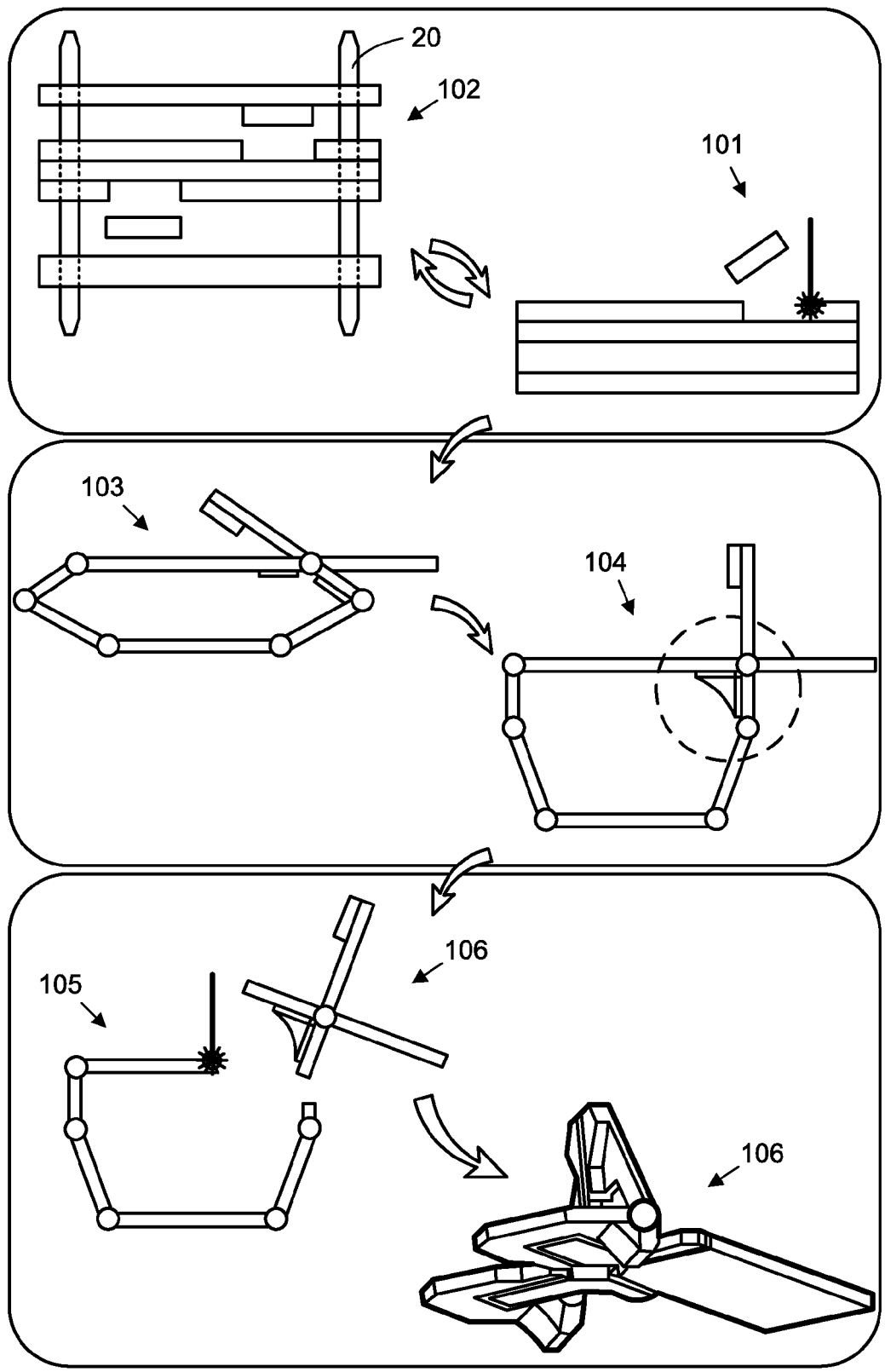
FIG. 1 shows the fabrication, assembly and release steps in a schematic representation of the fabrication of a PC-MEMS machine.

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially, though not perfectly pure, as practical and imperfect realities may apply; e.g., the potential presence of at least trace impurities (e.g., at less than 1 or 2% by weight or volume) can be understood as being within the scope of the description; likewise, if a particular shape is referenced, the shape is intended to include imperfect variations from ideal shapes, e.g., due to machining tolerances.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments.

Spatially relative terms, such as "above," "upper," "beneath," "below," "lower," and the like, may be used herein for ease of description to describe the relationship of one element to another element, as illustrated in the figures. It will be understood that the spatially relative terms are intended to encompass different orientations of the apparatus in use or operation in addition to the orientation described and/or depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

Further still, in this disclosure, when an element is referred to as being "on," "connected to" or "coupled to" another element, it may be directly on, connected or coupled to the other element or intervening elements may be present unless otherwise specified.

The terminology used herein is for the purpose of describing particular embodiments and is not intended to be limiting of exemplary embodiments. As used herein, the singular forms, "a," "an" and "the," are intended to include the plural forms as well, unless the context clearly indicates otherwise. Additionally, the terms, "includes," "including," "comprises" and "comprising," specify the presence of the stated elements or steps but do not preclude the presence or addition of one or more other elements or steps.

The apparatus of this disclosure, as described herein, can be utilized in a variety of applications, including the PARITy drivetrain described in PCT Application No. US2011/24479, entitled, "Passive Torque Balancing in a High-Frequency Oscillating System."

The apparatus is a multi-layer, super-planar structure. By "planar," we mean a layer or plane that can be distorted, flexed or folded (these terms may be used interchangeably herein). An embodiment of this structure can be achieved, for example, by forming a five-layer composite with the following sequence of layers: rigid layer, adhesive layer, flexible layer, adhesive layer, rigid layer. Alternatively, a thinner composite can be formed from a stacking of just a rigid layer, an adhesive layer, and a flexible layer, though this structure is not symmetric. The rigid layers are machined to have gaps that correspond to fold lines, while the flexible layer is continuous, thereby providing a joint where the flexible layer extends across the gaps machined from the rigid layers.

Characterization of the structure as being "super-planar" means taking multiple planar layers and selectively connecting them. An analogy here can be drawn to circuit boards, where electrical vias connect circuits on different layers. Here, in contrast, the structure is made with "mechanical vias." By stacking multiple planar layers, the range of achievable devices is greatly expanded. The super-planar structure also enables features and components to be packed into the structure that would not fit if the device could only be made out of one planar sheet. Advantageously, super-planar structures with mechanisms that operate normal to the plane can now be made with these techniques. In practice, forming Sarrus linkages between planar layers is an advantageous strategy for designing an assembly mechanism/scaffold. Other mechanisms can attach to the Sarrus links to effect the intended component rotations.

The multi-layer super-planar structure can be fabricated via the following sequence of steps, which are further described, below: (1) machine each planar layer, (2) machine or pattern adhesives, (3) stack and laminate the layers under conditions to effect bonding, (4) post-lamination machining of the multi-layer structure, (5) post-lamination treatment of the multi-layer structure, (6) freeing an assembly degree of freedom in each structure, (7) locking connections between structural members, (8) freeing any non-assembly degrees of freedom, and (9) separating finished parts from a scrap frame.

A schematic representation of the PC-MEMS process is provided in FIG. 1, illustrating how the basic operations of micromachining 101, lamination and pick-and-place 102, folding 103, locking 104, and additional micromachining 105 can be arranged to manufacture PC-MEMS machines 106.

Figure 2:
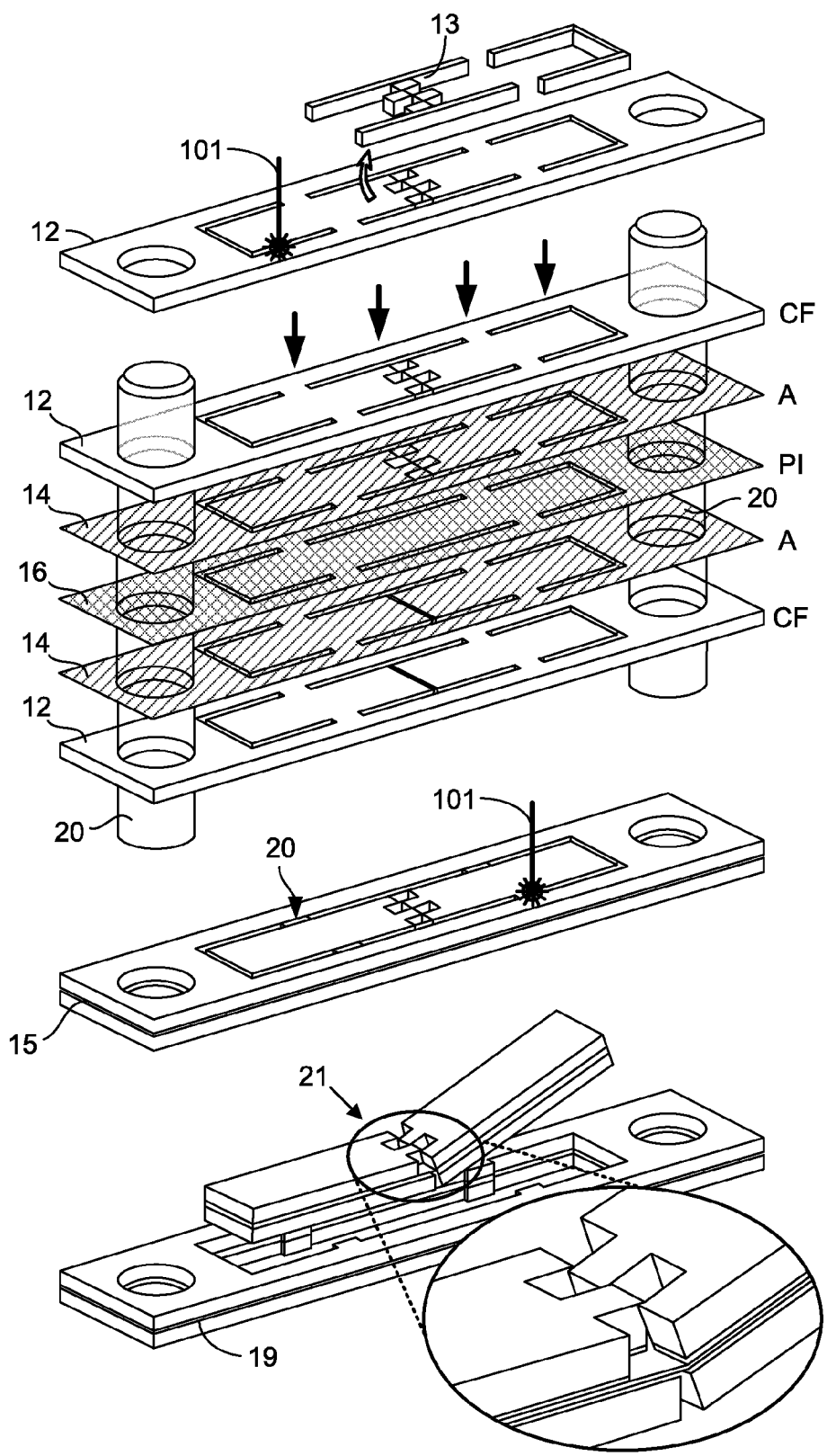
FIG. 2 illustrates formation of folding joints.

These assembly techniques can include the formation of folding joints 21, as illustrated in FIG. 2, wherein (a) features are first micro-machined 101 in individual material layers, and the resulting chips 13 are removed; (b) during lamination, dowel pins 20 align material layers while heat and pressure are applied; here, two rigid carbon-fiber layers 12 bonded to a flexible polyimide-film layer 16 with adhesive 14 form a five-layer laminate 15 referred to as a "linkage sub-laminate"; (c) micro-machining cuts mechanical bridges 17 that constrain individual elements, allowing the creation of articulated structures; and (d) a completed folding joint 21 is formed and removed from the surrounding scaffold 19. The castellated pattern allows this flexure joint 21 to approximate an ideal revolute joint. All assembly folds in a more-complex assembly can be incorporated into a single "pop-up" degree of freedom, which can be locked in place by a soldering process after pop up and then released by micro-machining.

A) Mobee

Figure 12:
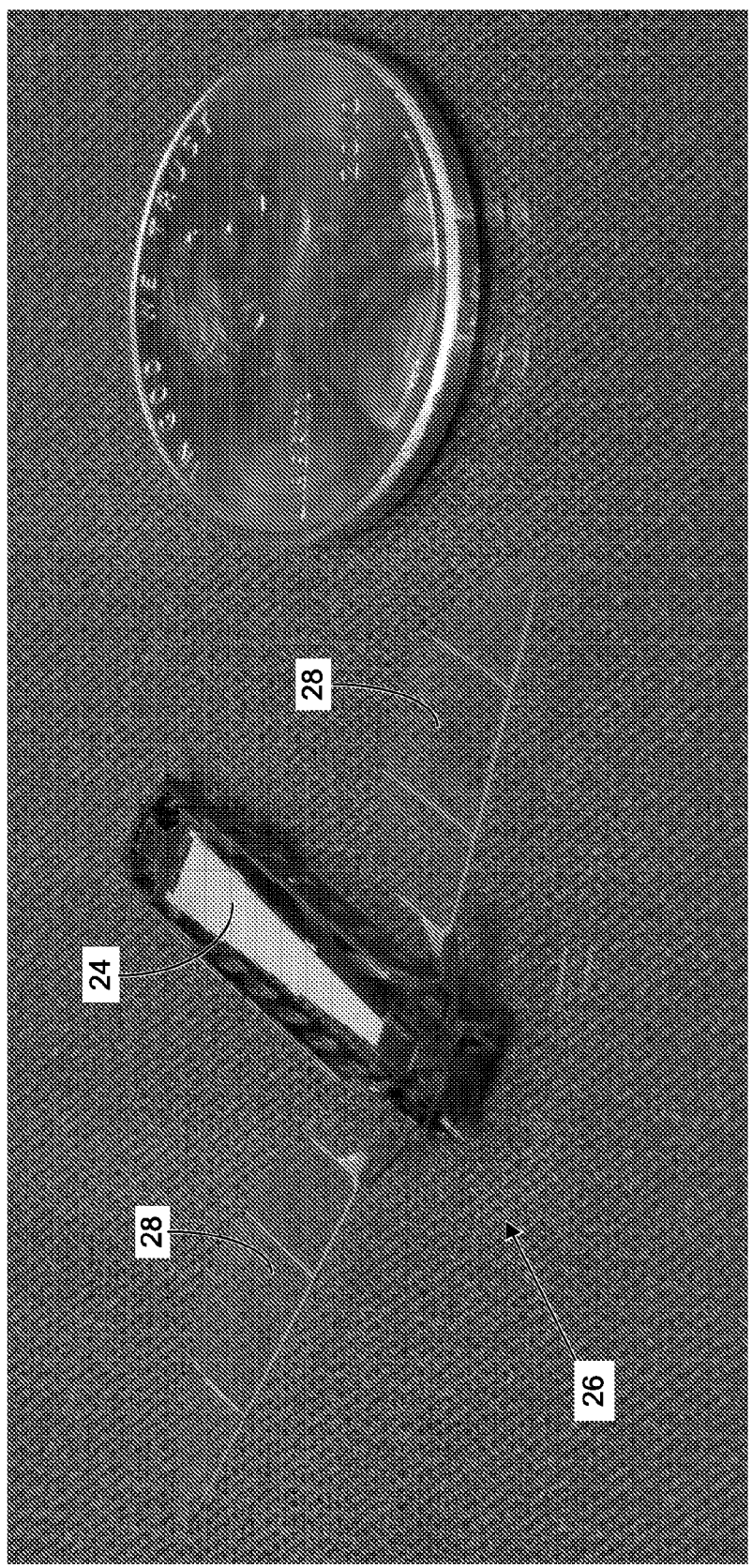
FIG. 12 is a perspective photographic view of the released mobee after pop-up assembly.
Figure 13:
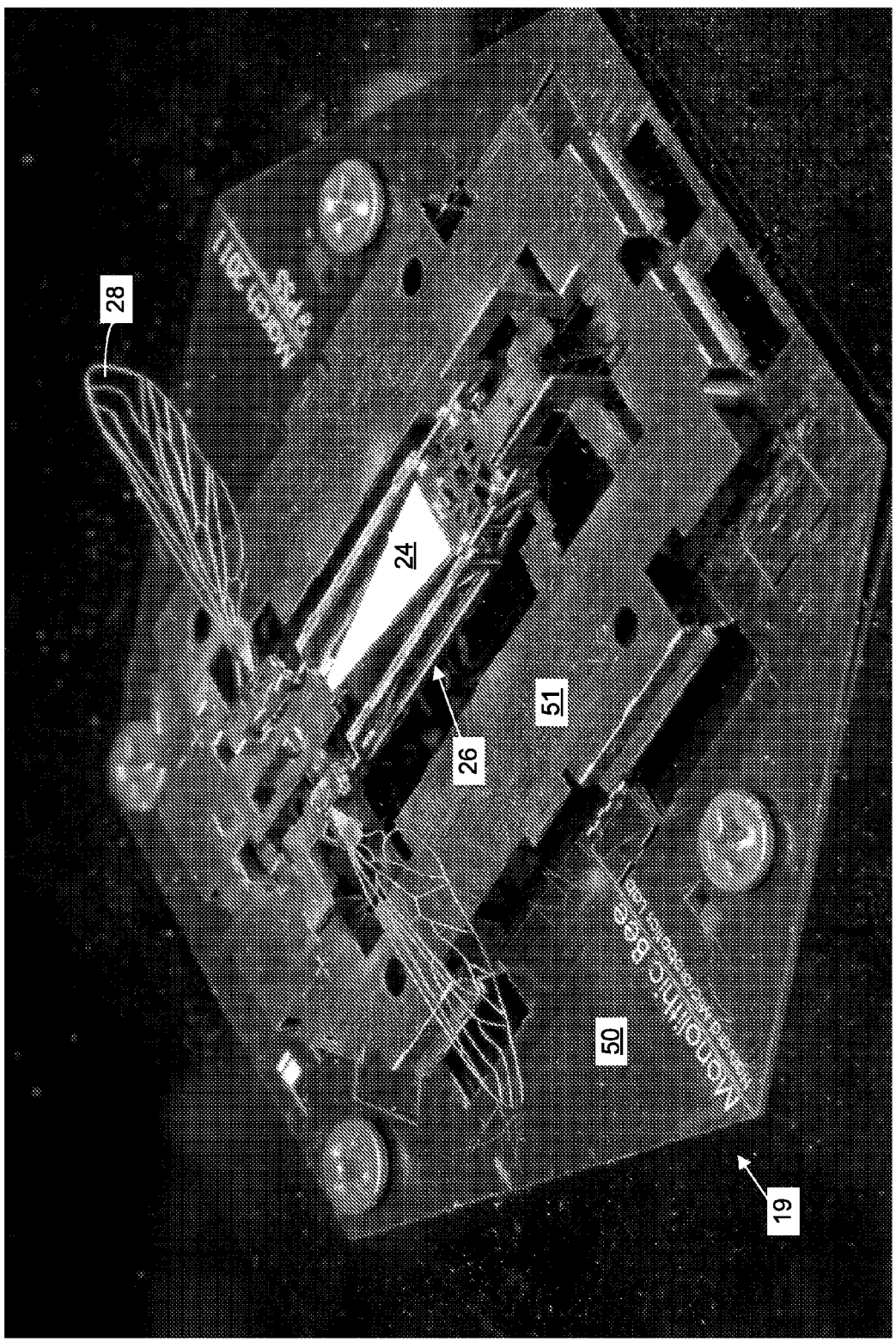
FIG. 13 is a back-angle perspective photographic view of a mobee in a surrounding frame assembled from a multilayer laminate via a method of this disclosure.
Figure 14:
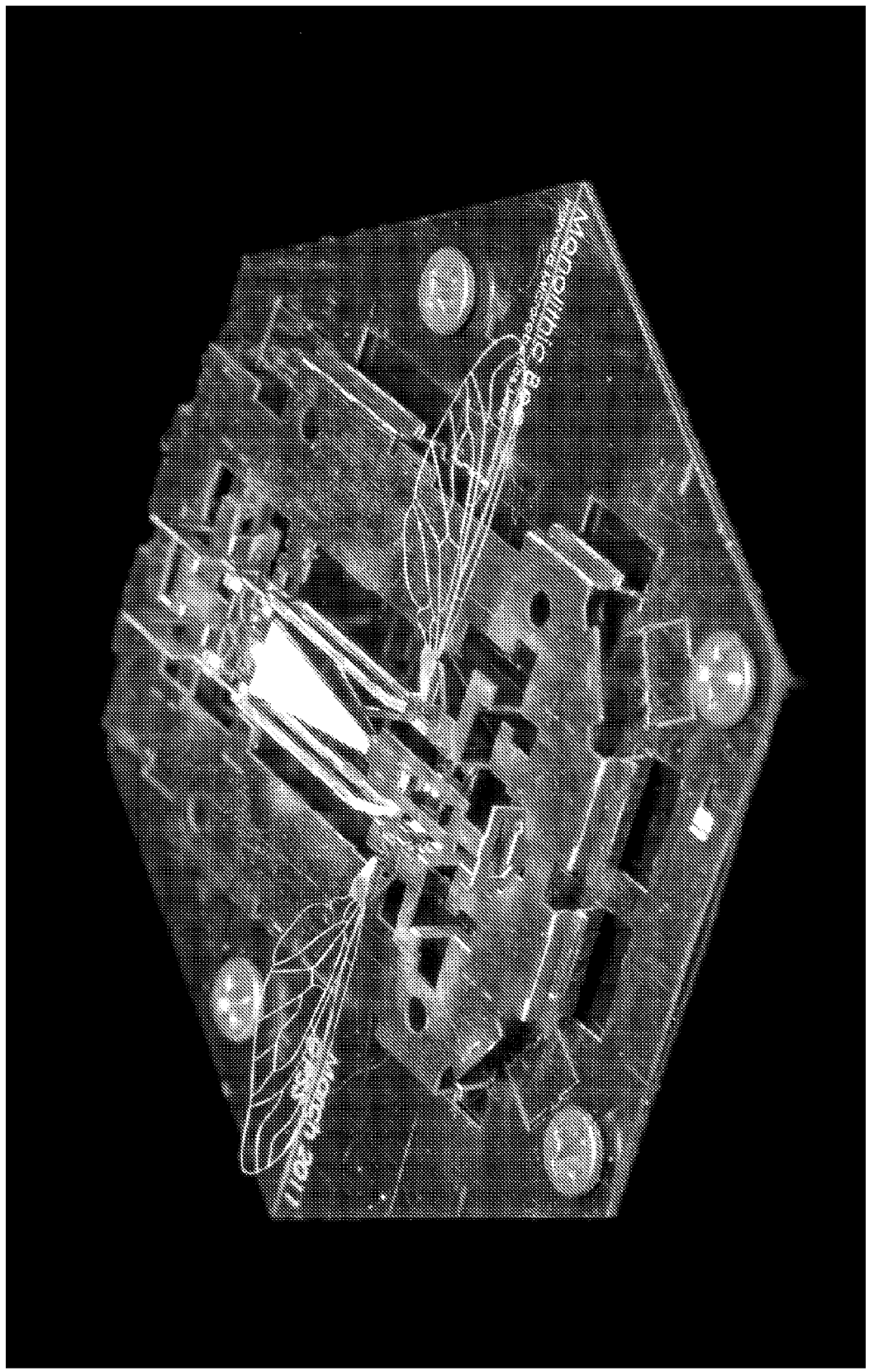
FIG. 14 is a front-angle perspective photographic view of the mobee of FIG. 13.
Figure 15:
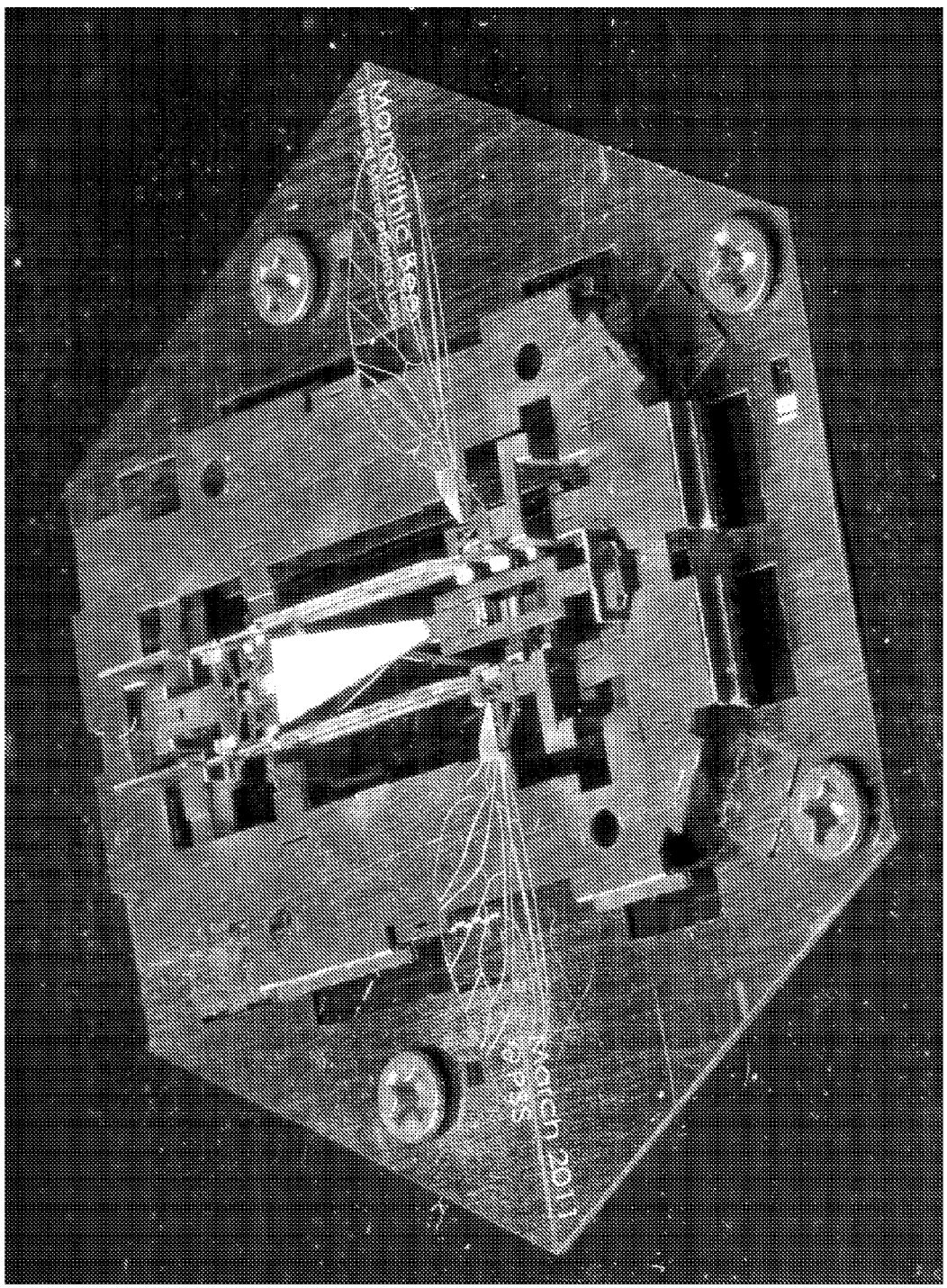
FIG. 15 is an elevated front perspective photographic view of the mobee of FIG. 13.
Figure 16:
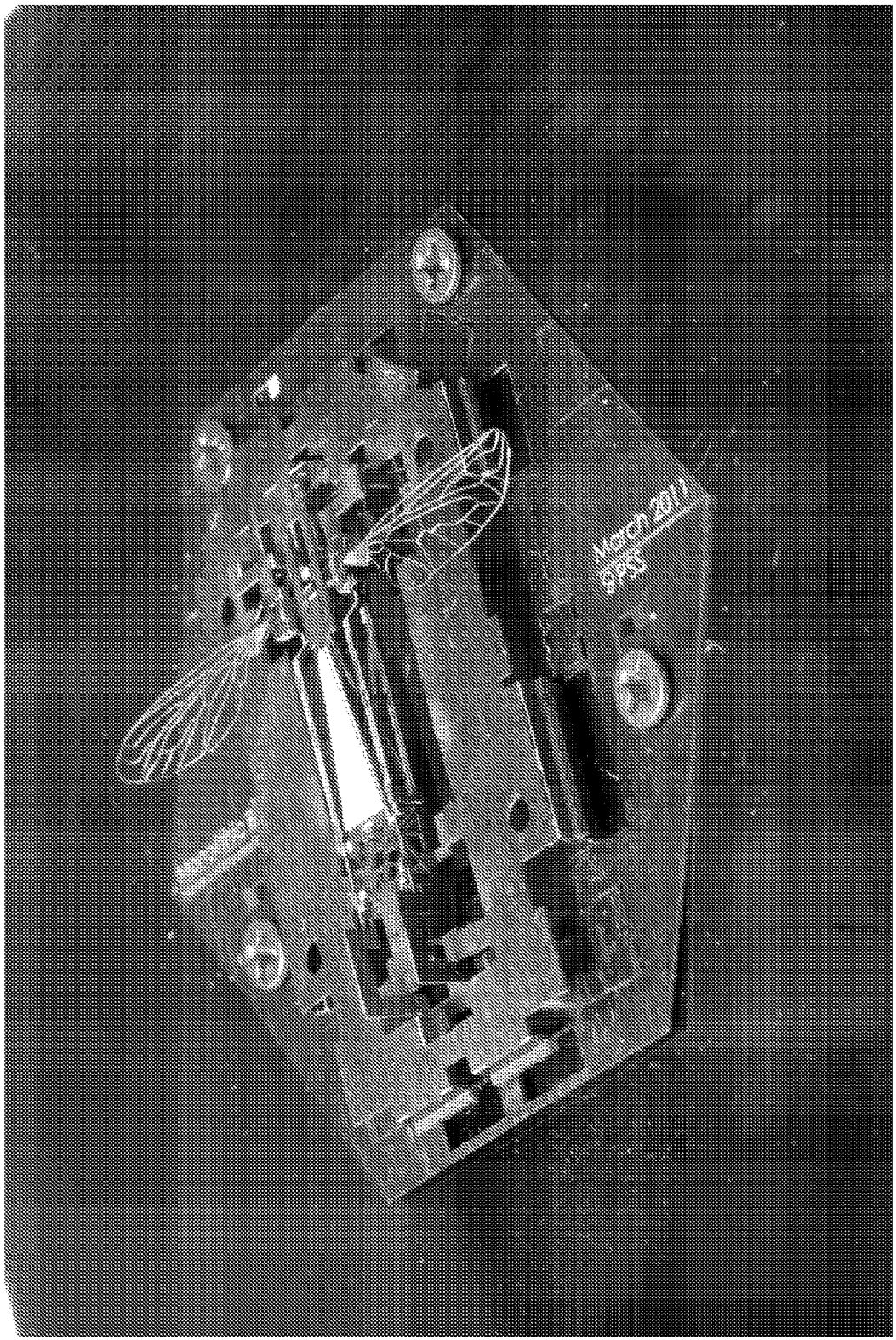
FIG. 16 is a right-side perspective photographic view of the mobee of FIG. 13.
Figure 17:
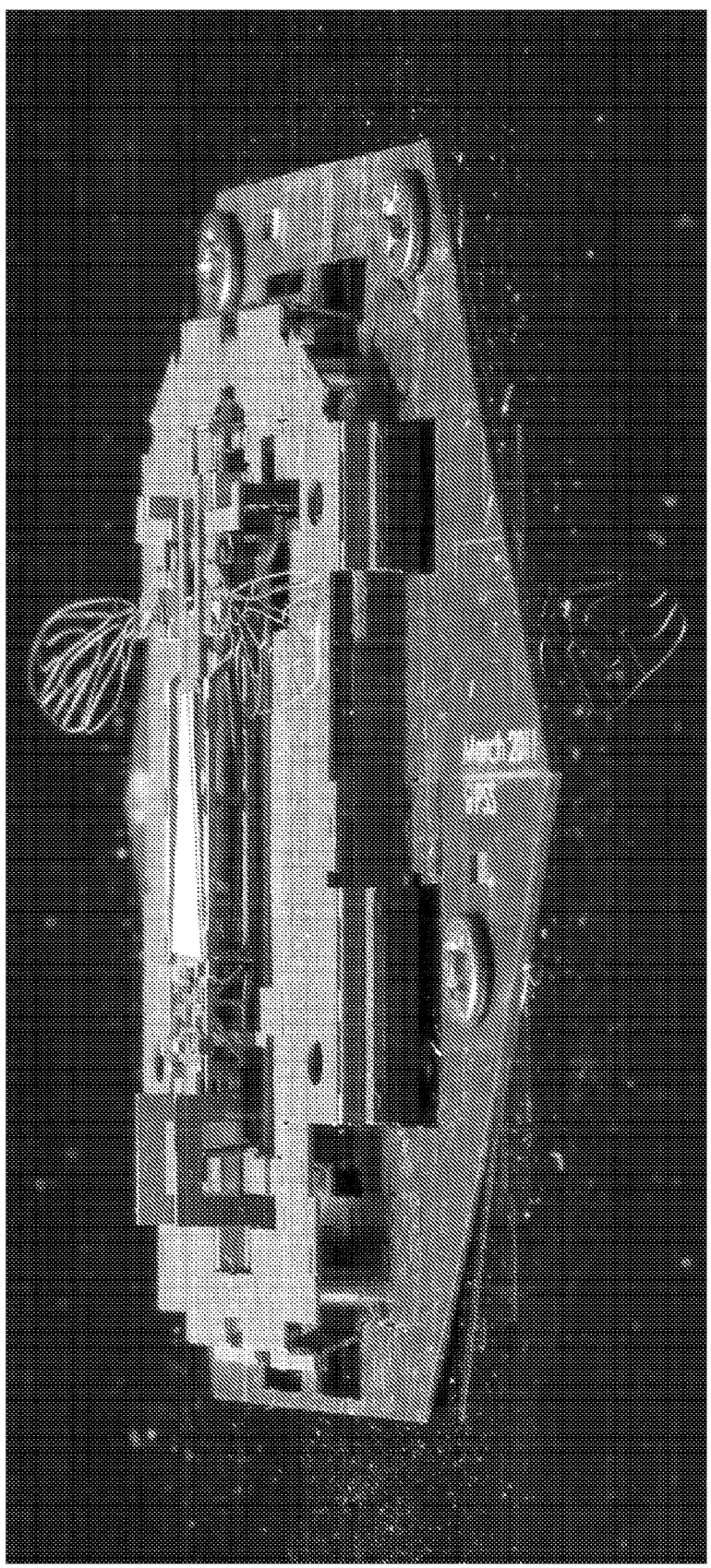
FIG. 17 is a side-zoom perspective photographic view of the mobee of FIG. 13.

In one embodiment, this fabrication method can produce a monolithic bee (mobee) structure 26, shown, e.g., in FIG. 12, including a rigid airframe 27, a piezoelectric actuator 24, a single-degree-of-freedom power transmission, and two wings 28. The mobee 26 can include eight sub-components (e.g., an actuator 24, an airframe 27, a slider-crank, a transmission, two wing hinges, and two wings 28) all co-fabricated in a single multi-layer laminate, integrating a diverse palette of layers of materials including carbon-fiber-reinforced polymer, polyimide film, piezoelectric lead zirconate titanate (PZT) for the actuator 24, brass for pads 47 for locking the joints, and titanium for the wing spars 52. In one embodiment, the mobee 26 has a 39-mm wingspan, an 18-mm length, an out-of-plane height of 2.4 mm, and a mass of 90 mg; and the wings 28 can reciprocate at a large angle (e.g., exceeding 120°). Furthermore, the parallel processes of "pop-up" folding and dip-solder locking replace the manual folding, assembling, and glueing used in previous processes. Elimination of all skilled manual steps enables panelized mass production of the mobee 26. The processes described herein can likewise be used to form a wide variety of other structures, in addition to the mobee 26.

1) Machining of Layers

Figure 3A:
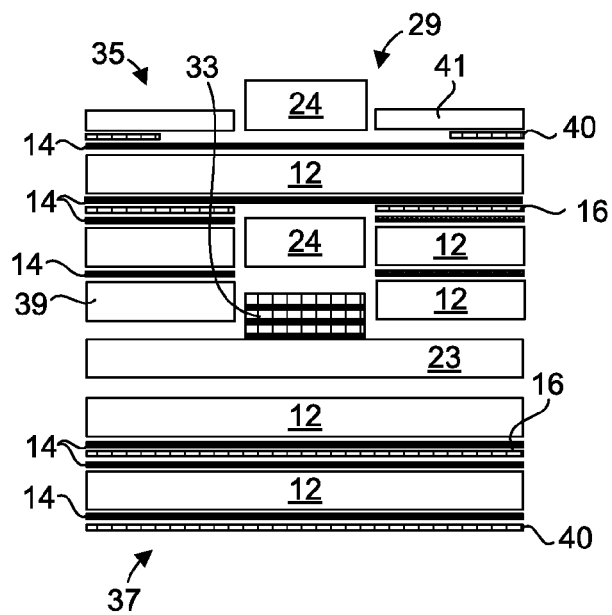
FIGS. 3a-c shows sequential lamination steps in mobee fabrication using a midplate to support the lead zirconate titanate (PZT) plates.
Figure 3B:
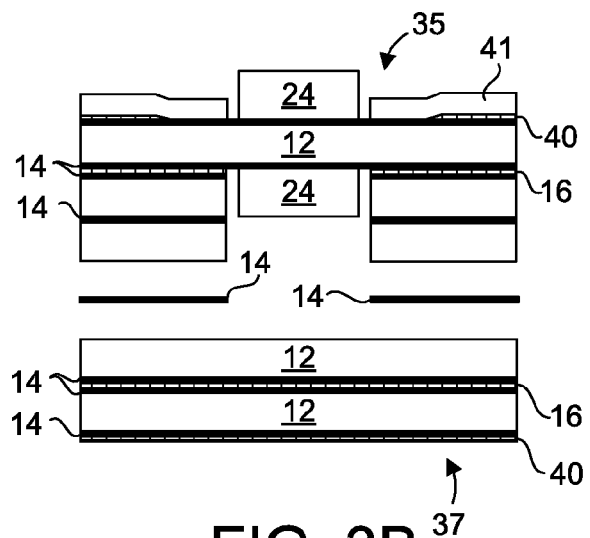
Figure 3C:
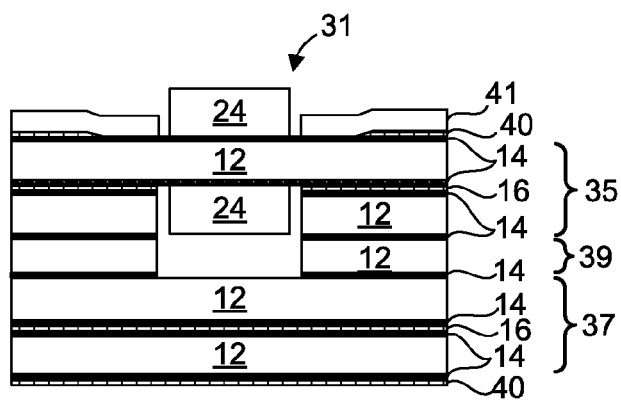

In one embodiment, the multi-layer structure is formed from a multitude of thin (1.5-μm to about 150-μm thick) layers of various materials, as shown in FIGS. 3a-c. As shown in FIG. 3a, layers of carbon fiber 12, adhesive 14, and polyimide 16 are stacked with a spacer layer 39 separating respective linkages 35 and 37, above and below. A mid-plate 23 with a raised section 33 for supporting the piezoelectric actuator 24 is also inserted between the spacer layer 39 and the lower linkage 37.

Figure 6:
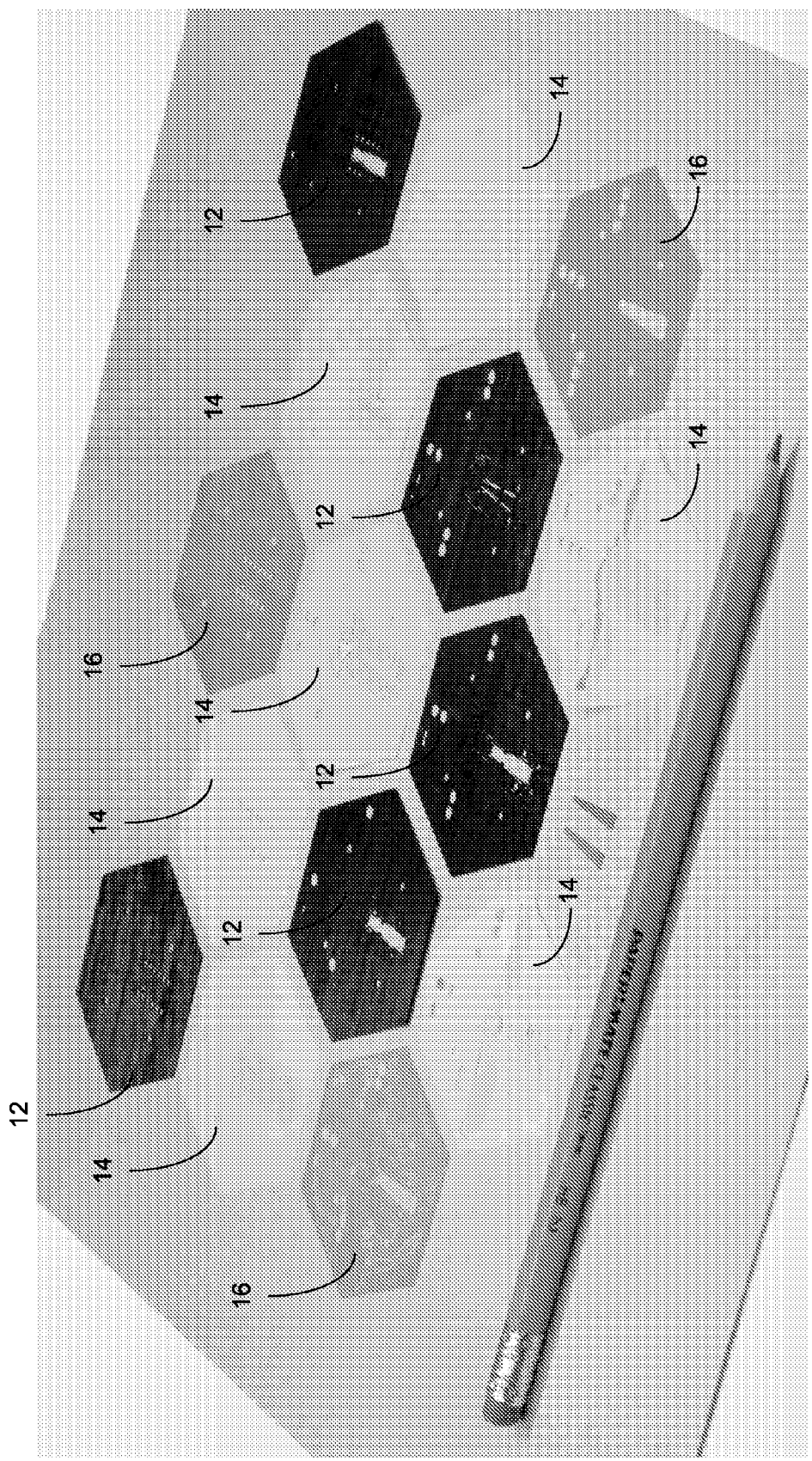
FIG. 6 is a perspective photographic view of all 15 layers from FIG. 5, as fabricated; two PZT plates for actuation are visible near the bottom of the image.
Figure 7:
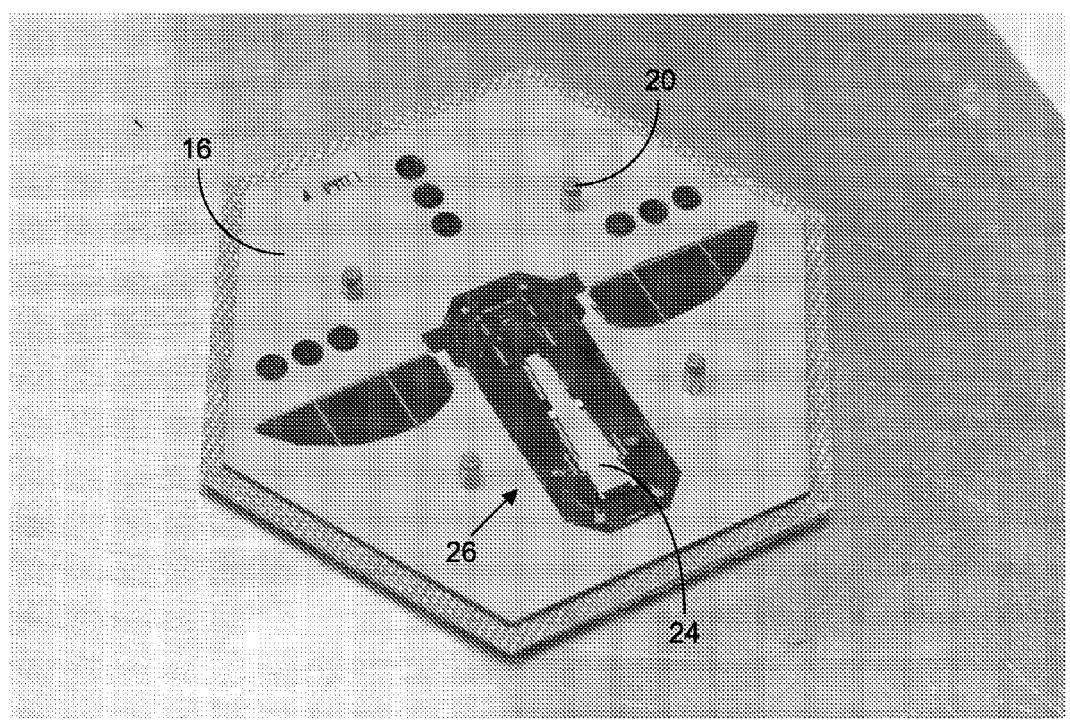
FIG. 7 is a perspective photographic view of the layup of FIG. 5 ready for press curing; one piezoelectric plate is visible after being picked and placed; the second actuator plate is in an internal cavity in the layup.
Figure 8:
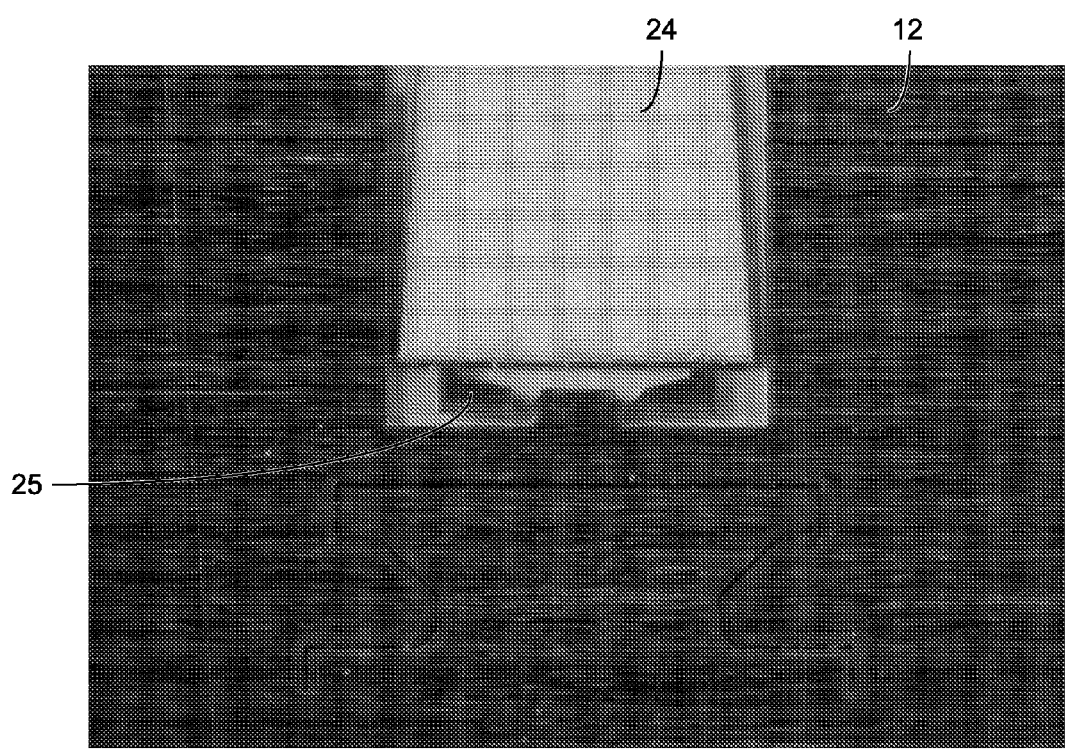
FIG. 8 is a close-up photographic view of the spring clip holding the actuator in place.

These layers are laser micro-machined (e.g., by a diode-pumped solid-state pulsed laser) with desired features, usually cutting all the way through the layer to create individual planar structures, as shown, e.g., in FIGS. 6-8. Each layer is micro-machined so as to leave a unified (contiguous) part with robust connections to surrounding alignment holes. The micro-machining can produce complex in-plane features with dimensions as small as 10 μm. In particular embodiments, many copies of the mobee device 26 are formed on a laminate panel, and the machining process removes sufficient material to form each part and part feature, while leaving thin tabs to connect each device to the surrounding laminate; in this regard, the arrangement of devices in a laminate panel can be similar to that of a batch of circuit boards attached to a surrounding laminate structure by thin, easily breakable tabs.

In this case, the tabs (bridges) 17 (shown in FIG. 2) connecting the devices to the surrounding laminate will be removed after lamination or assembly. Layers of metal, composite, polymer, etc., are machined or formed by virtually any method; and virtually any material may be used. Example machining methods include laser cutting from sheet material, photo-chemical etching, punching, electro-forming, electric discharge machining, etc.—basically any method that has appropriate resolution and compatibility with the desired material. Machined layers may then be subjected to additional processes, such as cleaning/etching to remove machining debris, plating (e.g., plating fluxed copper on a layer to facilitate adhesion of solder thereto), preparation for bonding, annealing, etc. The unified nature of each layer makes handling and post-processing easy. Advantageously, each layer can be a different material and can be machined and treated differently from each of the other layers.

Each layer can also advantageously be formed of a material that is sufficiently rigid, strong and tough to allow holes 22 for alignment pins 20 and other features to be machined into the layer, to facilitate easy handling, and to not distort when placed into the layup and when restrained by alignment pins 30. In other embodiments, layers that do not have the structural stability to support alignment features can nevertheless be used by attaching such layers, in bulk form, to a rigid frame that meets these objectives without introducing enough additional thickness to disturb the other layers or parts in the laminate.

In particular examples, a very thin polymer film (e.g., 2-5 microns thick) is included among the layers. Due to its thinness and insulating qualities, the thin polymer film is prone to wrinkling and electrostatic handling issues. To address this tendency, the thin polymer film can be lightly stretched, in bulk form, to a flat and controlled state and then bonded to a thin frame that is made, for example, of thin metal or fiberglass composite. Next, the thin polymer layer can be machined with the fine part features (e.g., tiny holes in the polymer at precise locations), and the alignment hole features can be machined into the frame material.

In additional embodiments, the device can be designed to mitigate thin-layer handling issues. For example, a part within the device can be designed such that all machining pertinent to a fragile layer is performed post-lamination; and, thus, this layer will not require precision alignment when put into the laminate, though the material is advantageously capable of being placed into the laminate sufficiently flat and extending over a sufficient area to cover the desired parts of the device.

In exemplary embodiments, bulk polymer films (formed, e.g., of polyester, polyimide, etc.); metal sheets and foils [formed, e.g., of stainless steel, spring steel, titanium, copper, invar (FeNi36), nickel-titanium alloy (nitinol), aluminum, etc.]; copper-clad laminates; carbon fiber and glass fiber composites; thermoplastic or thermoset adhesive films; ceramic sheets; etc.; can be laser machined to make the layers that are laminated to form the multi-layer structure. The laser machining can be performed, e.g., with a 355-nm laser (from DPSS Lasers Inc. of Santa Clara, Calif.) with a spot size of about 7 microns on materials with typical thicknesses of 1-150-μm, although thicker layers can be machined with such a laser, well. Accordingly, this type of laser allows for very high resolution and an ability to machine almost any type of material.

2) Machining or Patterning Adhesives

Adhesion between layers is achieved by patterning adhesive onto one or both sides of a non-adhesive layer or by using free-standing adhesive layers ("bondplies") 14. In the latter case, an intrinsically adhesive layer 14, e.g., in the form of a sheet of thermoplastic or thermoset film adhesive, or an adhesive laminate, such as a structural material layer with adhesive pre-bonded to one or both sides. The adhesive layer 14 is machined like the other layers. Specific examples of sheets that can be used as the adhesive layer 14 include sheet adhesives used in making flex circuits (e.g., DuPont FR1500 adhesive sheet) or polyimide film 16 coated with FEP thermoplastic adhesive 14 on one or both sides. Free-standing sheet adhesives can be acrylic-based for thermosets; alternatively, the adhesive can be thermoplastic, wherein the thermoplastic film can be formed of polyester, fluorinated ethylene propylene (or other fluoropolymer), polyamide, polyetheretherketone, liquid crystal polymer, thermoplastic polyimide, etc. Any of these adhesives can also be applied on one or both sides to a non-adhesive carrier. In additional embodiments, a layer may serve both as a structural layer 12 and as a thermoset adhesive 14—for example, liquid crystal polymer or thermoplastic polyimide. Furthermore, for special types of structural layers, a variety of wafer bonding techniques that do not require an adhesive may be employed, such as fusion bonding.

In another technique for achieving adhesion between layers, adhesive 14 is applied and patterned directly on a non-adhesive layer 12. This technique can be used where, for example, the type of adhesive desired may not be amenable to free-standing form. Examples of such an adhesive 14 include solders, which are inherently inclined to form a very thin layer, or adhesives that are applied in liquid form (by spraying, stenciling, dipping, spin coating, etc.) and then b-stage cured and patterned. B-staged epoxy films are commonly available, but they usually cannot support themselves unless they are quite thick or reinforced with scrim.

The resulting bond can be a "tack bond," wherein the adhesive 14 is lightly cross-linked to an adjacent layer before laser micromachining with sufficient tack to hold it in place for subsequent machining and with sufficient strength to allow removal of the adhesive backing layer. The tack bonding allows for creation of an "island" of adhesive 14 in a press layup that is not part of a contiguous piece, which offers a significant increase in capability. Another reason for tacking the adhesive 14 to an adjacent structural layer is to allow for unsupported "islands" of adhesive 14 to be attached to another layer without having to establish a physical link from that desired adhesive patch to the surrounding "frame" of material containing the alignment features. In one embodiment, a photoimagable liquid adhesive, such as benzocyclobutene, can be applied in a thin layer, soft baked, and then patterned using lithography, leaving a selective pattern of adhesive. Other photoimagable adhesives used in wafer bonding can also be used.

The adhesive 14 is patterned while initially tacked to its carrier film, aligned to the structural layer 12 using pins 20, and then tacked to at least one adjoining layer in the layup 29 with heat and pressure (e.g., at 200° C. and 340 kPa for one hour). Alternatively, the adhesive layer can be patterned by micro-machining it as a free sheet. Tack bonding can involve application of heat and pressure at a lower intensity and for less time than is required for a complete bond of the adhesive. In yet another embodiment, the adhesive film 14 can be tack bonded in bulk, and then machined using, for example, laser skiving/etching. Advantageously, use of this variation can be limited to contexts where the machining process does not damage the host layer. Both of these variations were tried using DuPont FR1500 adhesive sheet and laser skiving.

3) Stacking and Laminating the Layers

Figure 4:
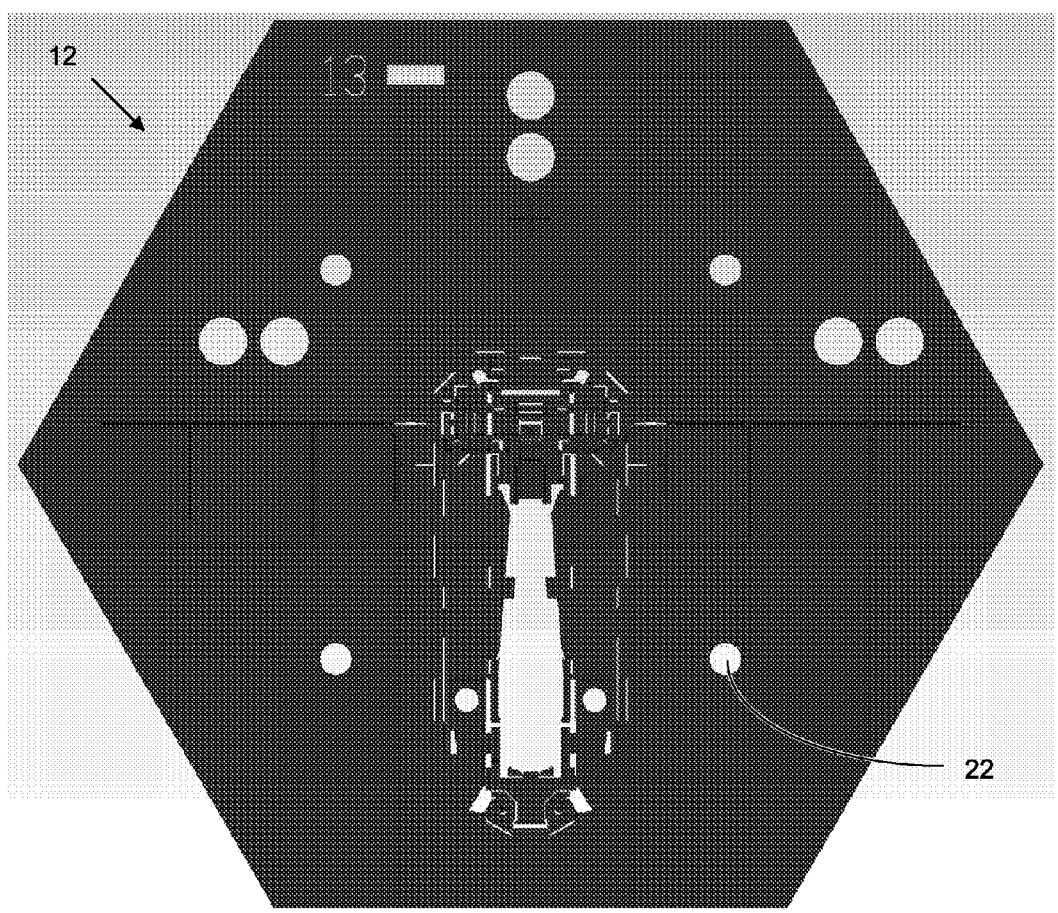
FIG. 4 is an illustration of a single layer made of 0-90-0 carbon-fiber composite.
Figure 5:
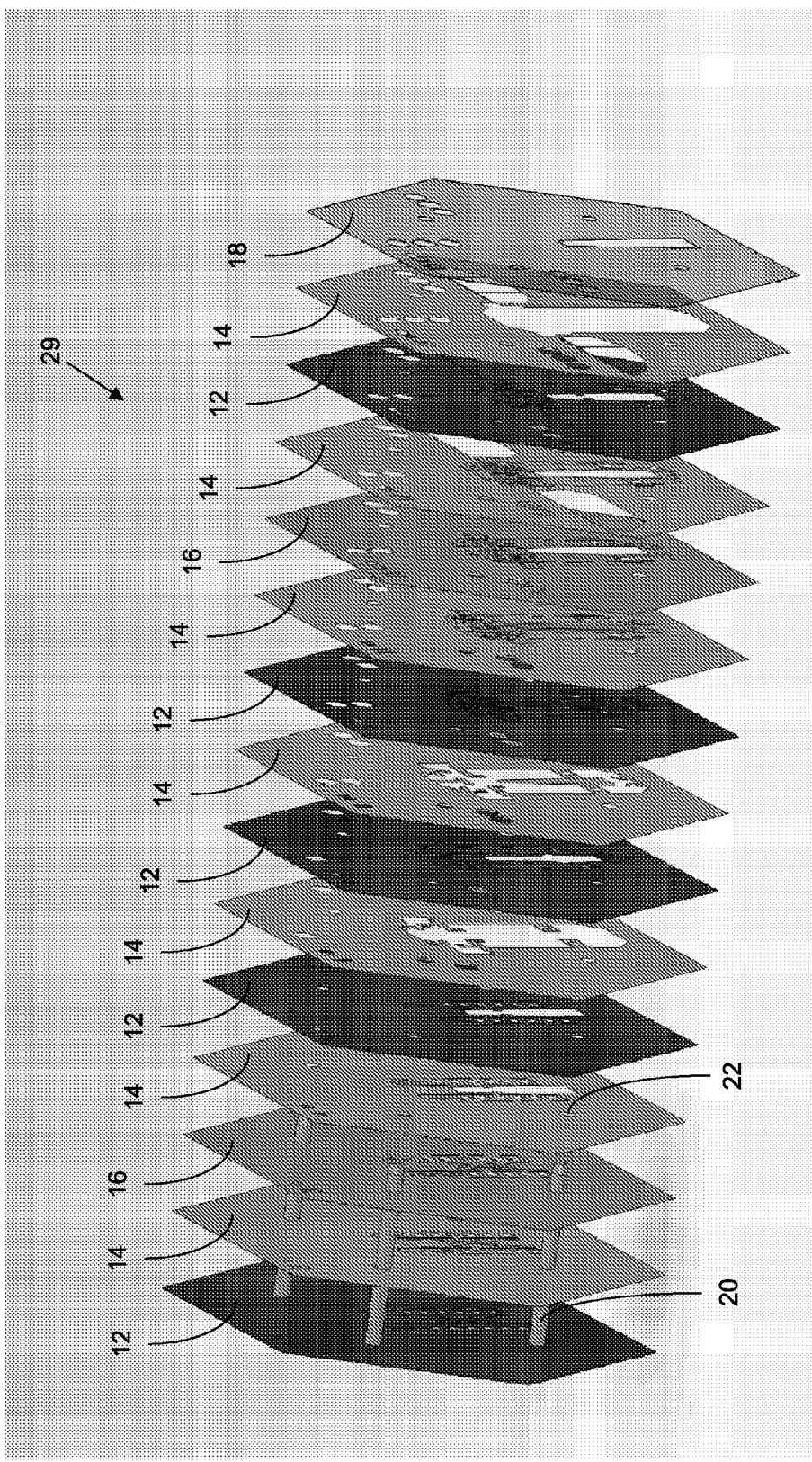
FIG. 5 is an exploded perspective view of a 15-layer layup for press curing.

To form the multi-layer laminate structure 31, a multitude of these layers (e.g., up to 15 layers have been demonstrated) are ultrasonically cleaned and exposed to an oxygen plasma to promote bonding and aligned in a stack by passing several vertically oriented precision dowel pins 20 respectively through several alignment apertures 22 in each of the layers, as shown in FIGS. 4, 5, and 7, and by using a set of flat tooling plates with matching relief holes for the alignment pins 20. In other embodiments, other alignment techniques (e.g., optical alignment) can be used. All layers can be aligned and laminated together.

Linkages in the laminated layers can be planar (where all joint axes are parallel); or the joint axes can be non-parallel, allowing for non-planar linkages, such as spherical joints.

In the fifteen-layer example, the final layup 29 included the following layers, which formed a pair of linkages (i.e., structures wherein flexible layers 16 are bonded to rigid segments 12 and extend across the gaps between the rigid segments 12), thereby enabling flexure of the rigid segments 12 relative to one another at the flexible layer 16 in the gaps between the rigid segments 12, wherein those exposed sections of the flexible layer 16 effectively serve as joints. In the embodiment of FIG. 5, the layers are identified in the sequence of their stacking order as follows, wherein the "rigid" layers 12 comprise carbon and "flexible" layers 16 are formed of polyimide:

Linkage 1:
1) carbon layer 12
2) acrylic sheet adhesive 14
3) polyimide film 16

4) acrylic sheet adhesive 14
5) carbon layer 12
6) acrylic sheet adhesive 14
Lone Carbon Layer for Spacing:
7) carbon layer 12
8) acrylic sheet adhesive 14
Linkage 2:
9) carbon layer 12
10) acrylic sheet adhesive 14
11) polyimide film 16
12) acrylic sheet adhesive 14
13) carbon layer 12
14) acrylic sheet adhesive 14
Wing Membrane:
15) wing membrane (polyimide or polyester film) 18

The choice of the flexible layers 16, which can be formed of a polymer—polyimide in this example—is based upon compatibility with the matrix resin in the carbon fiber. The cure cycle can reach a maximum temperature of 177° C. using a curing profile of four hours. Polyimide film (available, e.g., as KAPTON film from E.I. du Pont de Nemours and Company), for example, has a sufficiently high service temperature (up to 400° C.) to survive the curing step. The polyimide film can have a thickness of, e.g., 7.5 μm.

The rigid layers 12 in this embodiment are standard cured carbon fiber sheets (e.g., with three layers of unidirectional fibers, wherein the fiber layers are oriented at 0°, 90°, and 0° to provide thickness in two orthogonal directions) having a thickness of, e.g., 100 μm. Fifteen layers are used because the adhesive sheet 14 (e.g., in the form of a B-staged acrylic sheet adhesive, commercially available, e.g., as DuPont PYRALUX FR1500 acrylic sheets) in this embodiment is separate from each layer of structural material in the layup 29 of this embodiment. Accordingly, the adhesive sheet 14 can be laser machined into a pattern differing from any structural layer, and aligned layups 29 of many layers can be made. This capability enables the fabrication of parts with many linkage layers that are perfectly or near-perfectly aligned.

After the layers are stacked to form the layup 29, pressure and heat are applied, typically in a heated platen press to cure/crosslink the adhesive layers. Specifically, the layup 29 can be cured in a heated press, autoclave, or other device that provides the atmosphere (or lack thereof), temperature, and pressure to achieve the bonding conditions required by the adhesive. One embodiment of the curing process uses 50-200 pounds-per-square-inch (psi) clamping pressure, 350° F. (177° C.) temperature, and two-hours cure time (optionally with temperature ramping control) to cure DuPont PYRALUX FR1500 acrylic sheets in a heated press with temperature, pressure, and atmosphere control.

Though a single-step lamination process has been demonstrated, a process with two sequential lamination steps may be preferred in various embodiments because it provides a third technique for altering layering composition and because it may ease the problem of chip removal. A separate printed-circuit micro-electromechanical-system (PC-MEMS) structure called a "midplate" 23 can be included to alter the layer stack underneath the PZT plate 24 during initial lamination then removed, as shown in FIG. 3, allowing precise accounting for the thickness of the piezoelectric plate 24. The midplate 23 can be in the form of a simple reusable PC-MEMS laminate of a flat carbon-fiber plate containing alignment holes and a central polyimide boss 33 designed to support the lower PZT plate 24. This initial lamination results in two sub-laminates 35 and 37, each with a layered structure including a sequence of carbon 12, adhesive 14, polyimide 16, adhesive 14, and carbon 12, as shown in FIGS. 3*b* and 3*c*. The midplate 23 replaces adhesive layer 14 on top of the lower sub-laminate 37. The upper sub-laminate 35 also includes the two PZT plates 24.

An adhesive layer 14 is tacked to the lower sub-laminate 37 and micro-machined, while the upper sub-laminate 35 is micro-machined to sever mechanical bridges on the central carbon spacer layer 39. After chips are removed from the central carbon spacer layer 39, these two sub-laminates 35 and 37 are stacked and laminated together to produce the laminate structure 31 shown in FIG. 3*c*.

The corresponding single-step process utilizes discrete shims underneath the lower PZT plate 24 for support. In addition, machining steps often create unwanted material regions, or "chips," which must be physically removed. When the spacer layer 39 is micro-machined after initial lamination, all chips from micro-machining can easily be removed from the exposed surface. Post-lamination machining in a single-step process results in trapped chips that must be highly engineered to enable physical removal from the internal spacer layer 39.

4) Post-Lamination Machining

The laminate 31 is then machined (e.g., by severing tabs with a laser) to release the device(s) 26 from a surrounding frame structure in the laminate 31. In some embodiments, additional machining that is not involved with freeing the device 26 from the external frame (circumscribing the device 26 in the laminate 31) is reserved for after lamination (e.g., post-lamination machining of a layer that is structurally weak or that, for some other reason, cannot be precisely aligned since the weak layer is better supported after lamination).

5) Post-Lamination Treatment

A post-lamination treatment can include plating or coating on an exposed layer; and/or the post-lamination treatment can include the addition of a material, such as solder paste, by silk screening or some other method, e.g., for the later joint "locking" step, as shown in FIG. 10. Additional components may be attached to the laminate 31 using a pick-and-place methodology. Pick-and-place operations can be used to insert discrete components into layups 29 before press lamination.

For example, a stimulus responsive material 24, such as an electroactive material, can be inserted among the layers to serve as an actuator. In one embodiment, a lead zirconate titanate piezoelectric plate 24 is mounted on a spring clip 25 in the carbon layer 12 (shown in FIG. 8) and has been demonstrated to create a functional bimorph cantilever actuator within a device. A broad range of discrete components can be inserted this way, such as mirrors or other optical components, micro-electro-mechanical systems (MEMS), discrete sensors, etc. These components may alternatively be added earlier—e.g., before lamination at some point in the stack-up process—or they can be added after the subsequent assembly of the device.

Press lamination and laser micro-machining can be conducted multiple times. For example, five layers can be laser micro-machined, then press laminated, then laser micro-machined again. Another three layers can be separately laser micro-machined, then press laminated, then laser micro-machined again. These two partial layups can then be press laminated together with a single adhesive layer between them, for a final layup of nine layers.

6) Freeing the Assembly Degree of Freedom in Each Part

The resulting laminate can then be laser micro-machined and/or scrap materials can be removed from the laminate to "release" functional components in each part. The parts, as laminated, may unfold to have many actuated and passive mechanical degrees of freedom; though, in some embodiments, restraining these non-assembly degrees of freedom during the assembly folding process is advantageous. For example, elements of a flexural linkage can be held in place (i.e., locked)—to prevent the linkages from flexing—by a rigid bar element alongside the elements or by a fixed tab forming an integral bridge between the elements and the surrounding structure. Using a machining process (e.g., punch die or laser cutting), the tabs or other features that restrain the assembly degree of freedom are severed.

7) Assembly

As fabricated, the mobee can be a flat multi-layer laminate with limited three dimensional structure. Its components undergo a variety of assembly trajectories to realize the final fully three-dimensional topology. A co-fabricated mechanical transmission called an "assembly scaffold" couples all of these assembly trajectories into a single degree of freedom. The mobee emerges from the manufacturing process as a three-degree-of-freedom machine, though internal mechanical connections eliminate these active degrees of freedom during assembly. The resulting mechanism uses 137 folding joints to assume a fully three-dimensional topology in one motion, similar to those created by paper folding in pop-up books.

Assembly of the mobee 26 can include two parallel plates 42 and 43 of the assembly scaffold 19, one constructed from each linkage sub-laminate 35 and 37, coupled mechanically to form a Sarrus linkage 67. These plates 42 and 43 surround mobee's mechanical components and are constrained to a single linear degree of freedom separating the plates 42 and 43 along their normal axes. Interior linkages 44 and 45, driven by plate separation, are connected to each of mobee's core components to realize all desired assembly trajectories, as shown in FIGS. 9a and 9b. When the top horizontally oriented plate 42 of the scaffold 19 is lifted, interior linkages drive the mobee's assembly folds.

The Sarrus-linkage-assembly scaffold 19 provides a versatile framework to produce diverse assembly motions coupled together into a single degree of freedom. Rotations to a wide range of angles about any axis in a linkage plane can be achieved through an appropriately designed interior linkage. The mobee also incorporates more complex interior linkages to translate the wings 28 and the actuator 24 along three separate arcs without rotation during folding assembly.

One plate 42/43 of the assembly scaffold 19 is secured to an external jig, which drives six dowel pins 20 through clearance holes in the secured plate to separate the opposing plate 43/42. Separating the scaffold plates 42 and 43 initiates a single-degree-of-freedom folding assembly, causing the mobee's components to assemble into their final three-dimensional configuration. Various mechanical elements interfere upon completed folding, creating a joint stop. Tabs in one scaffold plate 42/43 can be folded manually and inserted into slots in the opposing plate 43/42, creating support pylons that hold the assembly scaffold 19 in its folded state, allowing it to be removed from the external jig.

Assembly of the final device 26 (including unfolding of the linkages 44 and 45 into multiple planes) can be performed manually by external actuation, or assembly can happen spontaneously. Where assembly is spontaneous, if one or more of the layers is pre-strained, the relaxation of the pre-strained layers can lead to the assembly of the device as soon as the assembly degree of freedom is freed. The layer that is pre-strained can be, for example, a patterned spring formed of spring steel or another spring-capable material, such as a superelastic nickel titanium alloy (nitinol) or an elastomer material that can survive the lamination conditions without annealing or degradation. The dowel pins and the pin alignment holes in the pre-strained layer can be configured to maintain this tension when the pre-strained layer is in the stack through lamination. The pre-strain can be in the form, for example, of tension or compression, though compression may require consideration of tendencies of linkages to buckle out of plane.

In other embodiments, actuators can be built into the laminate to effect assembly. For example, a piezoelectric bending actuator, shape memory layer, or other type of actuator can be laminated into the structure as a pick-and-place component or inserted as an integral part of a layer in the layup 29; and the actuator can be actuated, e.g., by supplying electrical current or by changing temperature, to assemble the expanded, three-dimensional structure 26. In one embodiment, the actuator is a bimorph cantilever including two 127-μm nickel-plated lead zirconate titanate (PZT) piezoelectric plates (PSI-5H4E, Piezo Systems, Inc.) coated with chromium to provide protection during the downstream locking process and bonded to a central carbon-fiber layer. Quasi-kinematic mating features and planar spring clips in the carbon-fiber layer 12 or titanium layer 41 can hold each plate in alignment during lamination.

Advantageously, in some embodiments, the assembly of all parts is actuated via a single assembly degree of freedom so that assembly proceeds in parallel for an entire panel, rather than part by part. Assembly can be effected in several ways, depending on the design and complexity of the part. For example, a human operator can actuate the assembly degree of freedom manually or semi-automatically. In one embodiment, the assembly degree of freedom is in the form of a plate connected to a Sarrus linkage 67 that is pulled up or pushed down, as shown in FIGS. 9a and 9b. Spherical joints or four-bar mechanisms can be attached to the Sarrus linkage, raising and folding other components into their three-dimensional position. Note that by having multiple rigid-flex planar layers and selective adhesion, complex mechanisms and collections of mechanisms can be released in the assembly step.

8) Joint Locking of Assembled Part

After assembly into a final three-dimensional structure, structural members can be bonded together in a fixed configuration (i.e., locked, fixed or frozen). In one embodiment, adhesive can be manually applied to structural members and/or joints, though this approach may not be ideal if many parts are being made. Alternatively, adjacent members that have come together to form a locked joint can be automatically laser welded. If adjacent members 45 and 46 have metal pads 17 (e.g., formed of brass) on them, then wave or dip soldering can form strong filleted bonds 48 between the members. Alternatively, solder paste can be applied, for example, by screen printing before assembly to the laminate; and then, after assembly, a re-flow step in a hot oven creates the bonds. Other variations include the use of two-part adhesives, etc.

In one embodiment, the mobee 26 includes 52 brass pads 47 distributed across outer surfaces of its linkage sub-laminates, as shown in FIG. 10a and shown with arrows in FIG. 10a. After folding, pads on disparate links align into 24 "bond points," in the form of either two pads 47 meeting at right angles, as shown in FIGS. 10c and 10d, or three pads forming the corner of a cube. The structure, held in its folded state, is submerged in a water soluble flux (e.g., Superior Supersafe No. 30) and then pre-heated in an oven at 100° C. for 10 minutes. It is then submerged in 260° C. tin-lead eutectic solder for approximately 1 second. Finally, the structure is ultrasonically cleaned in distilled de-ionized water to remove the water-soluble flux residue. The result of this soldering process is the formation of solder fillets 48 at all bond points, as shown in FIG. 10*d*, eliminating the assembly degree of freedom and locking all disparate machine components together.

9) Freeing the Non-Assembly Degrees of Freedom

Any non-assembly degrees of freedom in the part 26 can be unlocked by removing any features (e.g., connected tabs) that restrain them via, e.g., laser machining.

10) Separating Parts from the Scrap Frame

Now that the individual parts are fully assembled and ready for operation, the parts 26 can be separated from the scrap frame (e.g., an outer frame to which the parts are connected by bridges of material) of the scaffold 19 by laser machining, punching, etc.

Figure 11:
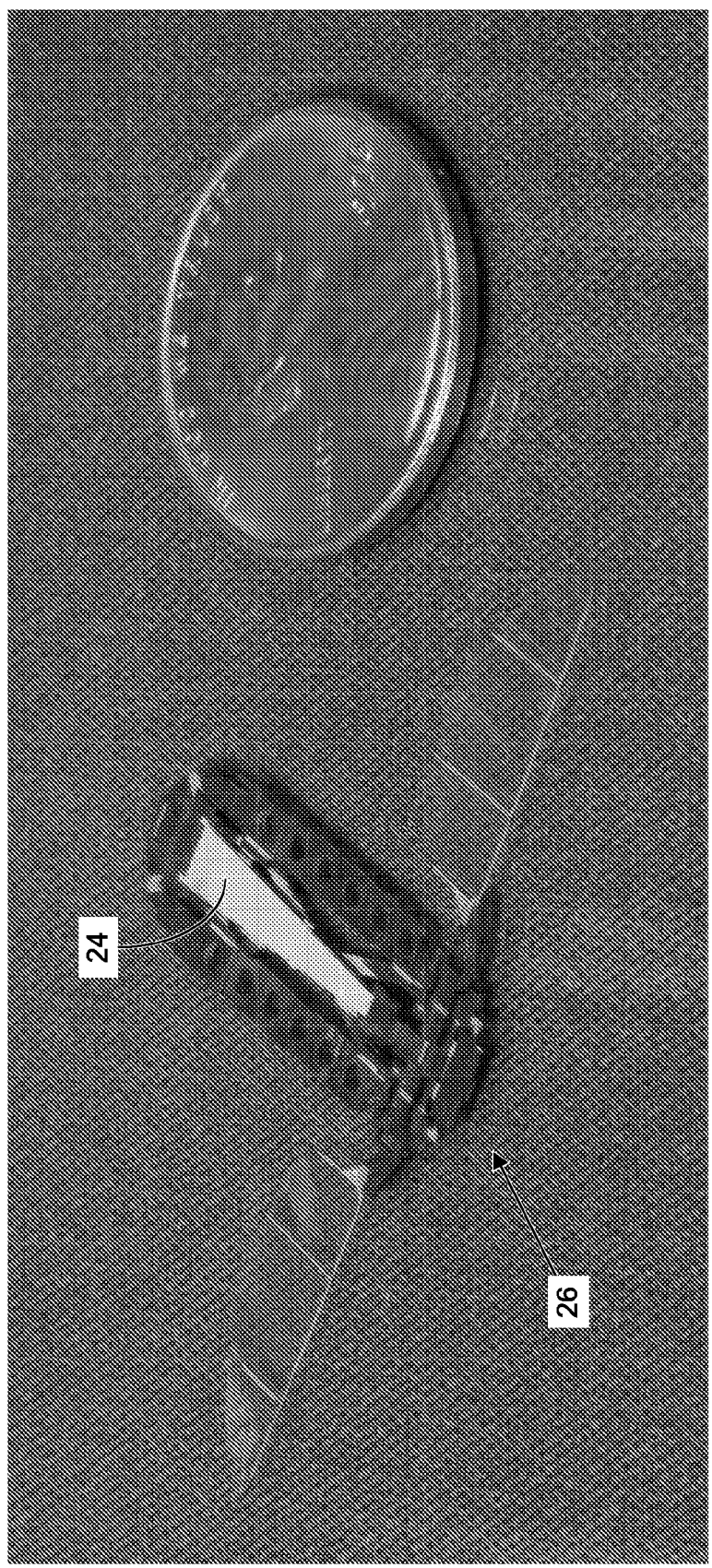
FIG. 11 is a perspective photographic view of the released mobee before pop-up assembly

Another monolithic "robotic bee," "robobee" or "mobee" 26 with a PARITy drivetrain fabricated with this technique using the 15 layers, described above, is illustrated before pop-up assembly (i.e., lying flat) in FIG. 11; a US penny is placed adjacent to the robotic bee 26 to provide a size reference. The robotic bee 26 is shown after pop-up in FIG. 12.

Figure 20:
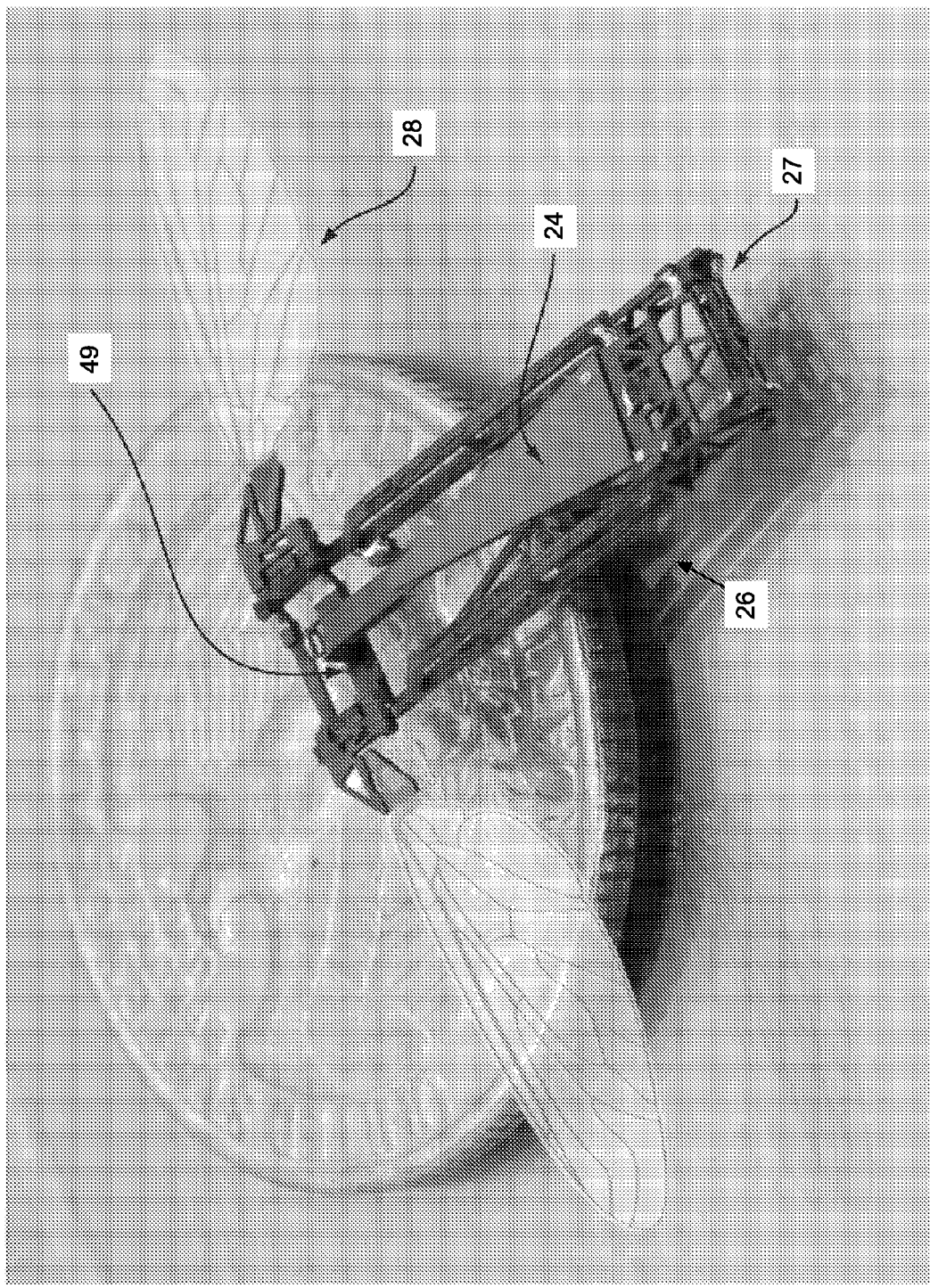
FIG. 20 is a perspective photographic view of the mobee after release from the surrounding scaffold.

Perspective views of another embodiment of the mobee 26 are shown in the photographic images of FIGS. 13-20, where the mobee 26 is mounted in the central region with a surrounding assembly frame 19 (including a hexagonal base plate 50 and a smaller inset plate 51 raised above it) after unfolding from the flat configuration (as in FIG. 11) in which it is manufactured after bonding and lamination. The resulting liberated mobee is illustrated in FIG. 20 against a US quarter for size comparison. As seen in the FIG. 20, the mobee 26 includes an airframe 27, a plurality of linkages separated by joints that form a drivetrain, a pair of wings 28 for generating flight, a piezoelectric bimorph cantilever actuator 14, and an input platform and transmission 49, coupling the actuator 24 with the remainder of the drivetrain.

Raised planes in the mobee 26 are formed, e.g., by making three intersecting orthogonal cuts in multiple layers to form the mechanical vias that can be folded 90° to extend vertically and by bonding layers at the ends of the mechanical vias to maintain connections between the layers after the three-dimensional assembly. The rectangular voids that are evident around the mobee 26 (shown in FIGS. 13-19) are left when the mechanical vias are folded out of that base plane. The mobee 26 will be laser cut out of the frame after the joints are locked. This version incorporates biomimetic wing spars 52 manufactured out of titanium as well as brass pads with a thickness, e.g., of 12.5 µm at folding locations to lock the joints when the device is dip soldered. The titanium can be clamped flat and stress relieved at 550° C. for one hour prior to assembly to reduce or eliminate curvature induced by micro-machining. The wing membranes will be added at a later step in the process. The mobee 26 includes carbon fiber components 12 for high stiffness, lightweight structural components, polyimide film 16 for resilient flexures, grade 25 titanium alloy 41 for robust and complex wing spars 52, and half hard brass for solder pads 47 for automated joint-locking.

In another embodiment of the monolithic bee 26, several additional concepts are implemented, namely, layer sharing, post-release wing membrane molding, and dip solder pads.

This device has 10 structural layers and 8 adhesive layers. The layup is sequentially stacked as follows:

Dip Solder Pads to Facilitate Joint Locking:
1) half hard brass, 25.4 um thick
2) glue Linkage 1:
3) carbon fiber
4) glue
5) kapton
6) glue
7) carbon fiber
8) glue Lone Carbon Layer for Spacing:
9) carbon fiber
10) glue Linkage 2:
11) carbon fiber
12) glue
13) kapton
14) glue
15) carbon fiber
16) glue Dip Solder Pads to Facilitate Joint Locking:
17*a*) half hard brass, 25.4 µm thick Wing Spars:
17*b*) grade 9 or 25 titanium alloy, 50.8-µm thick Layers 1-13 of the earlier design appear in this embodiment of the monolithic bee as layers 3-15. In this new embodiment, layers 1 and 2 allow solder pads to be placed on the bottom of the device, whereas layers 16 and 17*a* allow solder pads to be placed on top of the device.

The hexagonal scaffold plate 50 and the smaller plate 51 suspended parallel above it and within which the bee 26 is suspended via linkages (seen in FIGS. 13-19) form a Sarrus linkage 67 and are constrained by connecting linkages to have one degree of freedom; the smaller plate 51 can linearly translate upwards from the hexagonal plate 50. This is the assembly degree of freedom. All components of the bee 26 are connected by linkages to these two plates; and a laser can later to be used to cut these linkages and release the bee 26. As the Sarrus linkage 67 is actuated, each individual component of the bee 26 is folded up into its desired final configuration.

Layer Sharing:

There is no adhesive layer between the topmost brass 40 and titanium 41 layers (layers 17*a* and 17*b*, respectively) in the above outline. These two sub-layers can be thought of as sharing the same layer because they are non-overlapping and both engage with the adhesive layer 14 (layer 16 in the above outline), e.g., glue, to bond with the carbon fiber layer 12 (layer 15 in the above outline).

Two ways to accomplish layer sharing are described, as follows. In the first, multiple layers occupy non-overlapping areas in the x-y plane. For example, four alignment pins 26 can be used. The brass layer 40 (17*a*) can cover half of the full area of the device, while the titanium layer 41 (17*b*) can cover the other half. The brass 40 can be used to form solder pads 47, while the titanium 41 can be used to form the wing spars 52. Each sub-layer (17*a* and 17*b*) can engage with just two out of the four alignment pins 20 [i.e., two pins can engage with the brass sub-layer (17*a*), while the two other pins can engage with the titanium sub-layer (17*b*)]. Taken to the extreme, the layer can be split into many sub-layers if each sub-layer is engaged with enough alignment pins. For example, a single layer with six sub-layers can look like a map of New England, with each state made out of a different material, and with two alignment pins per state.

Figure 21:
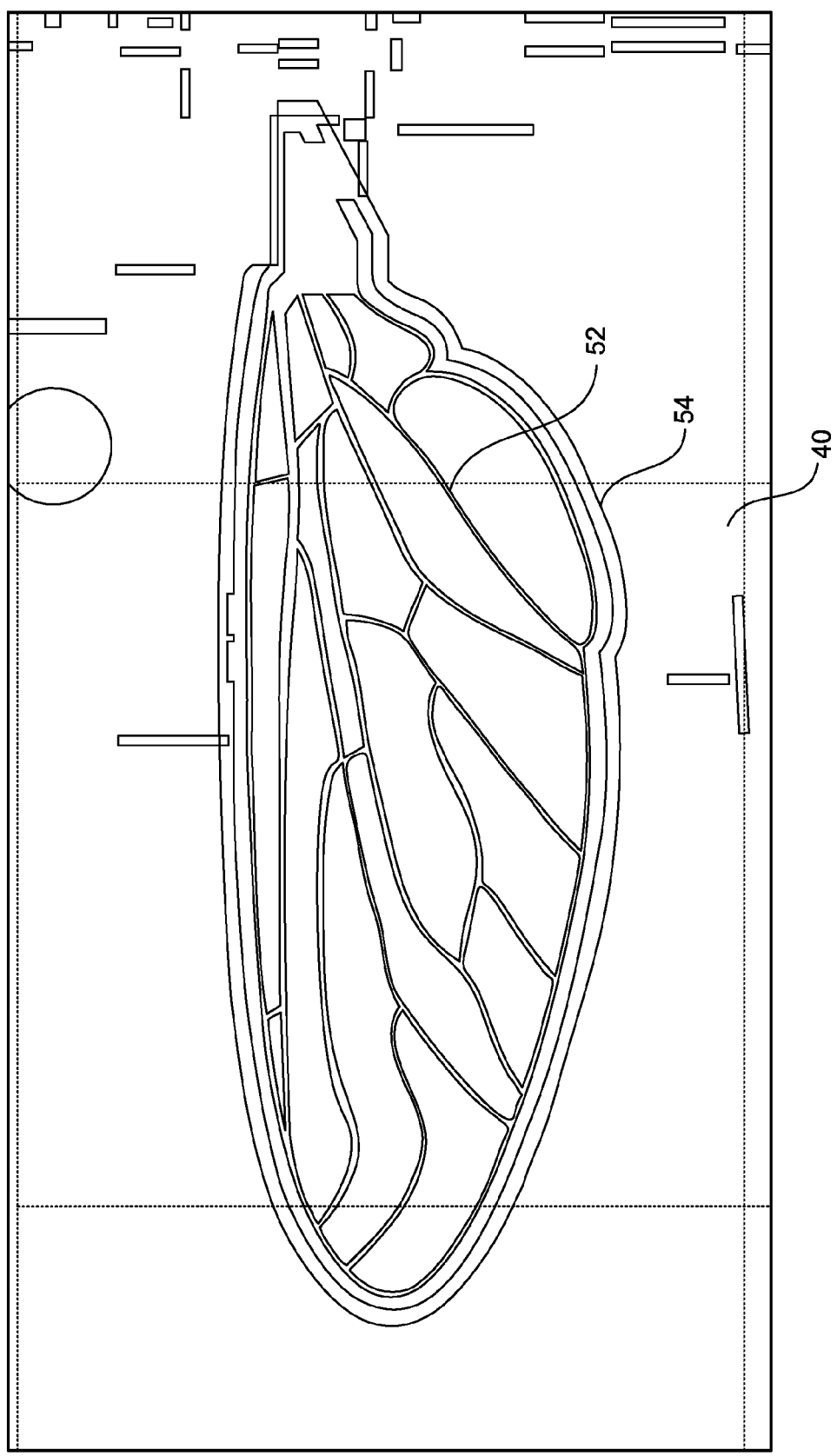
FIG. 21 is an illustration of the cuts in a shared layer of titanium and brass to form the wings and solder pads in a mobee.

A second way of achieving layer sharing (implemented in this embodiment of the monolithic bee) is by applying pressure to layers that are unsupported from below to bend the layers into the space below. Basically, if a large hole is cut in a thin layer, the application of pressure to the layer immediately above it (or below it) can be designed to warp and bend that adjacent layer around the edge of the hole, filling in the hole. In this embodiment, the brass layer 40 (17*a*) covers the entire laminate area, but is machined with a large wing-shaped hole (shown via the white outline 54 in FIG. 21). The titanium layer (17*b*) is stacked on top of the brass layer 40 (17*a*). The wing spar pattern 52 is machined into the titanium 41, with a bridge connecting the wing spar 52 to the bulk titanium sheet. Nominally, this wing spar pattern 52 is suspended above the hole cut out of the brass layer 40. The titanium layer 41, however, is designed such that it will bend slightly when lamination pressure is applied, allowing the wing to engage with adhesive layer (16) through the hole in the brass layer 40 when pressure is applied.

Figure 18:
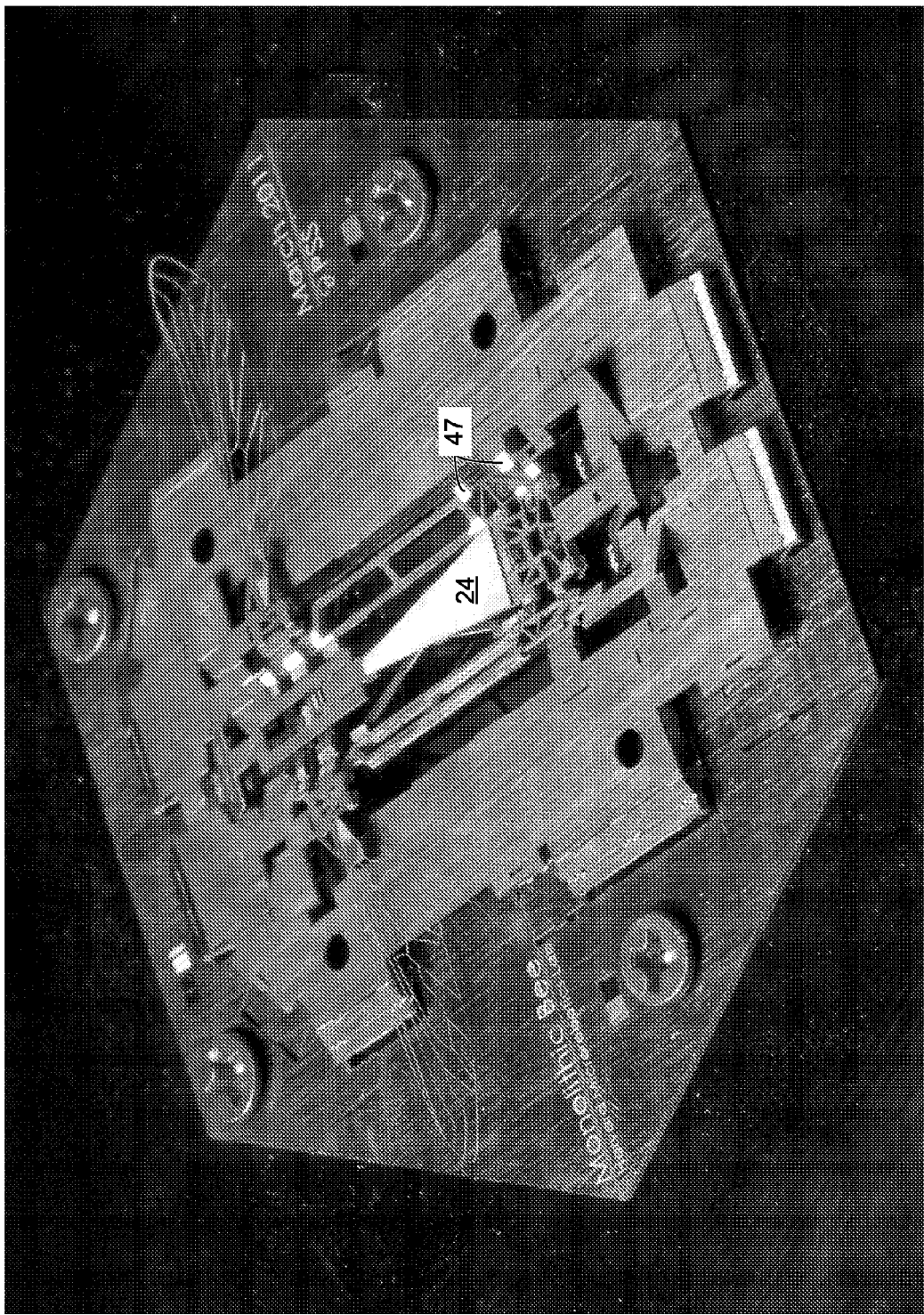
FIG. 18 is a back-angle perspective photographic view of the mobee of FIG. 13 before complete assembly with the layers only partially folded.
Figure 19:
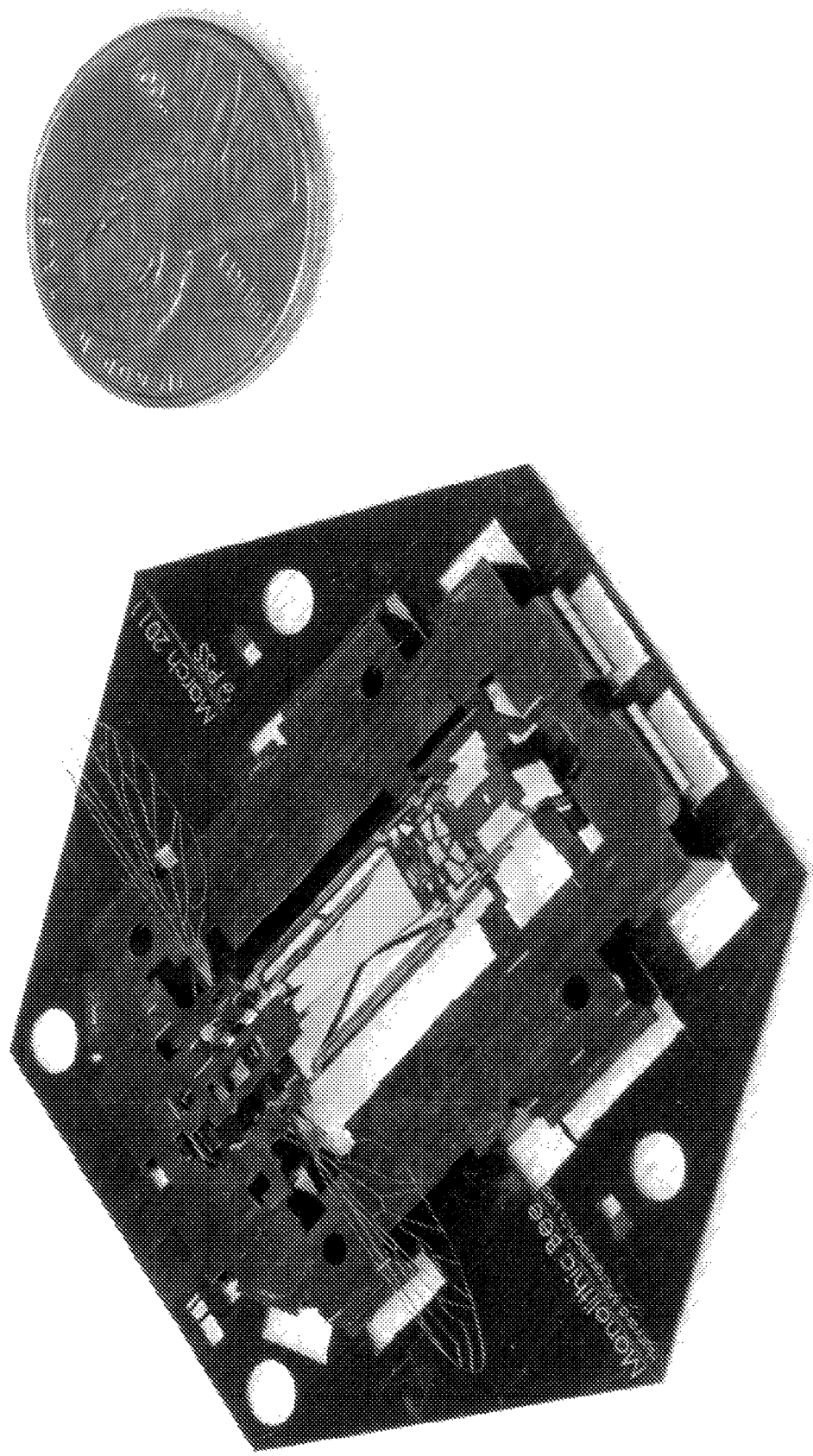
FIG. 19 is a back-angle perspective photographic view of the mobee of FIG. 13 against a white background.

Dip Solder Pads:

Brass pads 47 for dip soldering are evident in the images of the monolithic bee shown in FIGS. 12-19 (particularly in FIG. 18). The brass pads 47 are gold in color (contrasted with the bright yellow polyimide film forming joints) and many rectangular pads 47 can be seen in the vicinity of the base of the actuator 24. The device is submerged in flux and then in solder, causing solder fillets 48 to form on all of the brass pads 47 in close proximity, locking the assembly degrees of freedom in the mobee 26. Once this locking has taken place, the interior mobee 26 is cut out of the large surrounding assembly mechanism.

Figure 22:
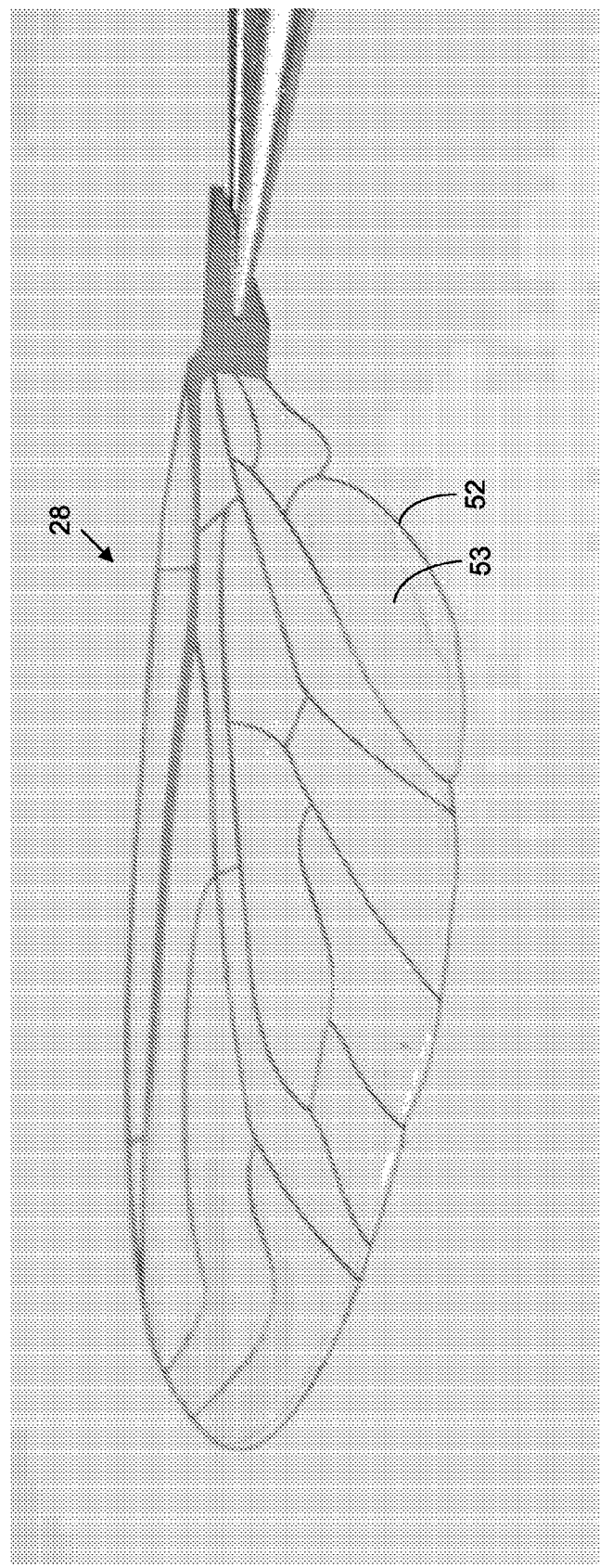
FIG. 22 is a resulting wing for the mobee with the membrane layers attached.

Wing Membrane Laminating:

After initial lamination, pop-up assembly, and joint locking, there are no membranes on the wing spars 52 of the monolithic bee 26 due to the difficulty of any membrane 53 surviving the dip soldering process. The mobee 26 is released from the surrounding Sarrus hinge assembly mechanism 67, but its active degrees of freedom are not yet released. The mobee 26 is then taken through a second lamination step where the wing spars 52 are sandwiched between two layers of 1.5 um polyester film (a thermoplastic). Heat and pressure (e.g., 120° C., 340 kPa for 15 minutes) cause the two films to bond to each other, sealing them to the spars 52—and thereby forming the membrane 53. The device is then placed into the laser to cut the wing outline 54. Only then are the active degrees of freedom of the bee 26 released. The resulting wing 28 is shown in FIG. 22.

11) Operation

After the manual attachment of three wires to the piezoelectric actuator 24, the mobee 26 is ready to operate. Applying an oscillating voltage to the piezoelectric actuator causes reciprocating flapping motion of the wings 28 (FIG. 19), e.g., at 100 Hz. As a completed machine, the mobee 26 can be constitutively similar to the earlier Harvard microrobotic fly (HMF); the mobee 26 distinguishes itself by the precision and scalability of the manufacturing process used to produce it.

B) Additional Embodiments

Flexure mechanisms and assembly folds result from the patterning and lamination of alternating rigid and compliant layers, similar to rigid-flex circuit board construction. We extend these methods with the concept of a superplanar topology; adhesive layers are patterned with a laser to allow selective mechanical connection between multiple rigid-flex planar layers. These "mechanical vias" enable the creation of complex multi-layer mechanisms, such as Sarrus linkages, which can actuate normal to the working plane. Device components may now reside on separate planar layers, reducing interference during folding and allowing greater complexity than is possible with a single flat pattern. Provided, below, is a detailed explanation of the fabrication method and present three example parts to illustrate its potential. The last device demonstrated achieves self-assembly by introducing a pre-strained layer into the part laminate.

Laminate Fabrication

The process begins with the production of multilayer laminates. Each layer is first bulk machined to define part geometry. Layers (post-machining) remain contiguous to preserve the structural integrity of each layer and to provide a connection from each device component to the alignment pins. Most features can be machined, leaving small tabs or bridges connecting parts to the surrounding bulk material, similar to break-off tabs in panelized circuit boards or the part panels found in plastic model kits. At a later step, a second round of machining frees the individual parts. Any method of machining that is compatible with the layer materials and meets the accuracy requirements of a particular application can be used, such as deep reactive ion etching (DRIE), photo-chemical machining and electroforming (for metals), laser machining, and punching.

For our research purposes, we used laser micromachining for its mask-less nature and for its compatibility with a wide range of materials. We employed an Nd:YVO4 DPSS laser, q-switched and frequency tripled to 355 nm. The maximum average power of the laser was approximately 1.5 Watts, which we found sufficient for machining layers in the 1 to 150 micron thickness range. The beam was focused to a spot approximately 8 microns in diameter using a telecentric objective lens. Full-range accuracy and repeatability of beam/part positioning was 2 microns or better. A laser of this type easily machines most materials, excepting glass and others that are highly transmissive of 355-nm radiation.

After each layer is machined, optional steps, such as electropolishing, ultrasonic cleaning and plasma treatment, may be performed to prepare each layer for lamination. In rigid printed-circuit-board (PCB) fabrication, circuit layers are usually bonded by interleaving pre-impregnated fiberglass-epoxy composite sheets (prepregs) or adhesive bondply layers. For this work, we used acrylic sheet adhesives. These adhesives are most commonly used to coat polyimide (or other polymer) film to form bondply (on two sides) or coverlay (on one side) laminates, but are also available in free-standing sheet form. PCB sheet adhesives are highly engineered materials with tailored thermal expansion properties and with very little flow during the bonding cycle. We used DuPont FR1500 acrylic sheet adhesive, 0.0005 inches (12.5 microns) thick. First, the acrylic sheet adhesive was machined with alignment holes. Second, the acrylic sheet adhesive was added as a free-standing layer to the stack or, alternatively, tack-bonded to an adjacent layer. For either technique, laser machining is used to pattern the adhesive. Other adhesives or methods of adhesion cab be used, but we find the combination of properties present in this type of adhesive to be well suited for MEMS-scale microfabrication.

Figure 23:
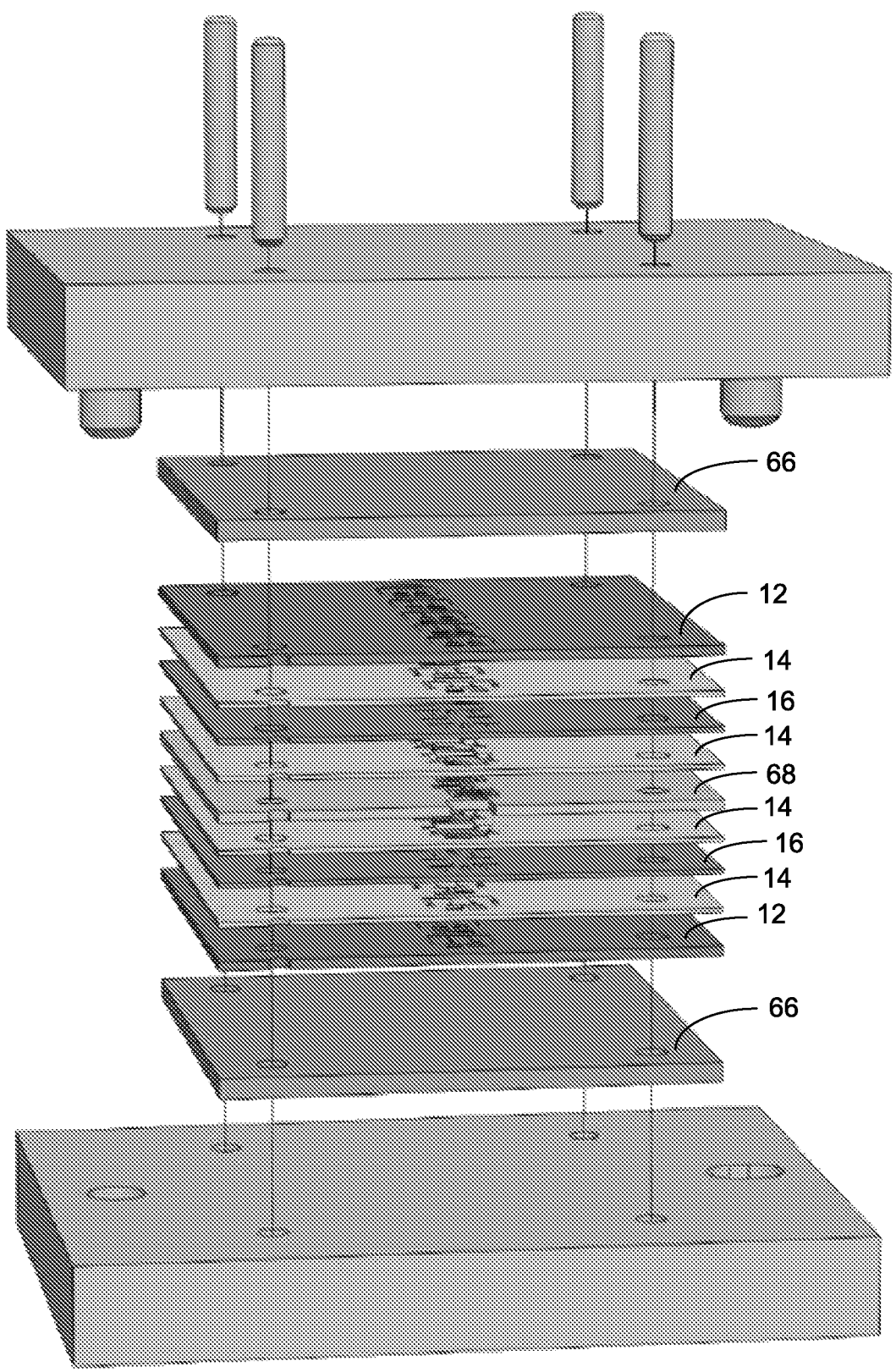
FIG. 23 is an illustration of a laminate stack and alignment tool for monolithic fabrication.

FIG. 23 illustrates the laminate stack and alignment tooling used for this work. The part layers are 25 mm on a side. Each outer layer 66 represents possible pressure-distribution, conformal and release layers. Between the outer layers 66, the following layers are stacked in sequence bottom-to-top: carbon-fiber layer 12, adhesive layer 14, polyimide film 16, adhesive layer 14, pre-strained spring steel layer 68, adhesive layer 14, polyimide film 16, adhesive layer 14, and carbon-fiber layer 12. The carbon-fiber layer 12 is our standard 0-90-0 three-layer laminate with thickness of approximately 100 μm. The adhesive layer 14 is DuPont PYRALUX FR1500 with 12.5 μm thickness. The polyimide layer 16 is 7.6 μm-think KAPTON polyimide film. Finally, the spring steel layer 68 is 0.003-inches (76 μm) thick and laser machined with planar springs. The alignment holes are placed in positions such that this layer 68 must be stretched during stacking, extending the planar springs and storing energy in the laminate. These springs drive pop-up self-assembly once the device is completed.

Multiple part layups 29 may be bonded simultaneously, using rigid separator plates between stacks. Alignment accuracy is determined by several factors, such as the accuracy of the alignment holes 22 and pins 20, coefficients of thermal expansion (CTEs) of the layer materials and the size of the laminate. For alignment, we used standard precision dowel pins (1/16 inch) and alignment holes typically undersized by a few microns to benefit from elastic averaging. In practice, post-lamination alignment is better than 5 microns. The exact numbers were difficult to measure, as this accuracy approaches the material-uniformity and edge-roughness limits of our materials and machining process.

Figure 24:
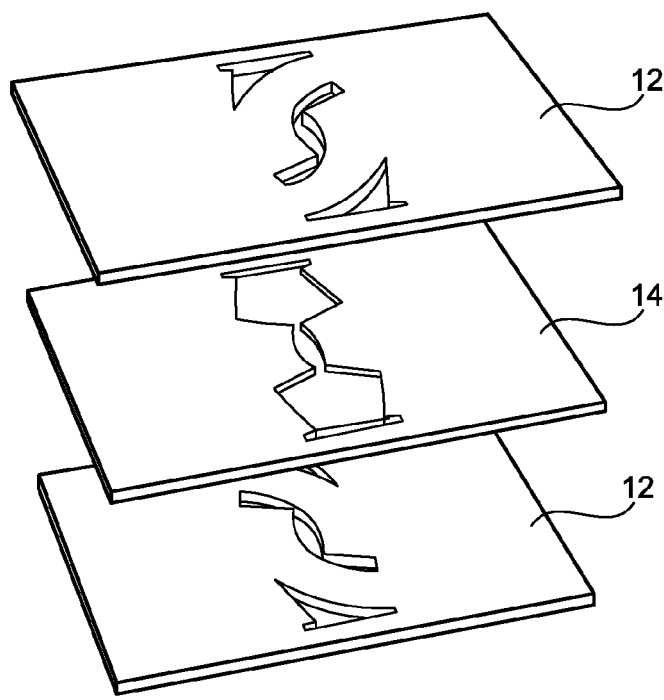
FIGS. 24-27 illustrate interlocking chain-link structures fabricated via monolithic fabrication.
Figure 25:
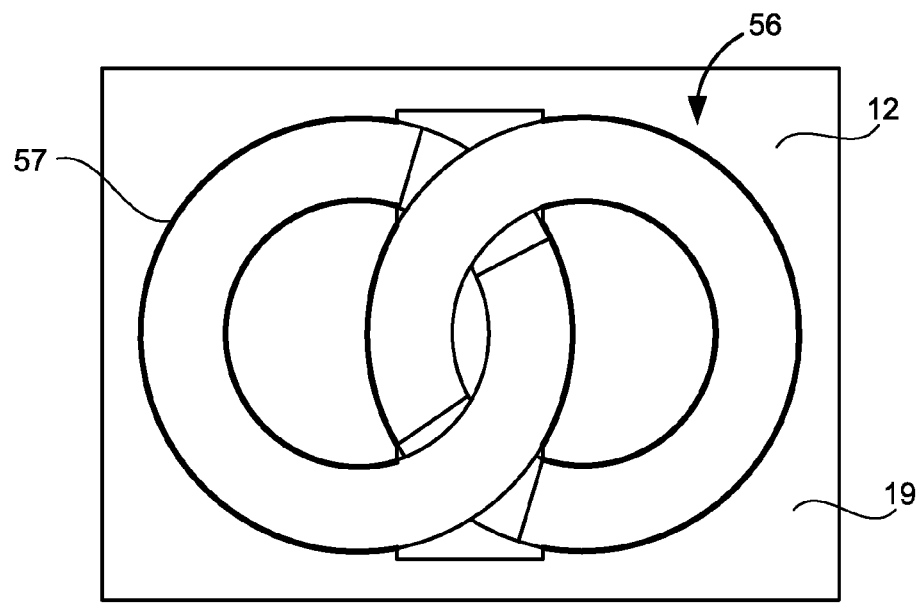

We first demonstrated these methods by making a fairly complex part from a very simple layup; with just two rigid layers 12 separated by a single adhesive layer 14, we can make a linked chain 56. FIGS. 24 and 25 illustrate the process with a simple two-link version. Essentially, the outline 57 of two interlocked rings is machined into each rigid layer. However, where they overlap, one rigid layer 12 (top or bottom) continues, and the other has a gap; for the other intersection, the reverse. The adhesive layer 14 is machined to prevent bonding between the two rigid layers 12 at both overlap regions. Selective adhesion is an enabler of this part.

Figure 26:
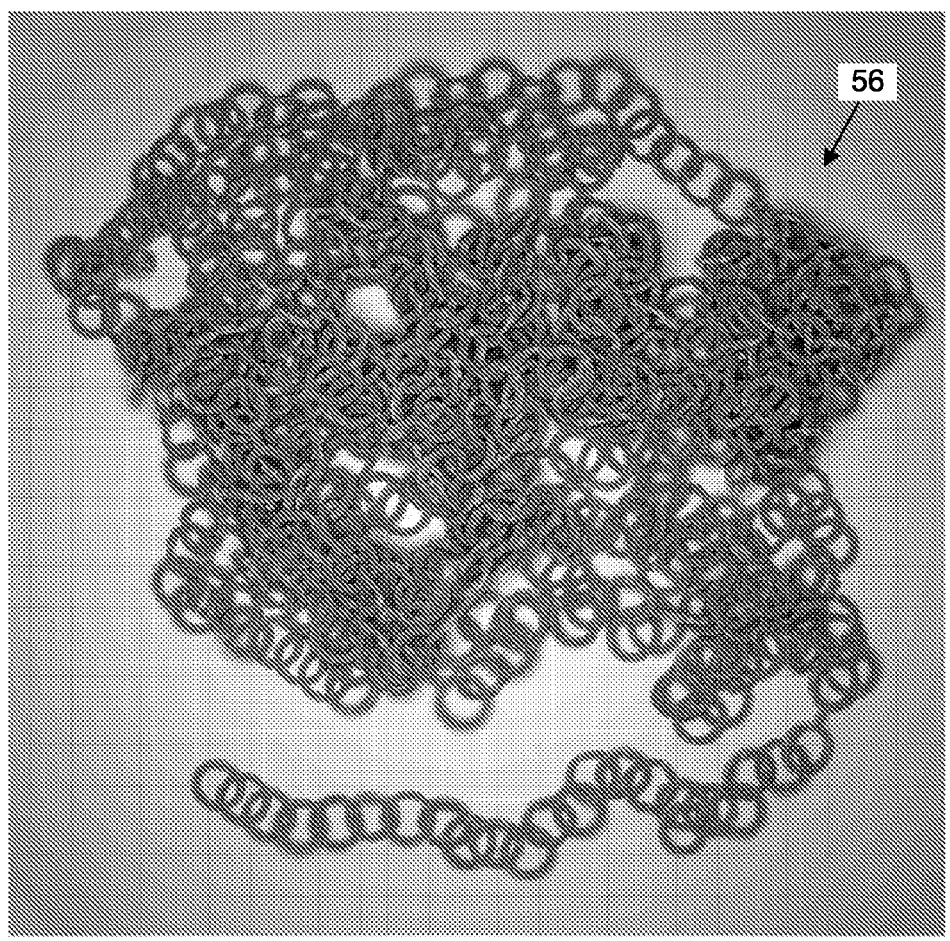
Figure 27:
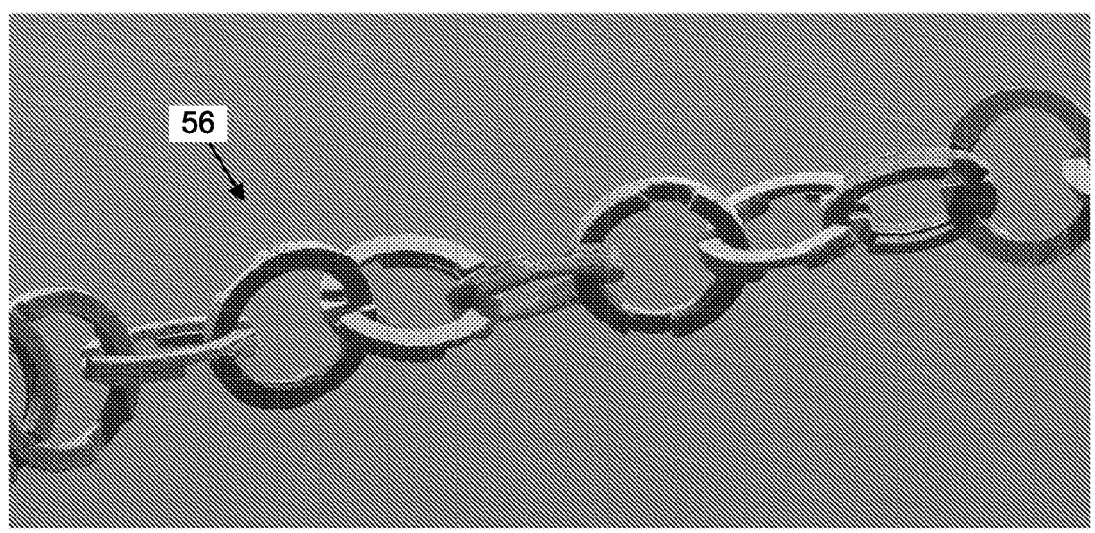

After laser machining, the layers are aligned using pins 20, and bonded. Note that in this application, the adhesive layer 14 is free-standing. We found that PCB-type acrylic sheet adhesives (only 12.5 microns thick) have sufficient strength and stability to support themselves and maintain accurate alignment in the layup. The chain is "singulated" after bonding by completing the outline cut. A chain 56 so-fabricated with 549 links is shown in the FIGS. 26 and 27. The rigid layers are carbon fiber composite, each 95 microns thick. They were cut from a pre-cured 0-90-0 laminate of unidirectional carbon fiber (33 grams/m$^2$ per ply) impregnated with cyanate ester resin. This material is very strong, stiff and light; and it laser machines easily and has a low coefficient of thermal expansion. After lamination and singulation, the chain 56 is simply lifted out of the scaffold frame 19.

Structure by Folding

The chain 56 provides a good example of the complexity possible when selective adhesion is used in laminated construction. Increasing the number of layers does allow parts of greater complexity; however, this 3D printing approach runs into several limitations: as part thickness grows, it becomes increasingly difficult to make singulation cuts deep in the part; excess supporting material typically must be removed; and structural elements aligned normal to the working plane are weakened by interleaved adhesive layers. As described, herein, we have explored folding as an alternative approach for making 3D structures.

There are many examples of folding, including origami, sheet metal construction and rigid-flex PCBs. A flat pattern is folded at creases, at score lines, or at flexible hinges. To form flat patterns in our process, we machine "links" out of a rigid material, separated by narrow gaps spanned by a compliant material. These flexures serve as assembly folds or mechanism joints. Structures of incredible complexity are possible through origami folding and modern algorithms can yield crease patterns directly from a 3D model.

A downside to folding is typically the challenge of assembly. When working with a single rigid-flex planar layer, forming complex shapes typically requires many sequential folds and thus many assembly degrees of freedom. If the goal is batch production, assembly ideally will occur using only a single degree of freedom. A motivating example is a pop-up book, where a single rotation results in the folding and assembly of many interconnected components. Unlike origami, pop-up book scenes—when closed and unfolded—include multiple folding layers. Using the laminated construction process described herein, similar structures can be created.

Figure 28:
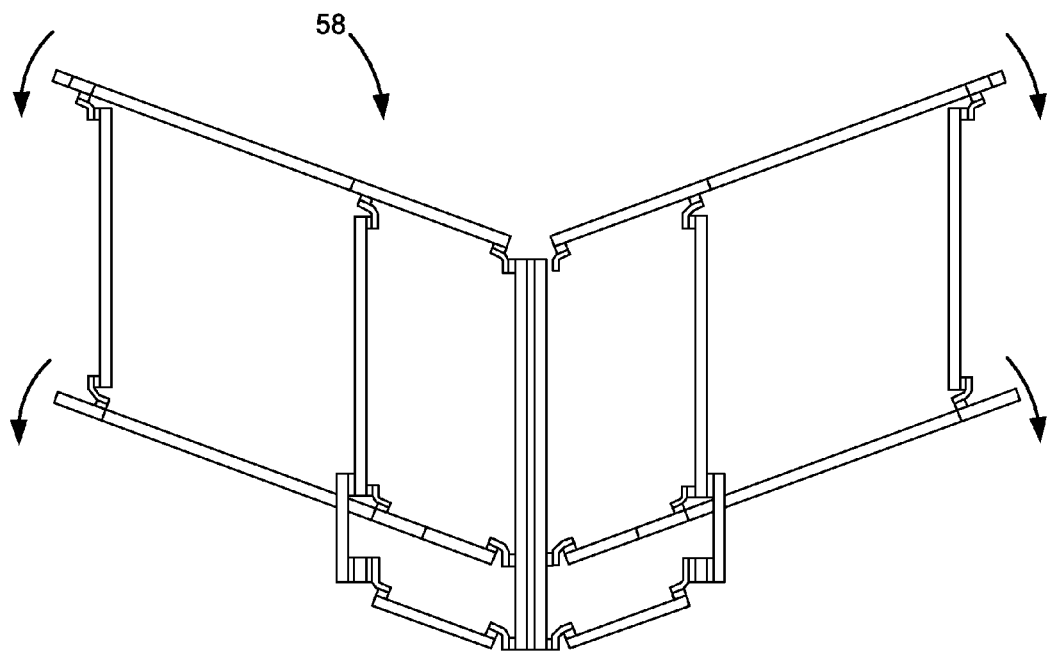
FIGS. 28-30 illustrate the folding mechanism and layers of a Wright Flyer model.
Figure 29:
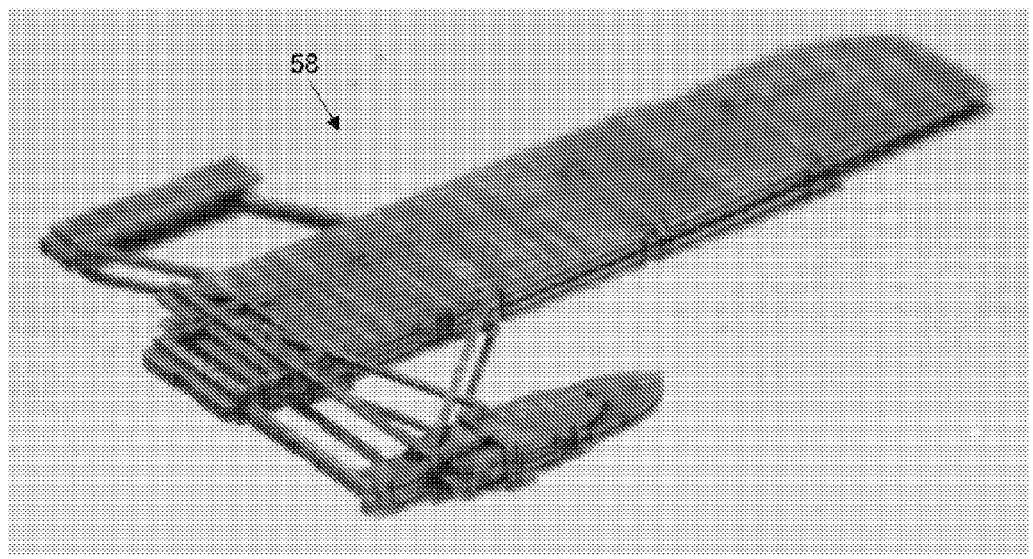
Figure 30:
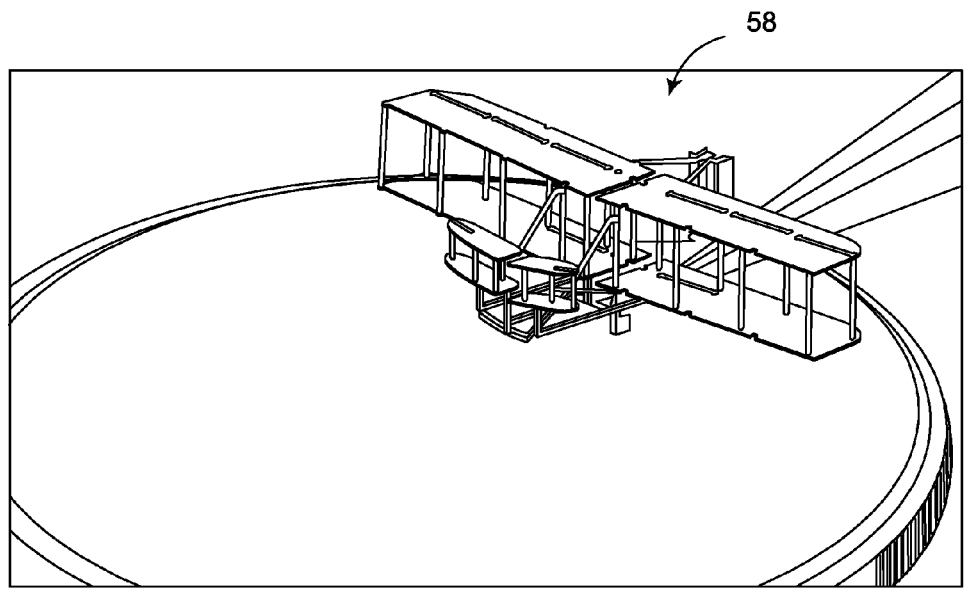
Figure 31:
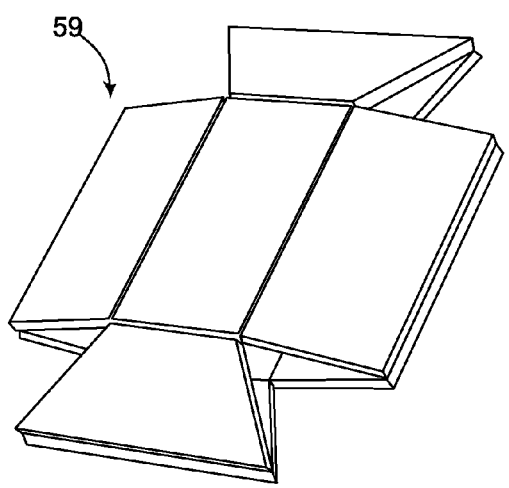
Figure 32:
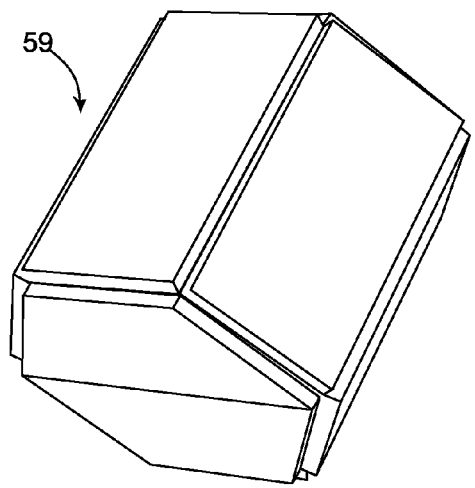

A model of the "Wright" flyer 58 is shown in FIGS. 28-30. A schematic of the folding mechanism for the Wright flyer 58 is shown in FIG. 28, while a photographic image of the model 58 (before folding/pop-up) is shown in FIG. 29. Finally, a perspective view of a first embodiment of the Wright Flyer model 58 is shown on a U.S. quarter-dollar coin in FIG. 30 after folding (after pop-up).

Another embodiment, that of a spring-actuated eight-sided hexagonal enclosure 59 is shown in FIGS. 31-36. Specifically, perspective views of the structure 95 in collapsed (before pop-up) and actuated (after pop-up) states are respectively provided in FIGS. 31 and 32. Top and side schematic views of the collapsed structure 59 are respectively provided in FIGS. 33 and 34, while a side schematic view of the structure 59 popping up with actuation of a spring 60 in a spring steel layer 68 under tension is provided in FIG. 35. Finally, a top view of the spring mechanism 60 is shown in FIG. 36.

Monolithic Icosahedron

Figure 37:
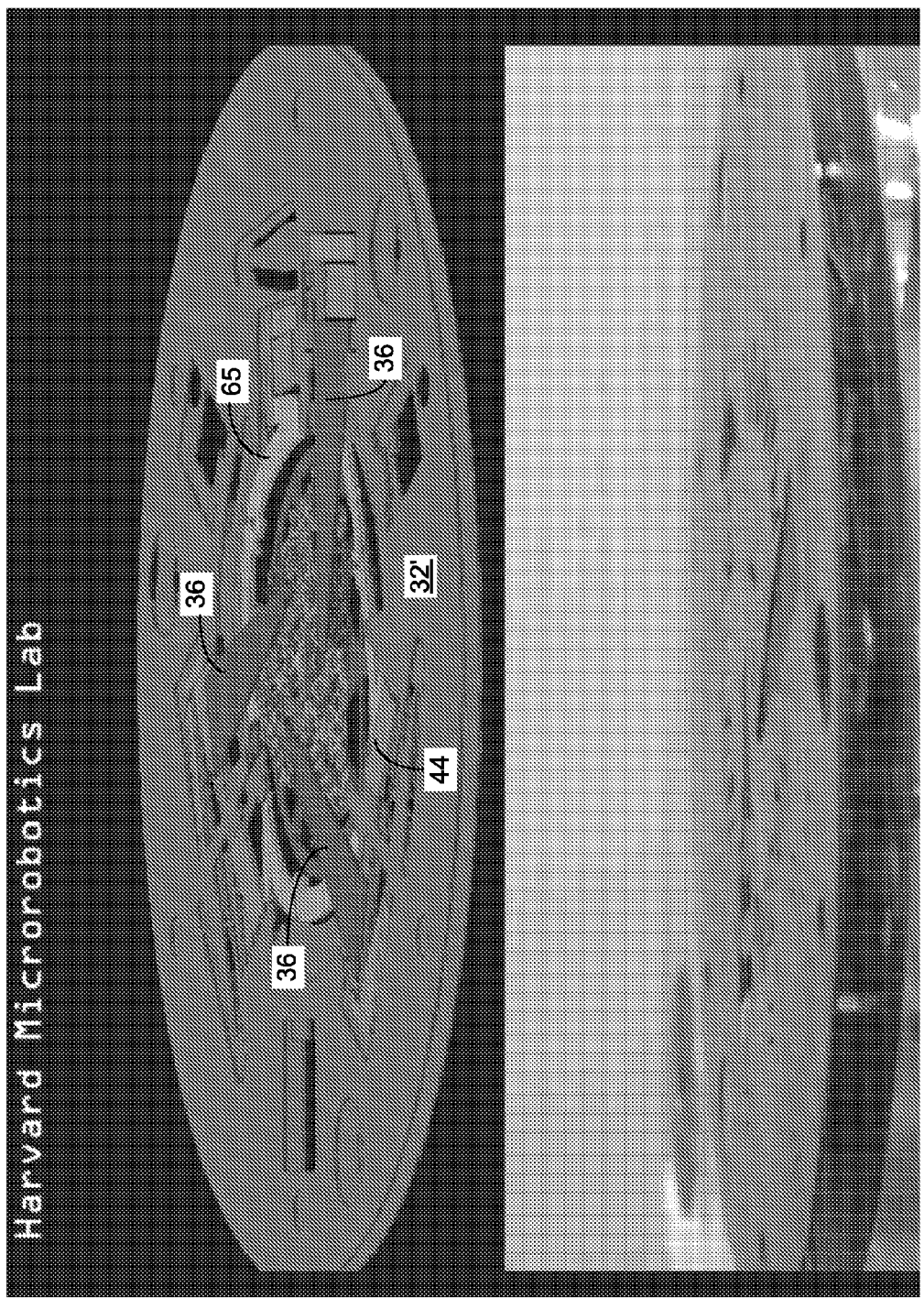
FIGS. 37-42 show a sequence of film captures and animated clips showing the unfolding assembly of an icosahedron.
Figure 38:
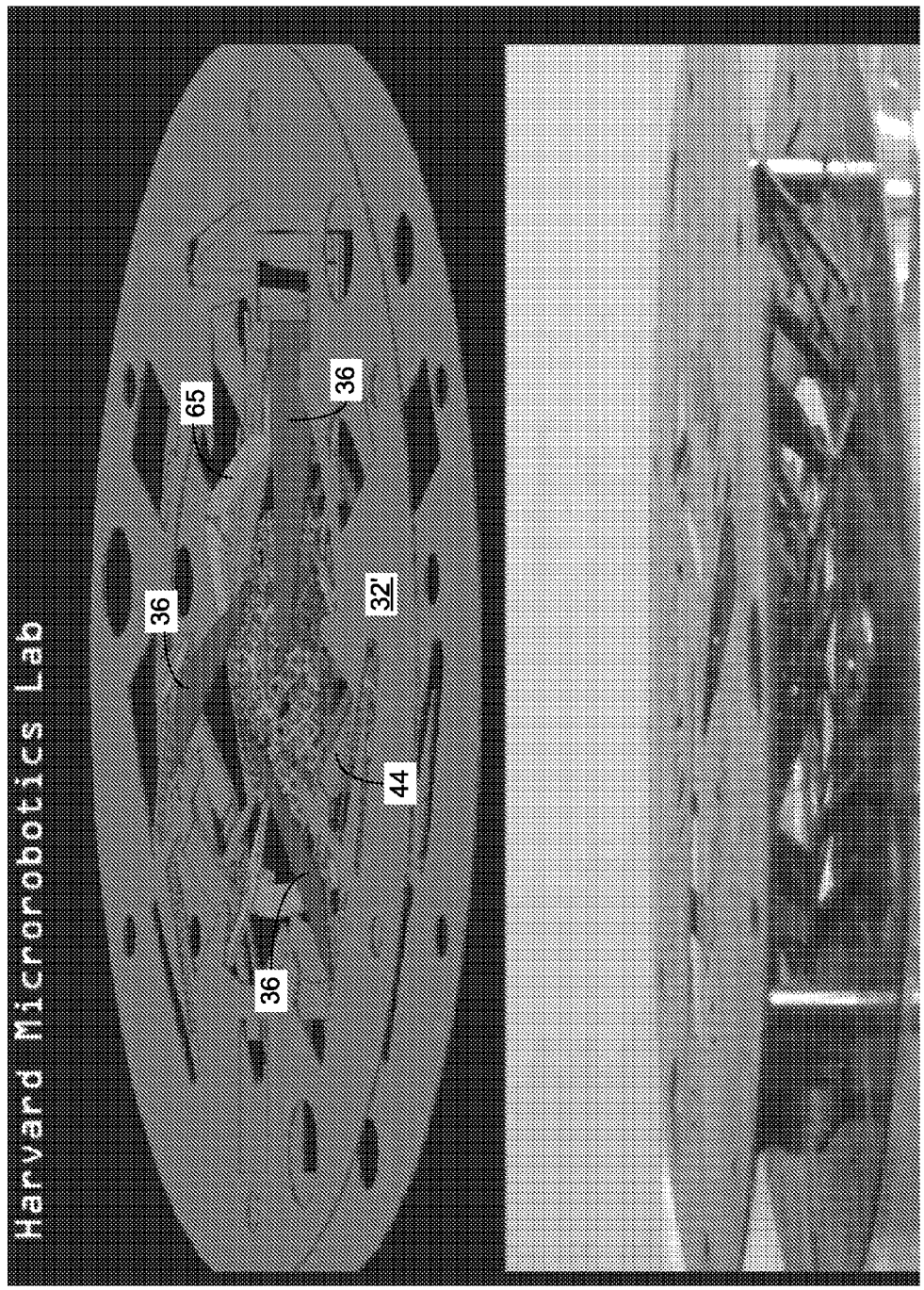
Figure 39:
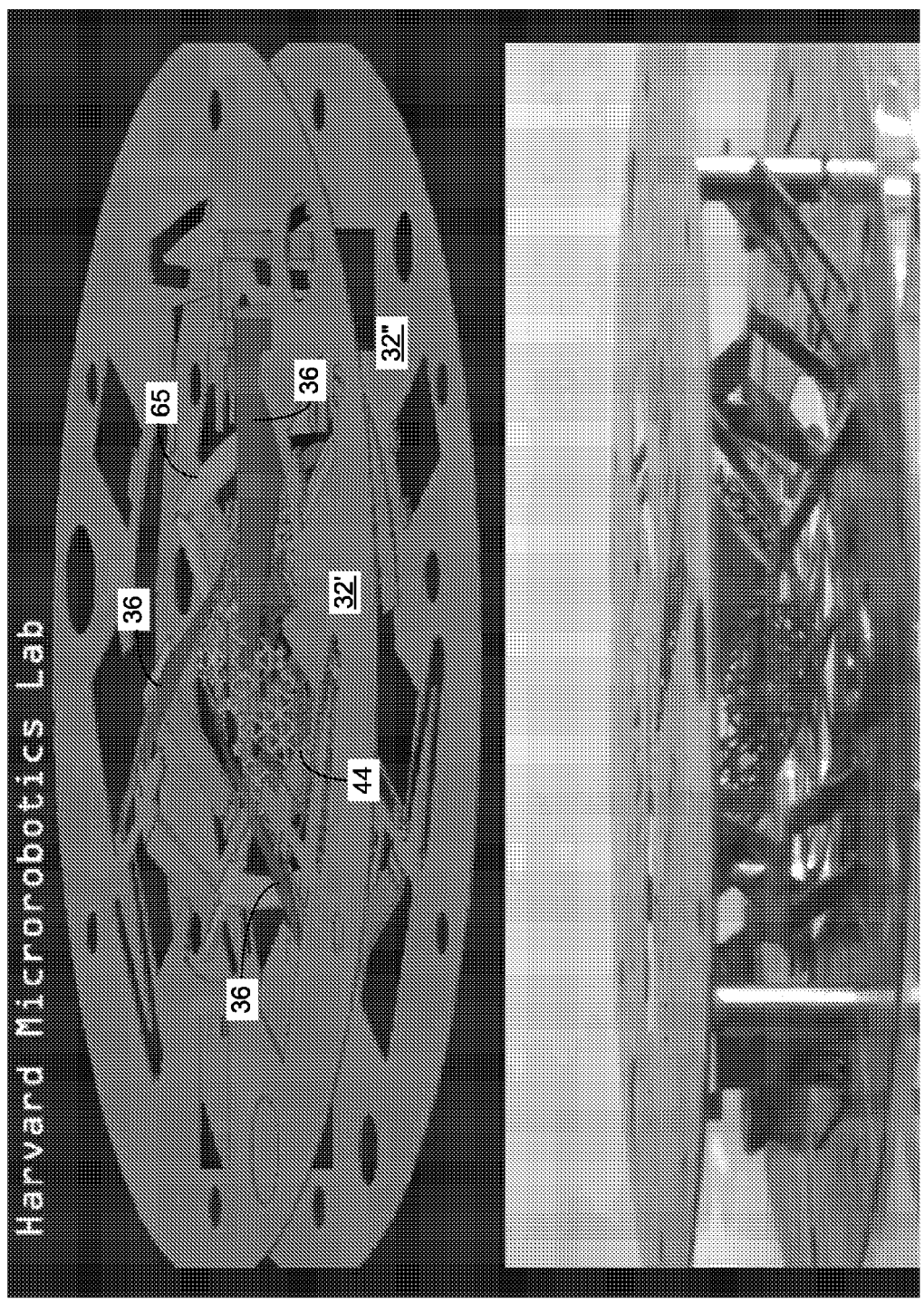
Figure 40:
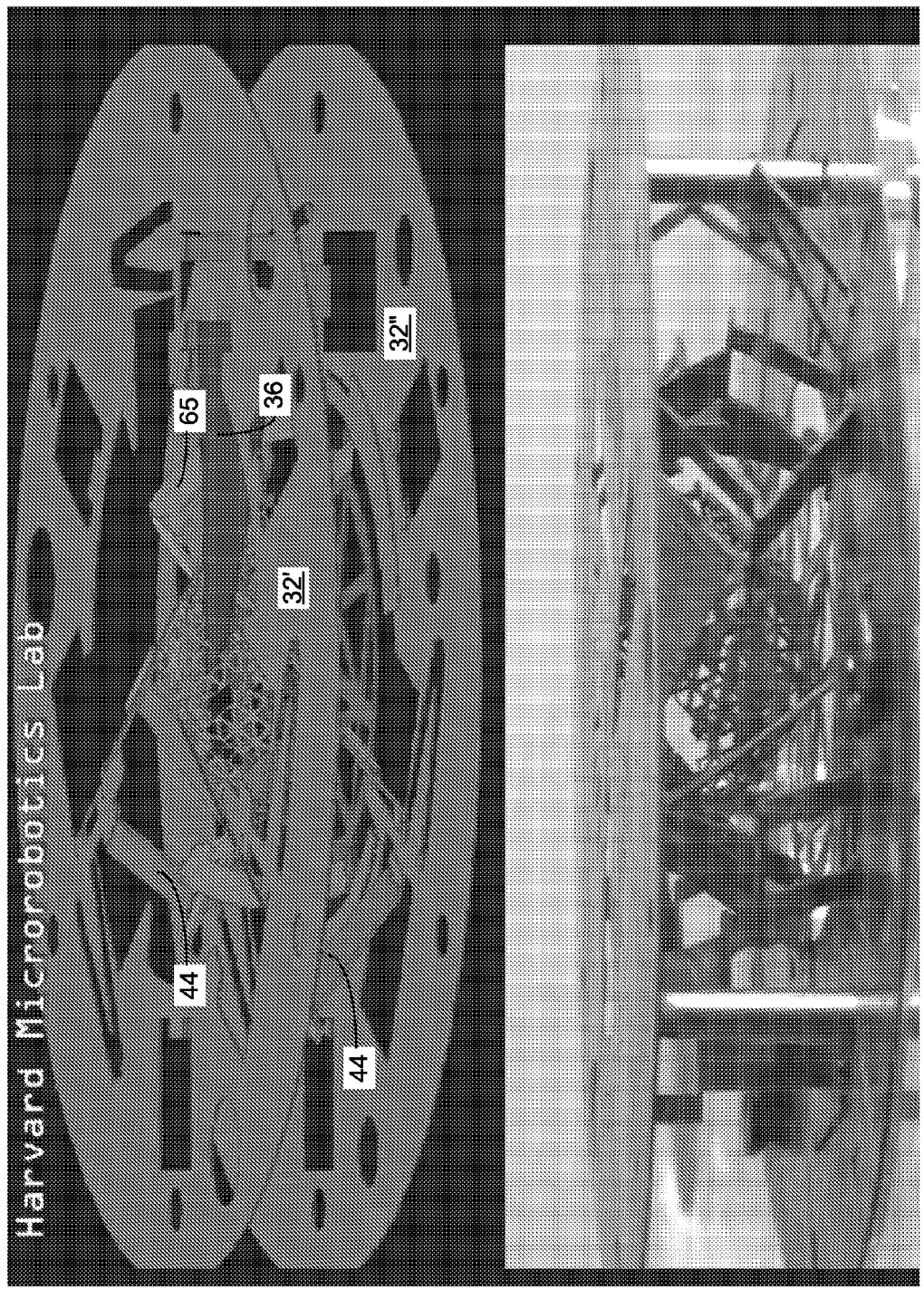
Figure 41:
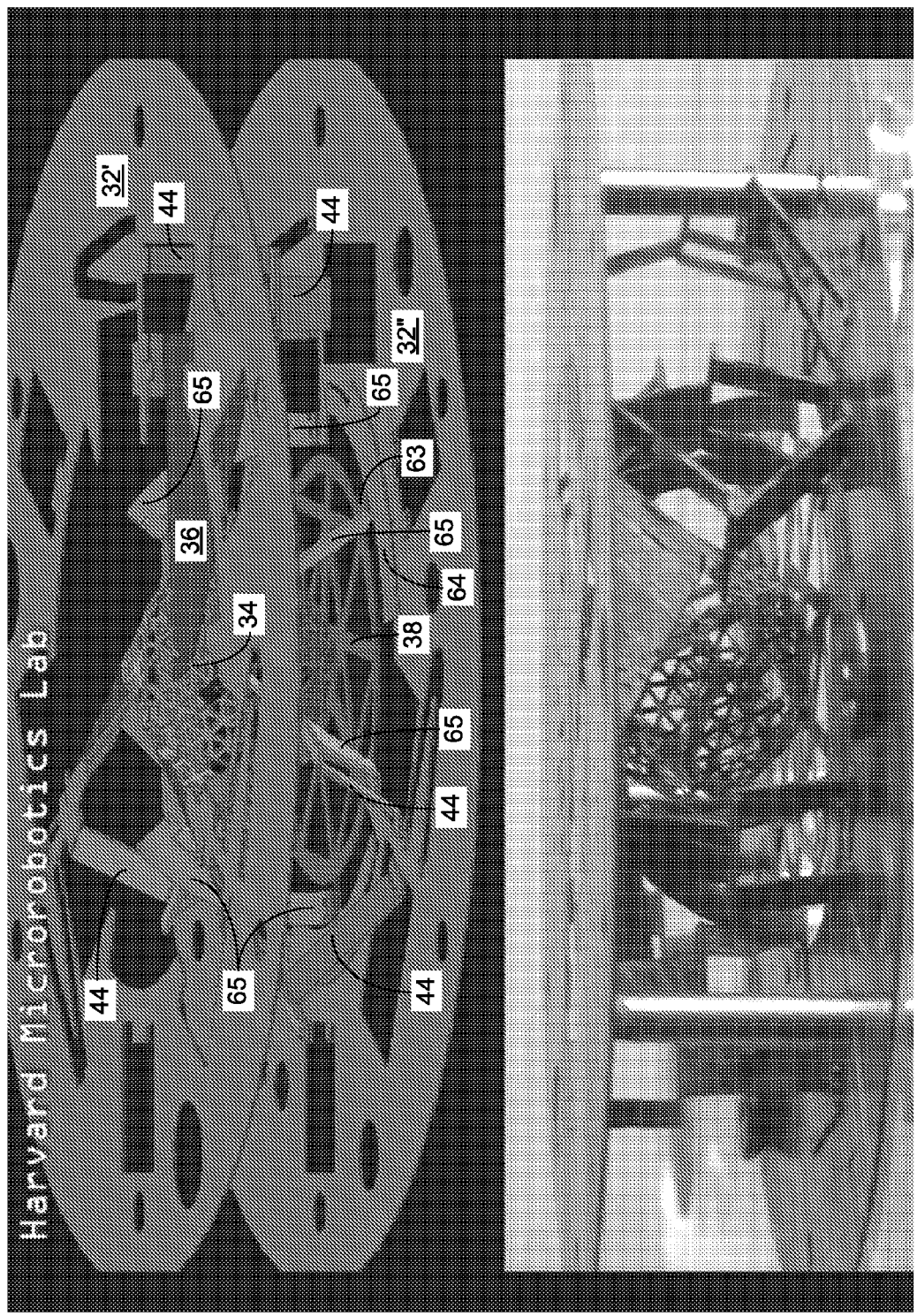
Figure 42:
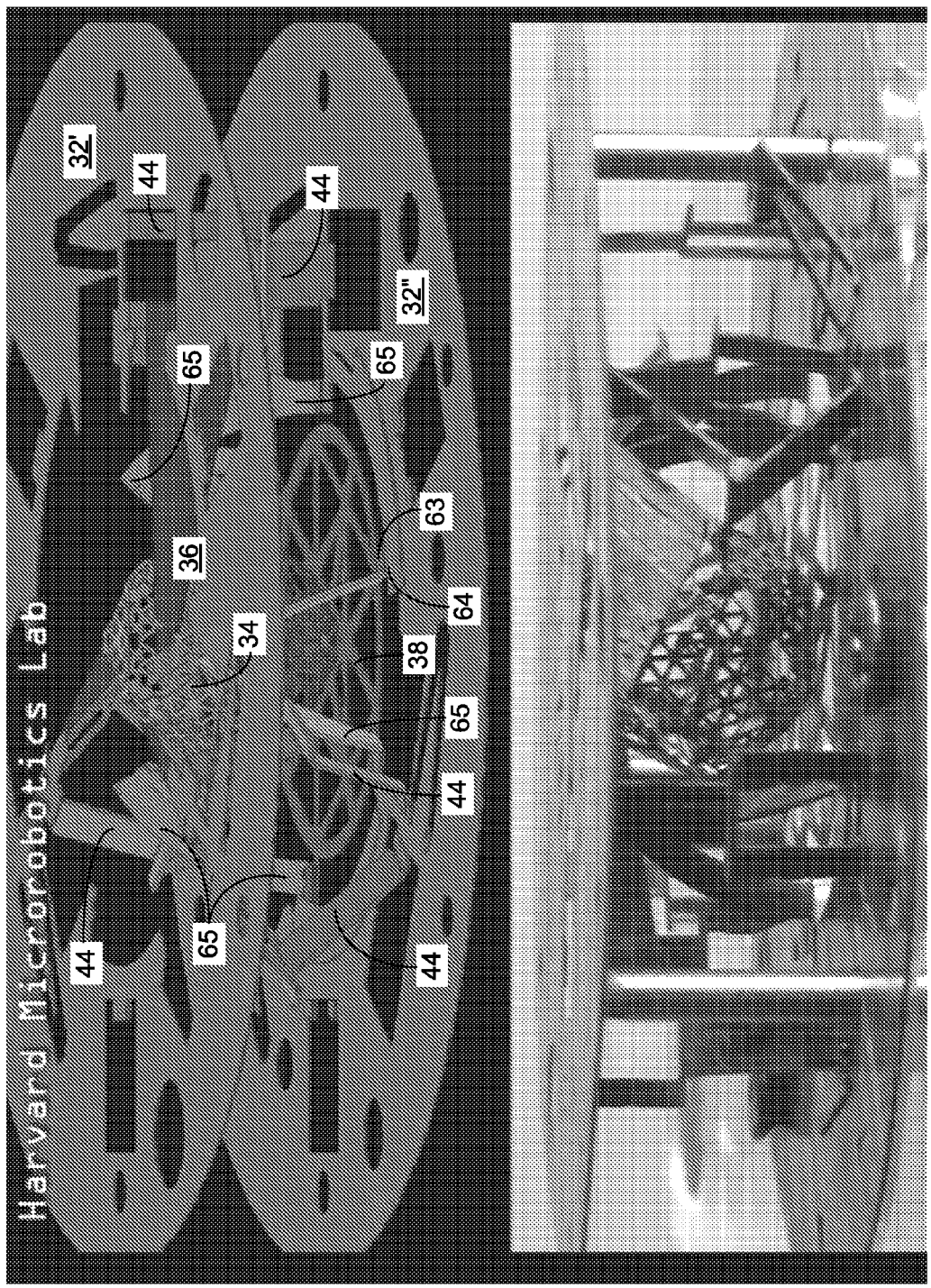
Figure 43:
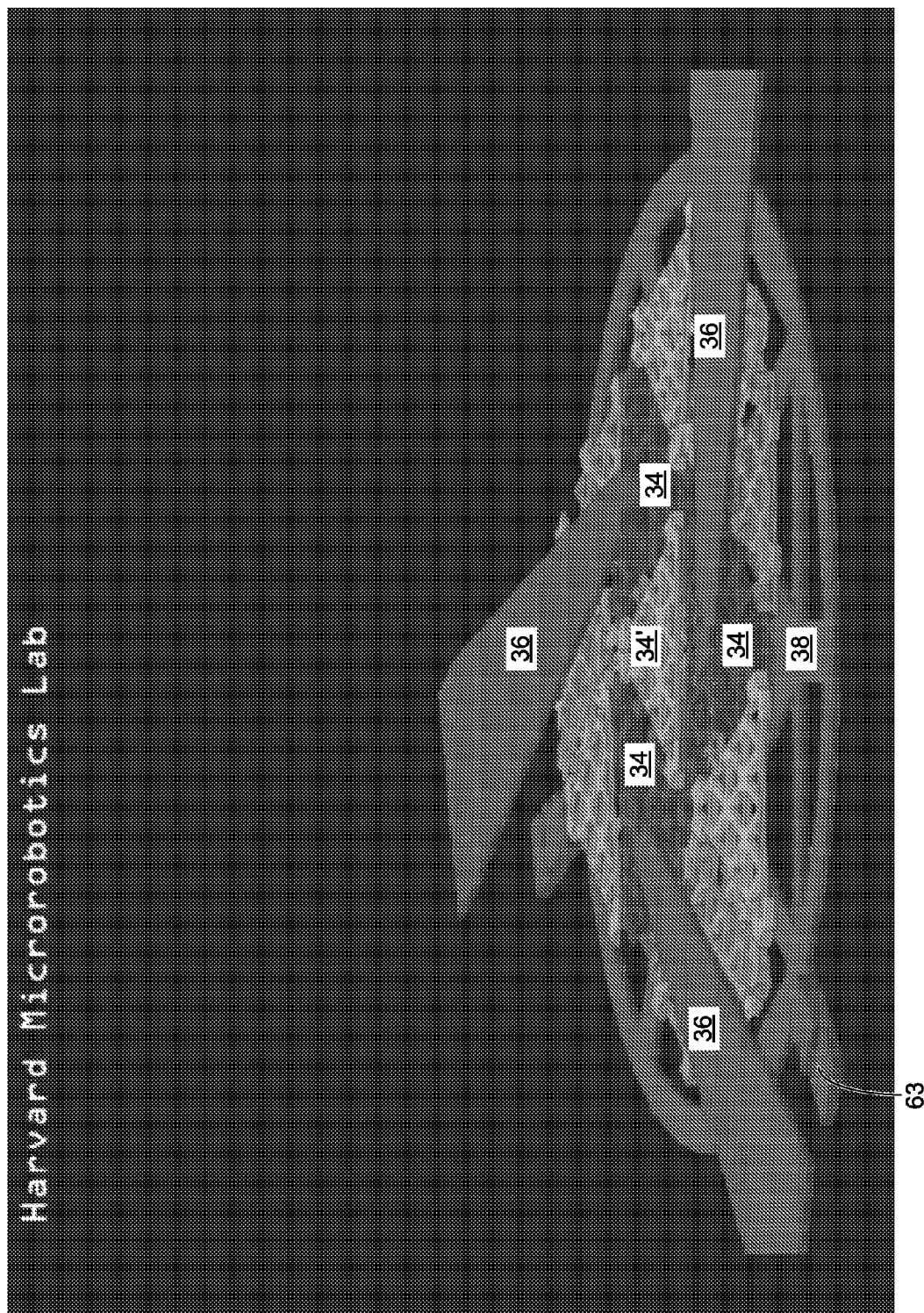
FIGS. 43-48 show the sequence of clips from the unfolding assembly of the icosahedron with most of the scaffold removed from view.
Figure 44:
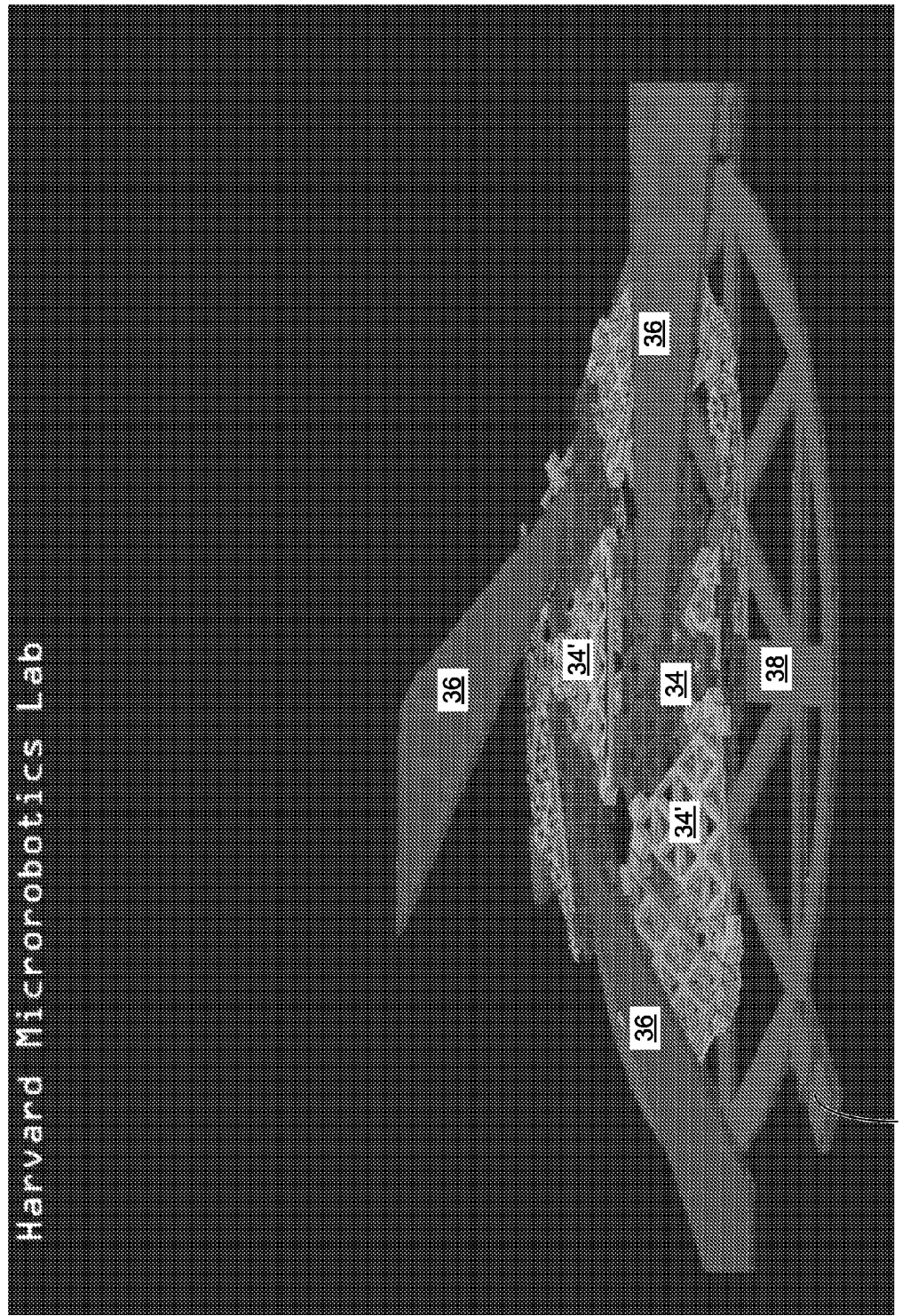
Figure 45:
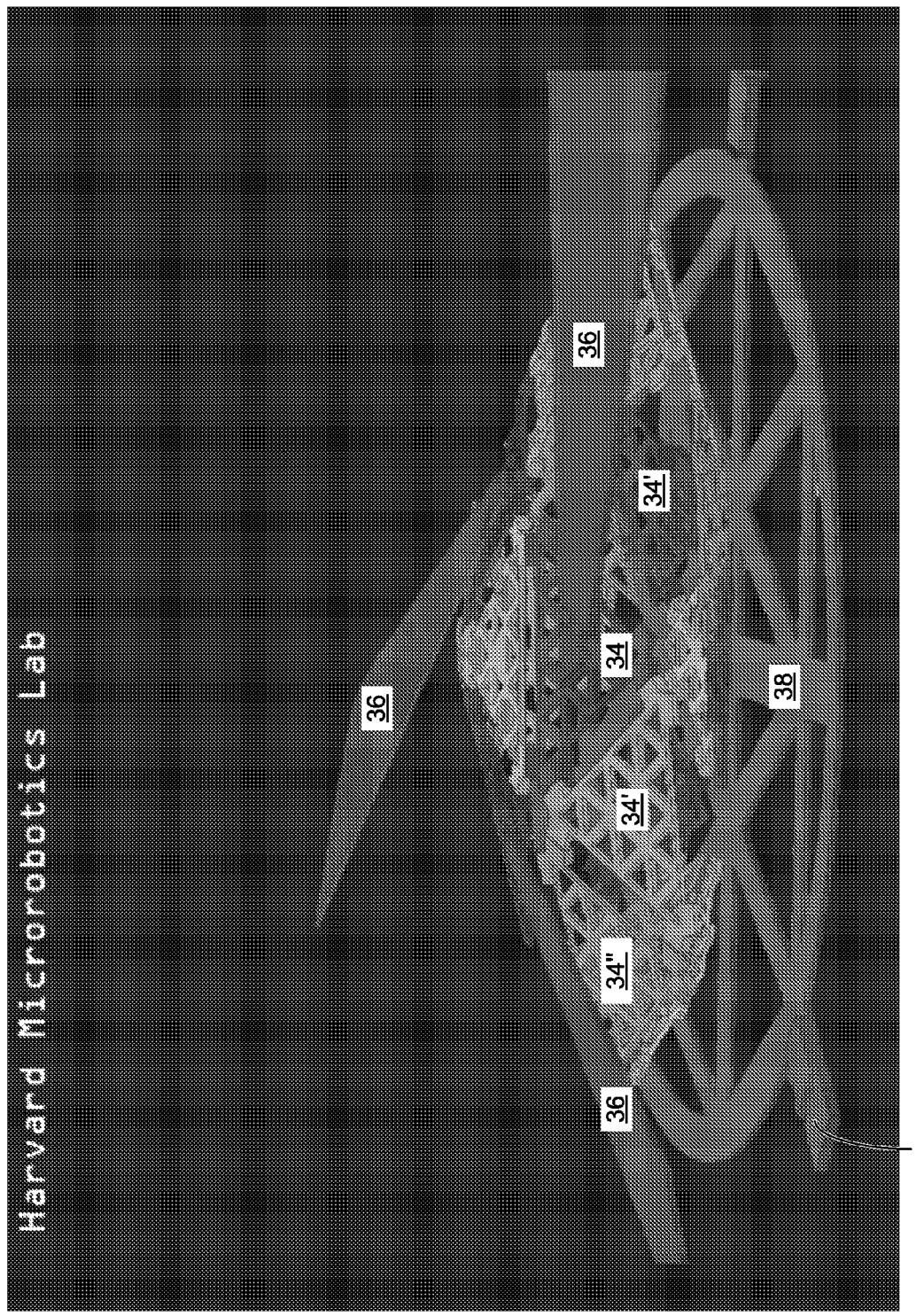
Figure 46:
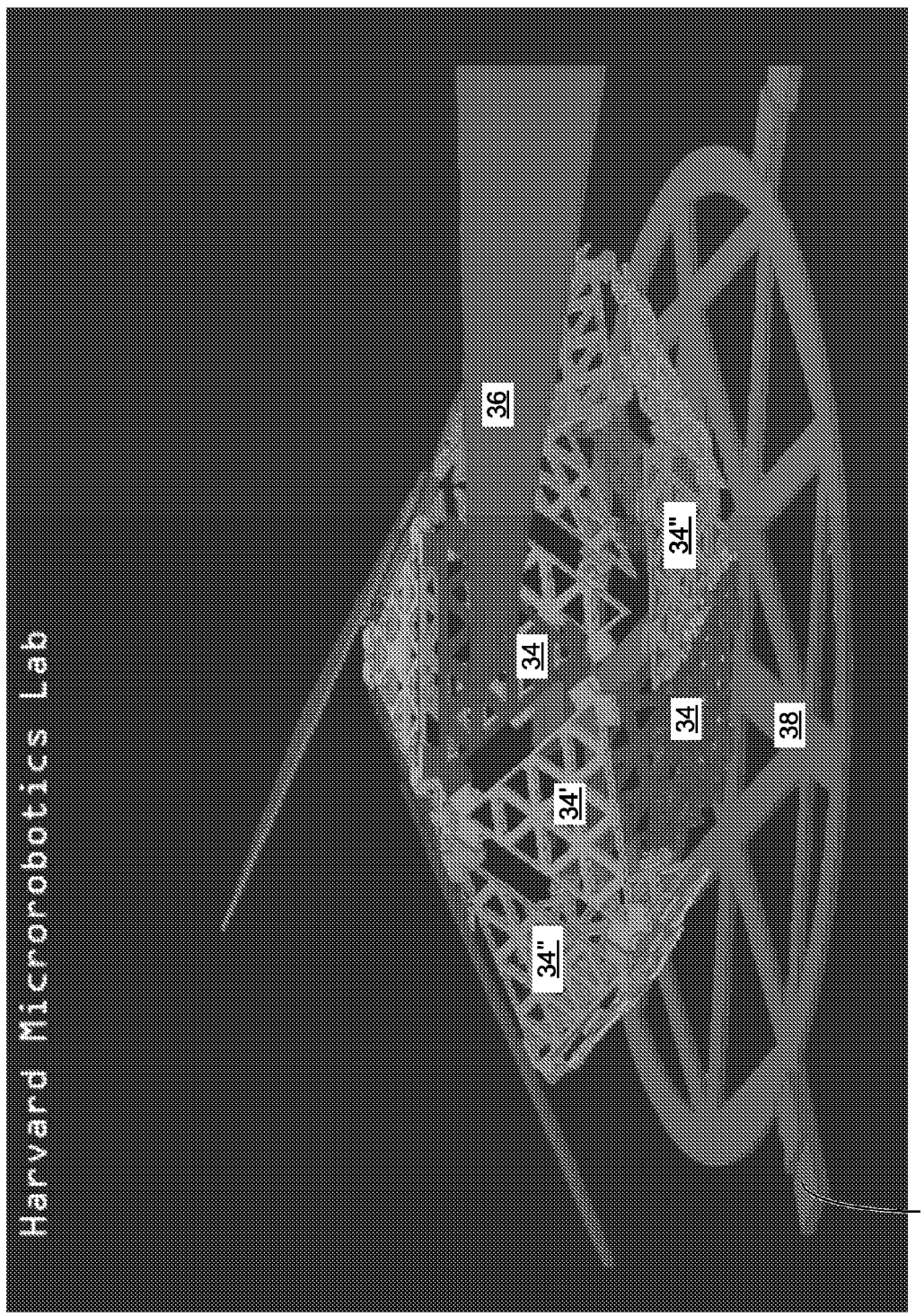
Figure 47:
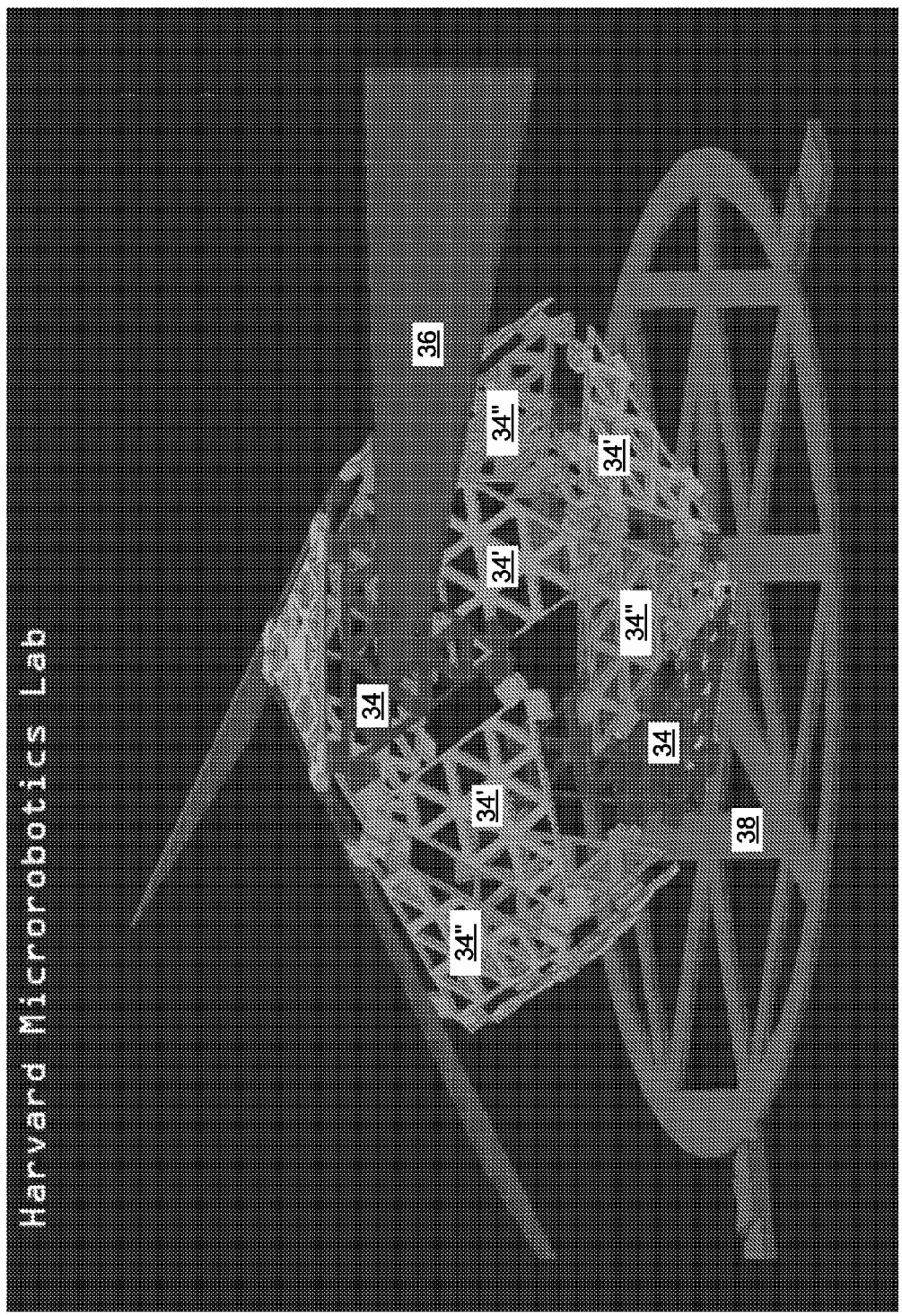
Figure 48:
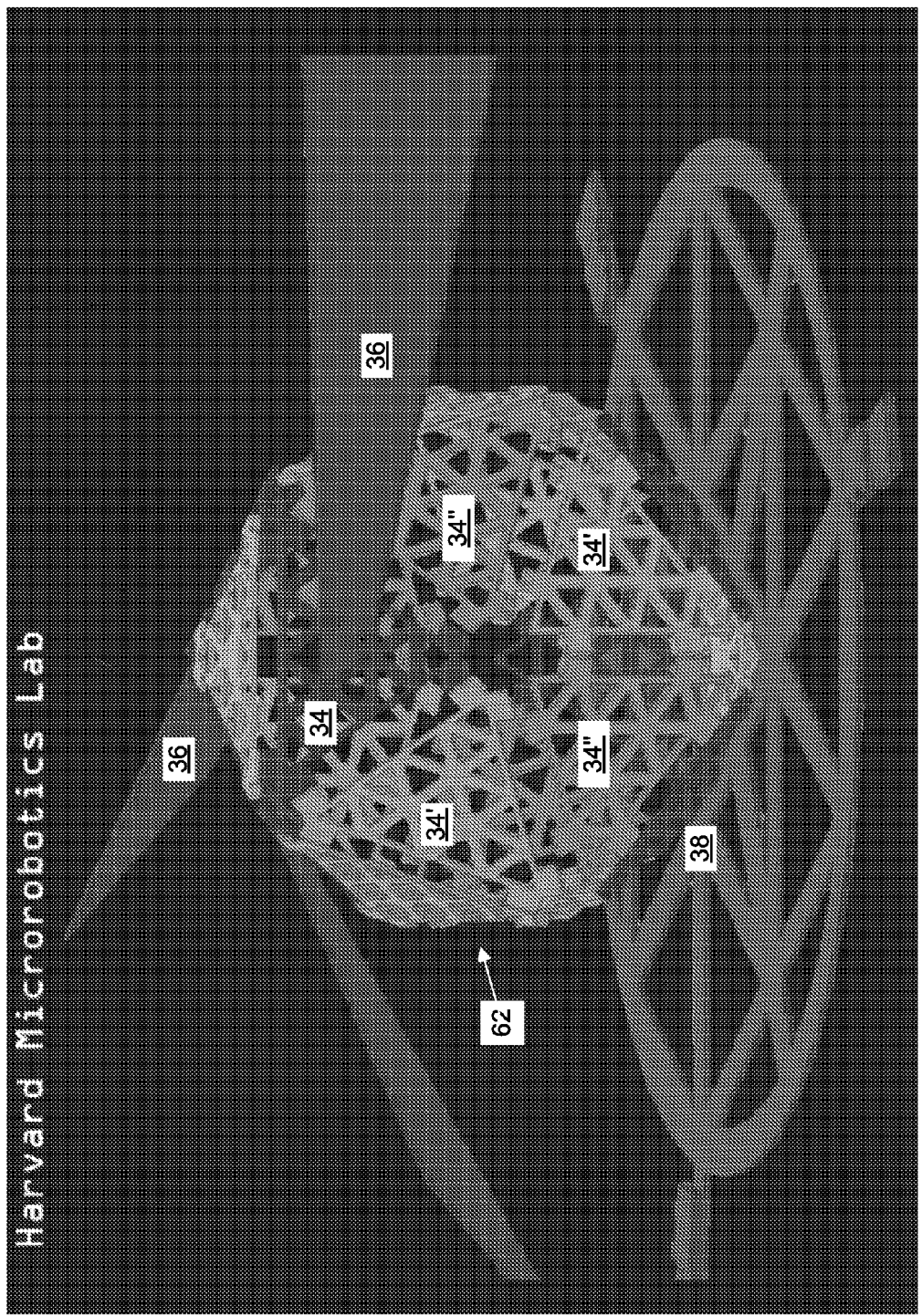

Assembly of a PC-MEMS pop-up icosahedron 62 is shown in FIGS. 37-48, which show a pop-up assembly process at approximately three-second increments. The collapsed structure contained in and by a scaffold including two flat plates 32 is shown in FIG. 37. The icosahedron 62 comprises 20 substantially identical triangular faces 34 and can be folded into a nearly spherical form with 30 edges and 12 vertices. Dowel pins supporting the top disk 32 are raised in FIGS. 38-42 to increase the separation between the plates 32, wherein an actual still capture is shown in the bottom of each figure, with a corresponding computer-generated image above.

Mounted to the top plate 32' are three planks 36, each of which is pivotably mounted to the top plate 32' via a fold and fixed to a respective triangular face 34 adjacent to the top-most triangular face 34', as can be better seen in FIGS. 43-48, which show the pop-up assembly with the scaffold plates 32 removed for clarity of illustration. Different prime values for the triangular faces (i.e., faces 34, 34', and 34) are provided for ease of illustration and characterization, though references herein to "face 34" can refer to any of these faces.

As the top plate 32' rises relative to the bottom plate 32", the planks 36 pivot downward and pull the respective triangular faces 34 to which they are attached upward, along with the other triangular faces 34 to which each is interconnected about its edges.

Figure 50:
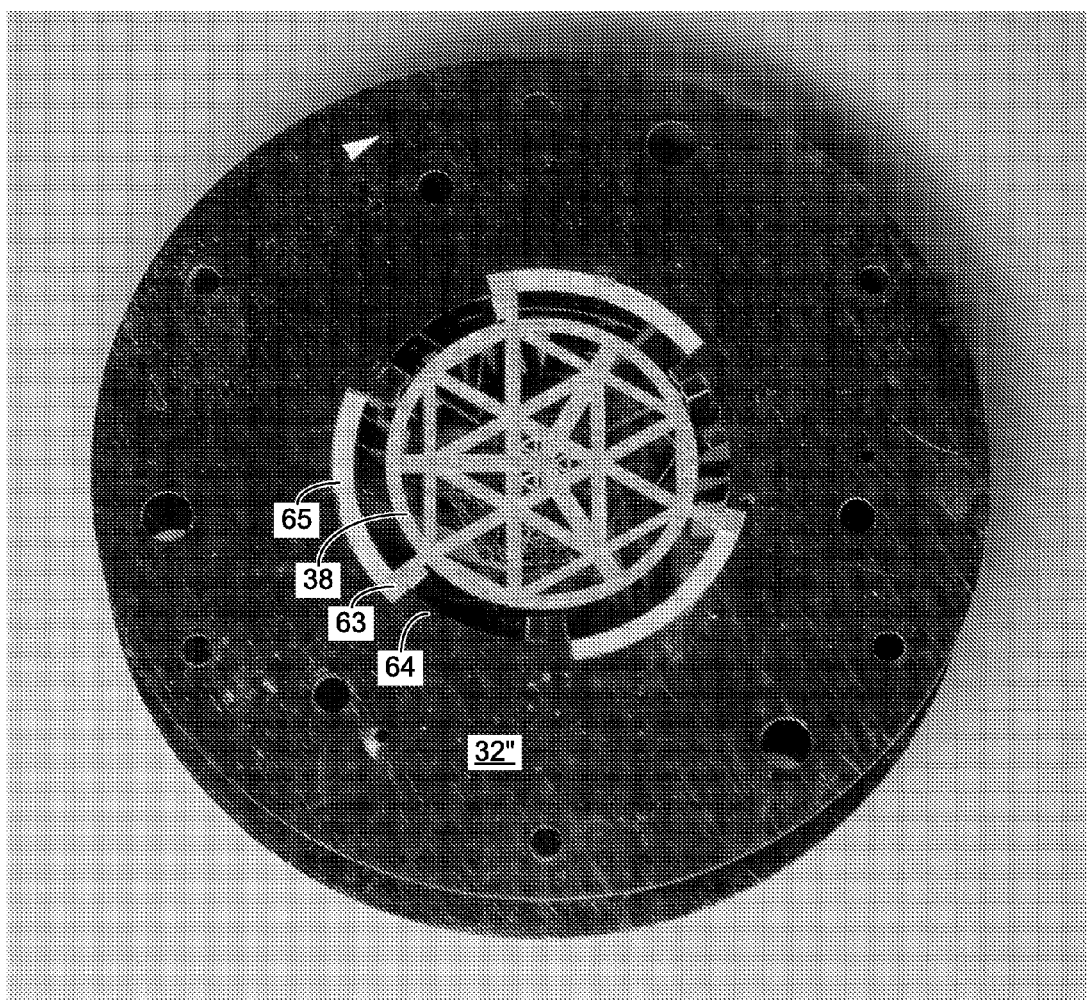
FIG. 50 shows the underside of the scaffold and rotating plate that serve to assemble the icosahedron.

At its base, the icosahedron 62 is mounted to an inner rotatable disk 38 (see, e.g., FIG. 41), which includes a plurality of outward-extending tabs 63 that extend under slots 64 on the lower scaffold plate 32", acting as a plane linear bearing, for reciprocal axial rotation therein. The underside of the lower scaffold plate 32" showing the tabs 63 against respective slots 64 in the lower scaffold plate 32" is shown in FIG. 50, though the tab-slot structure serves as a backup here, since the linkages driving the rotatable disk, in theory, are enough to keep the disk rotating in plane without any other connections. The rotatable disk 38 is turned by the pull of linkages 65 extending down via a pivot point from the top plate 32'. As each linkage 65 is raised, it drags the respective tab 63 to which each is coupled underneath the position at which the linkage 65 is joined to the top plate 32', thereby causing rotation of the disk 38 relative to the plates 32. Additional folding mechanical vias 44 are provided to support the top plate 32' over the bottom plate 32".

Figure 49:
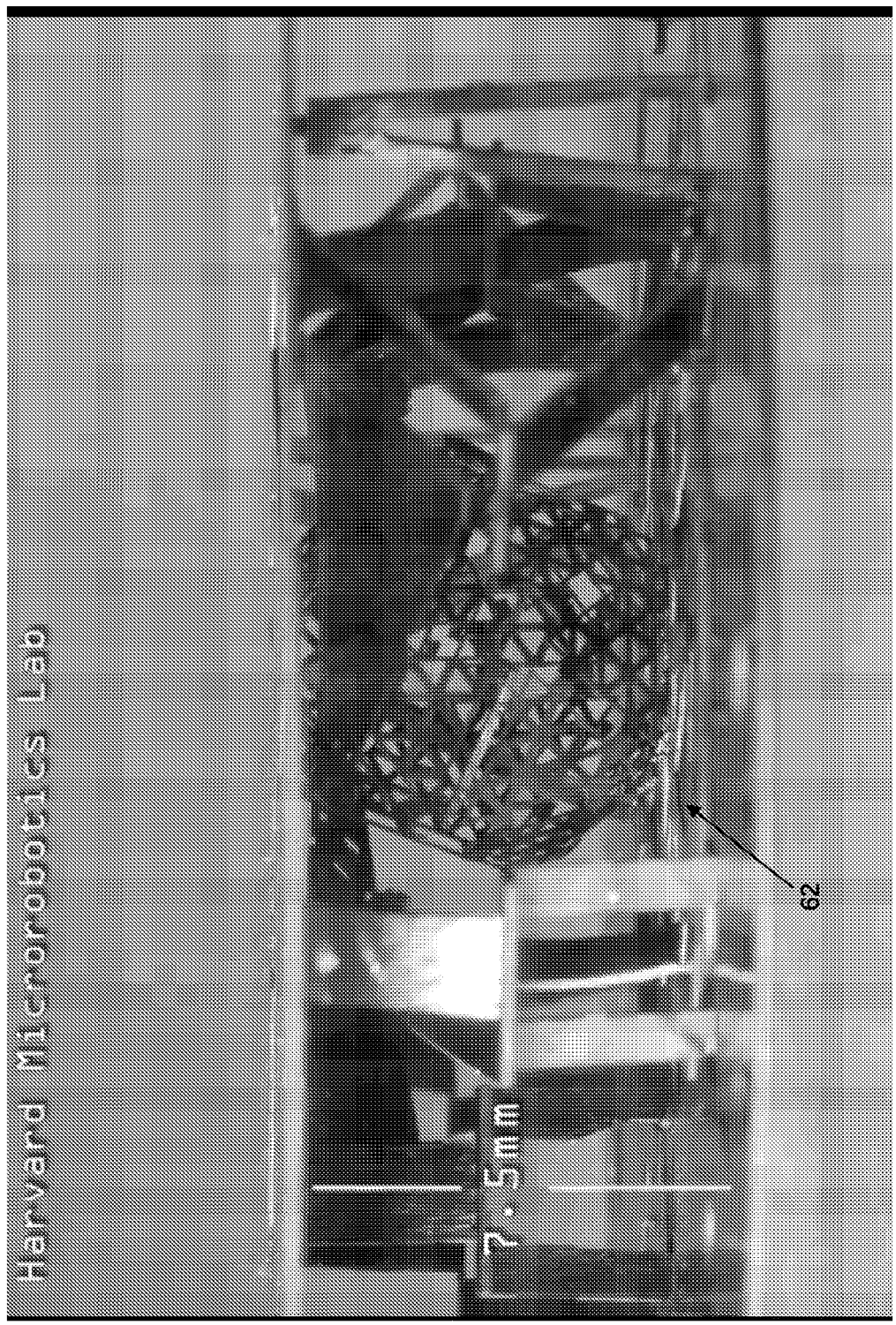
FIG. 49 is a side view of the assembled icosahedron amidst the scaffold.

Here, many of the folds are at an angle of about 45° when the icosahedron is assembled; and the inner disk 38 is ultimately rotated about 60° in plane relative to the plates 32 as the icosahedron 62 is unfolded. The resulting structure can then be locked in position, e.g., via a soldering technique, as described above. A side view of the folded icosahedron in the expanded scaffold is shown in FIG. 49.

The resulting icosahedron 62 can be used in a variety of applications, such as, for example, in camera-shutter optics or in balloon-angioplasty. In other embodiments, a sensor (e.g., a camera) can be provided on each face 34 to provide insect-like multi-directional vision and awareness. In still other embodiments, a mirror, circuit board, and/or a communication transmitter or receiver can be provided on each triangular face. Likewise, a variety of other complex shapes can be likewise formed via a combination of unfolding and twisting by changing the configuration of folds, linkages, planks, faces, mechanical vias, etc.

In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Further, where parameters for various properties or other values are specified herein for embodiments of the invention, those parameters or values can be adjusted up or down by $1/100^{th}$, $1/50^{th}$, $1/20^{th}$, $1/10^{th}$, $1/5^{th}$, $1/3^{rd}$, $1/2$, $2/3^{rd}$, $3/4^{th}$, $4/5^{th}$, $9/10^{th}$, $19/20^{th}$, $49/50^{th}$, $99/100^{th}$, etc. (or up by a factor of 1, 2, 3, 4, 5, 6, 8, 10, 20, 50, 100, etc.), or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention. Further still, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. The contents of references, including reference texts, journal articles, patents, patent applications, etc., cited throughout the text are hereby incorporated by reference in their entirety; and appropriate components, steps, and characterizations from these references may or may not be included in embodiments of this invention. Still further, the components and steps identified in the Background section are integral to this disclosure and can be used in conjunction with or substituted for components and steps described elsewhere in the disclosure within the scope of the invention. In method claims, where stages are recited in a particular order—with or without sequenced prefacing characters added for ease of reference—the stages are not to be interpreted as being temporally limited to the order in which they are recited unless otherwise specified or implied by the terms and phrasing.

What is claimed is:

1. A method for fabricating a three-dimensional structure comprising:
    forming a stack of a plurality of patterned layers, including at least one rigid layer and at least one flexible layer with at least one interface between the rigid and flexible layers and a stacking axis extending orthogonally from the interface between the rigid and flexible layers, wherein the rigid layer includes a plurality of rigid segments that are substantially more rigid than the flexible layer, and bonding the plurality of patterned layers at selected locations to form a laminate structure with inter-layer bonds; and
    expanding the laminate structure into an expanded three-dimensional configuration by flexing the laminate structure at joints between the rigid segments, selectively distorting at least one of the layers to produce gaps that expand parallel to the stacking axis between adjacent layers while maintaining at least some of the inter-layer bonds.

2. A method for fabricating a three-dimensional structure comprising:
    producing a plurality of layers with distinct patterns, wherein the layers include at least one rigid layer and at least one flexible layer, wherein the rigid layer includes a plurality of rigid segments that are substantially more rigid than the flexible layer; then
    stacking the plurality of layers with at least one interface between the rigid and flexible layers and a stacking axis extending orthogonally from the interface between the rigid and flexible layers, and bonding the plurality of layers at selected locations to form a laminate structure with inter-layer bonds; and
    flexing the laminate structure at joints between the rigid segments to produce an expanded three-dimensional structure with gaps that expand parallel to the stacking axis between adjacent layers, wherein the adjacent layers are joined at the selected bonding locations and separated by the gaps at other locations.

3. A method for fabricating a three-dimensional structure comprising:
    producing a plurality of layers with distinct patterns, wherein the layers include at least one rigid layer and at least one flexible layer, wherein the rigid layer includes a plurality of rigid segments that are substantially more rigid than the flexible layer; then
    stacking the plurality of layers and bonding the plurality of layers at selected locations to form a laminate structure with inter-layer bonds;
    inserting at least one stimulus-responsive material between layers as the layers are stacked, wherein the stimulus-responsive material serves as an actuator for a cantilever to which the stimulus-responsive material is joined, and wherein the stimulus-responsive material is electrically coupled with a power source; and
    flexing the laminate structure at joints between the rigid segments to produce an expanded three-dimensional structure, wherein the layers are joined at the selected bonding locations and separated at other locations.

4. The method of claim 3, wherein the stimulus-responsive material is a piezoelectric plate.

5. The method of claim 2, wherein at least two of the layers in the expanded three-dimensional structure are separated by a distance in a range from 100 µm to 10 mm away from the inter-layer bonds.

6. The method of claim 2, wherein at least some of the layers have a thickness in a range from 1.5 µm to 150 µm.

7. The method of claim 2, further comprising cutting the rigid layer with a laser to form the rigid segments.

8. A method for fabricating a three-dimensional structure comprising:
produducing a plurality of layers with distinct patterns, wherein the layers include at least one rigid layer and at least one flexible layer, wherein the rigid layer includes a plurality of rigid segments that are substantially more rigid than the flexible layer; then
stacking the plurality of layers and bonding the plurality of layers at selected locations to form a laminate structure with inter-layer bonds; and
flexing the laminate structure at joints between the rigid segments to produce an expanded three-dimensional structure, wherein the layers are joined at the selected bonding locations and separated at other locations,
wherein the rigid layer is coated with a conductive circuit.

9. A method for fabricating a three-dimensional structure comprising:
producing a plurality of layers with distinct patterns, wherein the layers include at least one rigid layer and at least one flexible layer, wherein the rigid layer includes a plurality of rigid segments that are substantially more rigid than the flexible layer; then
stacking the plurality of layers and bonding the plurality of layers at selected locations to form a laminate structure with inter-layer bonds; and
flexing the laminate structure at joints between the rigid segments to produce an expanded three-dimensional structure, wherein the layers are joined at the selected bonding locations and separated at other locations, and wherein the expanded three-dimensional structure comprises at least one I-beam.

10. The method of claim 9, wherein a plurality of rigid layers are patterned, stacked and flexed.

11. The method of claim 9, wherein a plurality of flexible layers are patterned, stacked and flexed.

12. A laminate precursor for a three-dimensional structure, comprising an aligned stack of layers including:
a plurality of rigid layers, wherein the rigid layers include cuts extending therethrough to form a plurality of rigid segments separated by the cuts; and
a plurality of flexible layers that are substantially less rigid than the rigid segments with at least one interface between the rigid and flexible layers and a stacking axis extending orthogonally from the interface between the rigid and flexible layers, wherein each flexible layer is bonded to at least one of the rigid layers such that the flexible layer is exposed at the cuts in the rigid layer to form joints for folding,
wherein at least some of the layers are bonded to adjacent layers only at selected locations forming islands of inter-layer bonds to allow expansion of the laminate into an expanded three-dimensional structure with gaps that expand parallel to the stacking axis between adjacent layers when the laminate is folded at the joints.

13. A laminate precursor for a three-dimensional structure, comprising an aligned stack of layers including:
a plurality of rigid layers, wherein the rigid layers include cuts extending therethrough to form a plurality of rigid segments separated by the cuts; and
a plurality of flexible layers that are substantially less rigid than the rigid segments, wherein each flexible layer is bonded to at least one of the rigid layers such that the flexible layer is exposed at the cuts in the rigid layer to form joints for folding,
wherein at least some of the layers are bonded to adjacent layers only at selected locations forming islands of inter-layer bonds to allow expansion of the laminate into an expanded three-dimensional structure when the laminate is folded at the joints, and wherein the layers are configured to produce a plurality of copies of the expanded three-dimensional structure for mass production when the laminate is folded at the joints.

* * * * *